US008822263B2

(12) United States Patent
Koukitu et al.

(10) Patent No.: US 8,822,263 B2
(45) Date of Patent: Sep. 2, 2014

(54) EPITAXIAL GROWTH METHOD OF A ZINC OXIDE BASED SEMICONDUCTOR LAYER, EPITAXIAL CRYSTAL STRUCTURE, EPITAXIAL CRYSTAL GROWTH APPARATUS, AND SEMICONDUCTOR DEVICE

(75) Inventors: Akinori Koukitu, Fuchu (JP); Yoshinao Kumagai, Fuchu (JP); Tetsuo Fujii, Kyoto (JP); Naoki Yoshii, Nirasaki (JP)

(73) Assignees: National University Corporation Tokyo University of Agriculture and Technology, Tokyo (JP); Rohm Co., Ltd., Kyoto (JP); Tokyo Electron Limited, Tokyo (JP)

( * ) Notice: Subject to any disclaimer, the term of this patent is extended or adjusted under 35 U.S.C. 154(b) by 407 days.

(21) Appl. No.: 12/493,765

(22) Filed: Jun. 29, 2009

(65) Prior Publication Data
US 2010/0006836 A1 Jan. 14, 2010

(30) Foreign Application Priority Data

| Jun. 30, 2008 | (JP) | P2008-171575 |
| Jun. 30, 2008 | (JP) | P2008-171610 |
| Dec. 26, 2008 | (JP) | P2008-334213 |
| Mar. 2, 2009 | (JP) | P2009-048527 |
| May 21, 2009 | (JP) | P2009-123102 |

(51) Int. Cl.
*H04L 21/00* (2006.01)

(52) U.S. Cl.
USPC ............. 438/104; 257/43; 438/761; 438/763; 117/89; 117/93; 117/105

(58) Field of Classification Search
CPC .... C23C 16/407; C30B 25/183; C30B 29/16; H01L 21/02472; H01L 21/02554; H01L 29/22
USPC ......... 257/43; 438/104, 761, 763; 117/89, 93, 117/105
See application file for complete search history.

(56) References Cited

U.S. PATENT DOCUMENTS

| 4,751,149 | A | * | 6/1988 | Vijayakumar et al. | ........ 428/702 |
| 5,352,300 | A | * | 10/1994 | Niwa | ............................ 136/256 |
| 6,838,308 | B2 | * | 1/2005 | Haga | ............................ 438/104 |

FOREIGN PATENT DOCUMENTS

| JP | H03253570 A | 11/1991 |
| JP | 07-312350 A | 11/1995 |

(Continued)

OTHER PUBLICATIONS

Nakada et al., "Effect of Water Vapor on the Growth of Textured ZnO-Based Films for Solar Cells by DC-Magnetron Sputtering", Japanese Journal of Applied Physics 30 (1991) pp. 3344-3348.*

Takahashi, N. et al., "Atmospheric pressure vapor-phase growth of ZnO using a chloride source", Journal of Crystal Growth, 209 (2000), pp. 822-827.

(Continued)

*Primary Examiner* — Jay C Kim
(74) *Attorney, Agent, or Firm* — Rabin & Berdo, P.C.

(57) ABSTRACT

It is provided a hetero epitaxial growth method, a hetero epitaxial crystal structure, a hetero epitaxial growth apparatus and a semiconductor device, the method includes forming a buffer layer formed with the orienting film of an oxide, or the orienting film of nitride on a heterogeneous substrate; and performing crystal growth of a zinc oxide based semiconductor layer on the buffer layer using a halogenated group II metal and an oxygen material. It is provided a homo epitaxial growth method, a homo epitaxial crystal structure, a homo epitaxial growth apparatus and a semiconductor device, the homo epitaxial growth method includes introducing reactant gas mixing zinc containing gas and oxygen containing gas on a zinc oxide substrate; and performing crystal growth of a zinc oxide based semiconductor layer on the zinc oxide substrate.

3 Claims, 54 Drawing Sheets

(56) References Cited

FOREIGN PATENT DOCUMENTS

| | | |
|---|---|---|
| JP | 2001-068485 A | 3/2001 |
| JP | 2001-270799 A | 10/2001 |
| JP | 2003324070 A | 11/2003 |
| JP | 2004103847 A | 4/2004 |
| JP | 2004-193206 A | 7/2004 |
| JP | 2004193271 A | 7/2004 |
| JP | 2005-223219 A | 8/2005 |
| JP | 2005-302940 A | 10/2005 |
| JP | 2007246331 A | 9/2007 |
| JP | 2008243987 A | 10/2008 |

OTHER PUBLICATIONS

Amano, H. et al., "Metarlorganic vapor phase epitaxial growth of a high quality GaN film using an AlN bugger layer", Applied Phys. Lett. 48(5), Feb. 3, 1986, pp. 353-355.

Kato, H. et al., "Effect of O/Zn Flux Ration on Crystalline Quality of ZnO Films Grown by Plasma-Assisted Molecular Beam Epitaxy", Jpn. J. Appl. Phys. vol. 42, 2003, pp. 2241-2244.

Heinze, S., "homoepitaxial growth of ZnO by metalorganic vapor phase epitaxy in two-dimenional growth mode", Journal of Crystal Growth, 308, 2007, pp. 170-175.

* cited by examiner

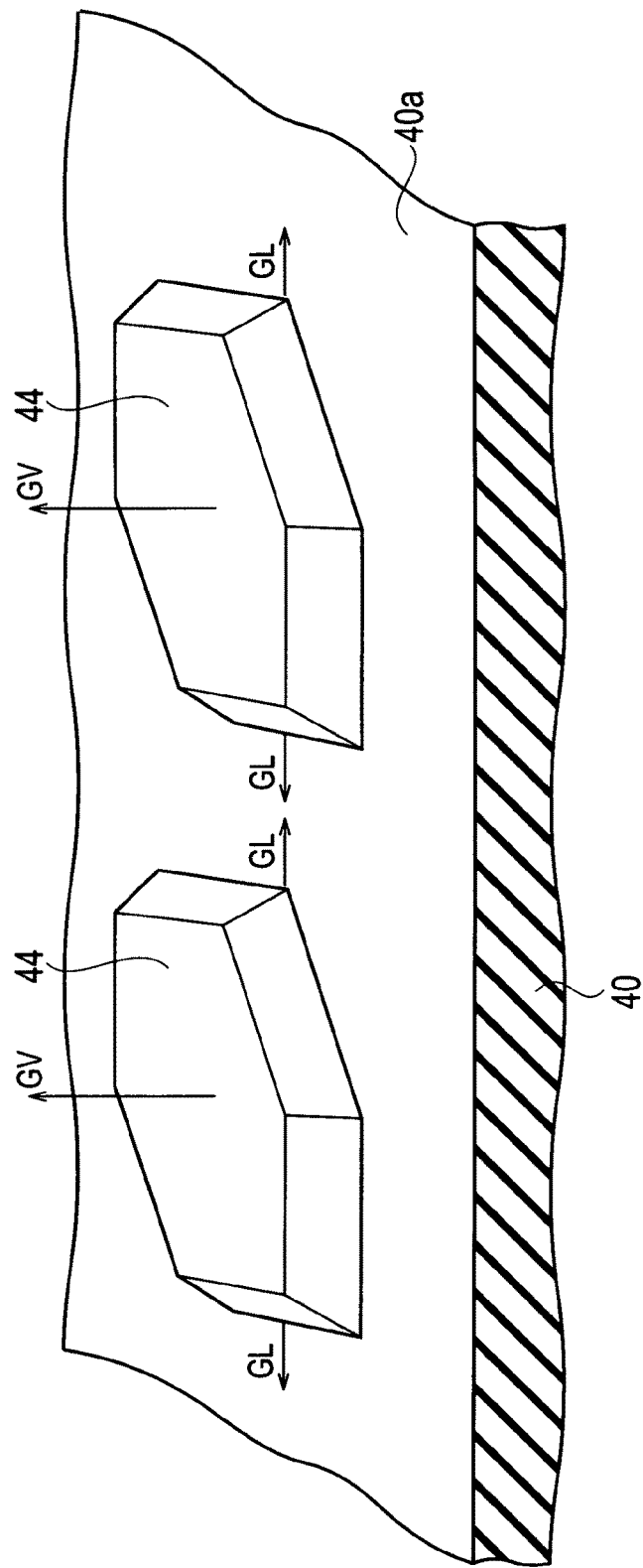

FIG. 44A
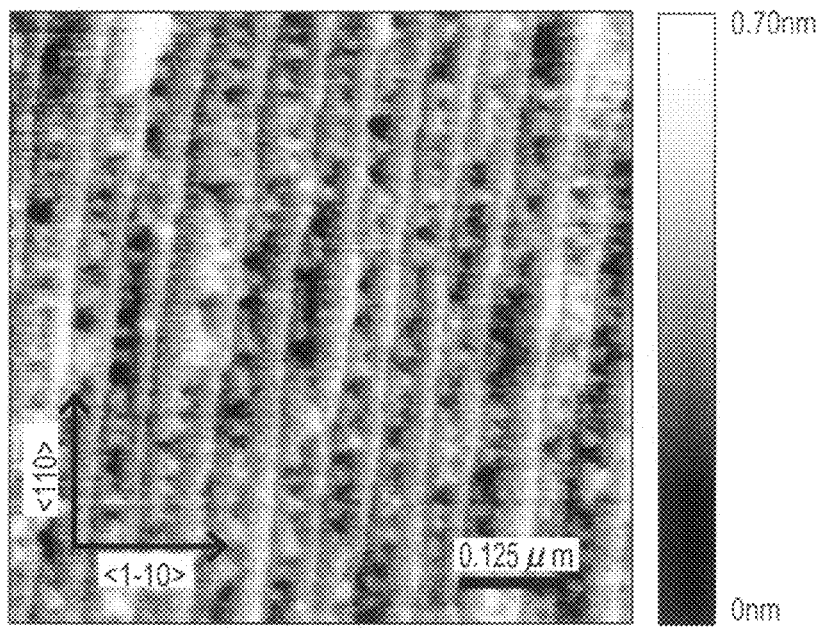
FIG. 44B
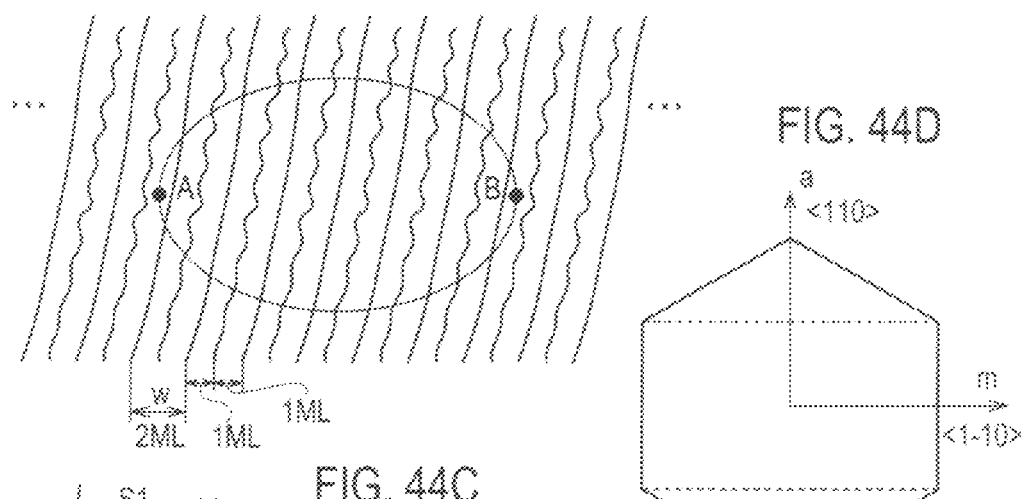
FIG. 44D
FIG. 44C
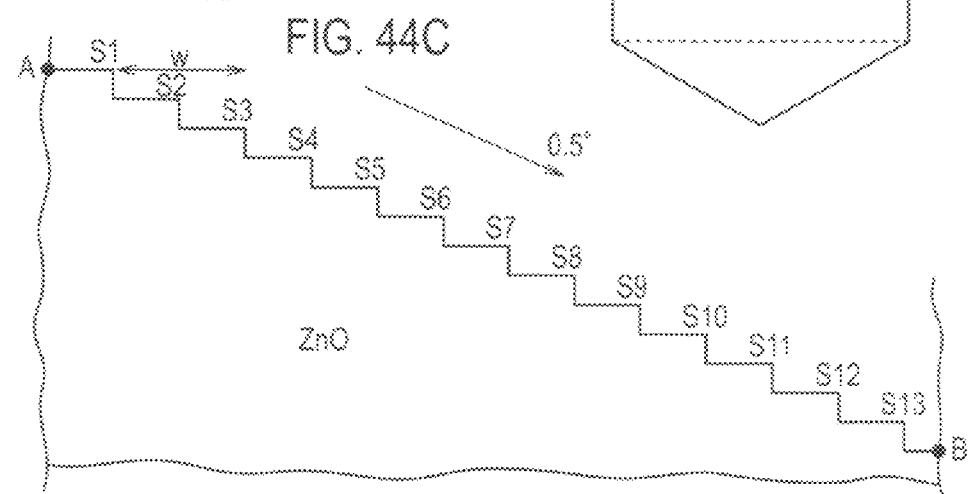

| NH3 PARTIAL PRESSURE (atm) \ GROWTH TEMPERATURE (°C) | 700 | 800 | 900 | 1000 |
|---|---|---|---|---|
| 4.40 × 10⁻⁵ | ○ | ○ | ○ | × |
| 4.40 × 10⁻⁴ | ○ | ○ | × | × |
| 4.40 × 10⁻³ | ○ | × | × | × |

EPITAXIAL GROWTH METHOD OF A ZINC OXIDE BASED SEMICONDUCTOR LAYER, EPITAXIAL CRYSTAL STRUCTURE, EPITAXIAL CRYSTAL GROWTH APPARATUS, AND SEMICONDUCTOR DEVICE

CROSS REFERENCE TO RELATED APPLICATIONS AND INCORPORATION BY REFERENCE

This application is based upon and claims the benefit of priority from prior Japanese Patent Applications No. P2008-171575 filed on Jun. 30, 2008, No. P2008-171610 filed on Jun. 30, 2008, No. P2008-334213 filed on Dec. 26, 2008, No. P2009-048527 filed on Mar. 2, 2009, and No. P2009-123102 filed on May 21, 2009, the entire contents of which are incorporated herein by reference.

TECHNICAL FIELD

The present invention relates to an epitaxial growth method, an epitaxial crystal structure, an epitaxial crystal growth apparatus, and a semiconductor device. More specifically, the present invention relates to an epitaxial growth method, an epitaxial crystal structure, an epitaxial crystal growth apparatus, and a semiconductor device of zinc oxide (hereinafter, it is referred to ZnO) based compound semiconductor crystal of high quality, and a group V element doped ZnO based semiconductor, and a fabrication method and a fabricating apparatus for the ZnO based semiconductor.

BACKGROUND ART

Since a ZnO crystal is a direct transition semiconductor whose bandgap is about 3.37 eV, its bound energy of the exciton which electrons and holes combined within the solid is as large as 60 meV, and it exists stably also at room temperature, the ZnO crystal is an affordable price, and its environmental load is also small. Therefore, the ZnO crystal is expected as a light-emitting device from a blue light wavelength region to an ultraviolet light wavelength region.

The ZnO crystal of a use is wide except a light-emitting device, and therefore the application to a light-detecting element, a piezoelectric element, a transistor, a transparent electrode, etc. is also expected. In order to use the ZnO crystal for the above-mentioned uses, the establishment of ZnO crystal growth technology of high quality excellent in mass production nature is very important, and the doping technology for controlling the conductivity of a semiconductor is also important.

The following methods are known as a method of fabricating a ZnO based semiconductor of high quality. For example, in the MBE (Molecular Beam Epitaxy) method, the ZnO based semiconductor of high quality is grown up by supplying molecular beam of the zinc and the oxygen radical (plasma), and reacting the supplied zinc and oxygen on a growth substrate. Moreover, in the PLD (Pulsed Laser Deposition) method, the ZnO based semiconductor of high quality is grown up by illuminating the sintered body and crystal of the ZnO based semiconductor with a laser beam, and depositing an evaporated ZnO based semiconductor on a growth substrate.

However, since a large area film formation is difficult and needs to grow in a vacuum when growing up the ZnO based semiconductor by the MBE technique and the PLD method mentioned above, there is a problem that it is difficult to mass-produce industrially.

Then, the method of growing up the ZnO based semiconductor by the MOCVD (Metal Organic Chemical Vapor Deposition) method widely used for the crystal growth of a group III-V semiconductor is known as a fabrication method of the ZnO based semiconductor which does not need a high vacuum. In the MOCVD method, an organic metal including the zinc is decomposed near the substrate or on the substrate, finally the oxygen material reacts to the metallic elements, and thereby the ZnO based semiconductor is grown up.

However, in the MOCVD method mentioned above, since the vapor pressure of the zinc which is a group II element is extremely high compared with a group III element, even if the zinc reaches the growth substrate, it is easy to separate from the growth substrate, under the high temperature in which growth of high quality is possible. Accordingly, since the rate of the zinc which can be contributed to the growth of the ZnO based semiconductor on the growth substrate is small, there is a problem that the efficiency of material including the zinc is low.

Moreover, since carbon mixes into the ZnO based semiconductor by the hydrocarbon group generated when the organic metal material including zinc is resolved, there is a problem that the growth of the ZnO based semiconductor which does not include carbon is difficult.

When growing up the ZnO based semiconductor by the VPE (Vapor Phase Epitaxy) method, using a zinc single metal substance and oxygen material (for example, oxygen) including oxygen as a material is known as one method. However, since the equilibrium constant of the chemical reaction is large compared with the equilibrium constant of the group III-V semiconductor, and it is necessary to set up highly supplied partial pressure of the zinc with high vapor pressure for high temperature growth as mentioned above, there is a problem that it is difficult to control the reaction.

Then, the method using a zinc chloride and oxygen material as the alternative method in the case of growing up the ZnO based semiconductor by the VPE method is disclosed (for example, refer to Non Patent Literature 1). In the fabrication method of the ZnO based semiconductor according to the Non Patent Literature 1, the ZnO based semiconductor is grown up by installing the powder of zinc chloride in a reaction tube, carrying the zinc chloride which became steam by annealing by using carrier gas, and reacting the zinc chloride to oxygen.

The above-mentioned method is called an HVPE (Halide/Hydride Vapor Phase Epitaxy) method using halogenated group II metal as a group II material. In addition, the HVPE method is known as a fabrication method for the group III-V semiconductor which fabricates a gallium nitride substrate etc. industrially by using a halogenide (chloride) for group III material, and using a hydride for group V material. In this HVPE method, the hot wall method, which makes high temperature not only the growth substrate and its circumference but also a quartz tube, is generally used.

In the above mentioned Non Patent Literature 1, however, the fabrication method of the ZnO based semiconductor uses zinc chloride as zinc material and the zinc chloride is deliquescent. Furthermore, since the purity of the zinc chloride which can be obtained easily is as low as about 99.9% and the zinc chloride with high purity is expensive, the ZnO based semiconductor of high quality cannot be fabricated easily.

When using the ZnO substrate which is homogeneous material species as a substrate for ZnO crystal growth, the substrate for the ZnO crystal is produced with the hydrothermal synthesis method of the same method as the production of quartz crystal. There is a problem that the impurity control of the high level required in the semiconductor field is needed etc., and development of the hetero growth technology for growing up on a heterogeneous substrate is also needed.

When the nitride based semiconductor is used for the use of a LED (Light Emitting Diode) of which cost reduction is required in particular, a sapphire substrate, a silicon carbide substrate, a silicon substrate, etc. are used instead of using the expensive substrate for homo epitaxial crystal growth.

When the high temperature growth is directly performed on the sapphire substrate by the MBE method or the MOCVD method, there is a phenomenon in which the ZnO does not grow, and it is a phenomenon not occurring in GaN.

It is because it is difficult to grow up the ZnO at high temperature as for the element with low wettability on the substrate, such as Zn, if the wettability is not yet improved by forming the ZnO film on the substrate at low temperature firstly. On the other hand, since the group III element represented by Ga and Al has low vapor pressure and the wettability on sapphire is effective in the high temperature region, the crystal grows at high temperature without via a buffer layer.

Since diffusion of the materials on the surface of the substrate becomes difficult to occur and the growth film became an assembly of the rod-shaped or core-shaped crystal when growing up at low temperature, the high quality crystal growth of the semiconductor level was difficult although it is an orienting film.

Therefore, a method of growing up via a buffer layer is usually used for the epitaxial growth on the heterogeneous substrate. In particular, in the case of the GaN on the sapphire substrate, it has succeeded in obtaining the GaN crystal in which the crystallinity is effective and the surface flatness is excellent by forming the buffer layer comprising AlN or GaN at low temperature, and then growing up at high temperature (for example, refer to Patent Literature 1 and Non Patent Literature 2).

The technology of forming the buffer layer is proposed in the case of the ZnO based semiconductor crystal as well as the case of the GaN based semiconductor crystal (for example, refer to Patent Literature 2 and Non Patent Literature 3). According to the above-mentioned method, after growing up the low-temperature grown ZnO single crystal layer of about 10 nm to about 100 nm in thickness at the temperature lower than 600 degrees C. and then performing planarization processing by annealing, the ZnO growth is performed at the temperature lower than 800 degrees C. However, in the above-mentioned method, it is premised on the MBE technique and the growth temperature of high temperature growth is limited at about 800 degrees C. Moreover, according to a method of using a Zn single material or an organic metal material as a Zn material source, there was a problem that raw material efficiency decreased sharply in accordance that the high temperature growth is performed, because of the high vapor pressure of Zn.

When laminating the ZnO semiconductor film for a light emitting device and a light-detecting device unlike a transparent conductive film, a film of high quality with fewer defects is required. In the case of the GaN based semiconductor layer, although the device produced by the hetero epitaxial growth on the sapphire substrate is mass-produced, the dislocation density of its film is as much as not less than $10^8$ $cm^{-2}$ grade, and it is a level of dislocation density which cannot expect the usual device operation in any semiconductor layers except the GaN based, in particular an InGaN film.

The ZnO substrate produced by the hydrothermal synthesis method and the chemical vapor transport method are available, and in order to grow up the ZnO based semiconductor layer with fewer crystal defects, it is preferable to homo epitaxially grow by using the ZnO substrate. Since not only the lattice constant of growth film and the ZnO substrate are matched, but also the coefficient of thermal expansion of the ZnO substrate and the growth film is the same, the homo epitaxial crystal grown method is a method very excellent as film formation of the semiconductor layer with fewer crystal defects.

In recent years, although the ZnO substrate produced with the hydrothermal synthesis method has a problem in respect of an impurity control, the crystallinity measured from X-ray diffraction is high enough also as a semiconductor use, and since the ZnO film which grows homo epitaxial crystal layer performing lattice matching on the ZnO substrate may inherit the satisfactory crystallinity of the substrate, the growth of the ZnO based semiconductor layer with high internal quantum efficiency is expected.

The homo epitaxial growth on the ZnO substrate is reported with the PLD method, the MBE method, the MOCVD method, etc. The vapor phase epitaxial crystal growth such as the MOCVD method also among the above-mentioned methods is more fit for the mass production since an ultra-high vacuum is unnecessary, and the crystal growth is controllable by the gas supply volume which is easy to control. Therefore, the establishment of a vapor growth method in which the satisfactory homo epitaxial suitable for the mass production also with the ZnO based semiconductor is possible, and the development of a vapor phase epitaxial crystal growth apparatus are desired.

Although there are a lot of reports of the ZnO growth using the MOCVD method, there are few reports of the high temperature growth which can expect the crystalline improvement. This is because the organic metal decomposes near of the substrate into the single zinc substance, and the growth becomes difficult because of low stickiness coefficient of zinc, in the MOCVD method of the high temperature region (>800 degrees C.) of ZnO.

Moreover, the reactivity of organic metal, such as DMZn (dimethyl zinc) and DEZn (diethyl zinc), and oxygen material is high, and in growth by the pressure of about several 100 Torr adopted by usual MOCVD for group III-V semiconductor, the oxygen material reacts to the organic metal easily in the vapor phase before gas reaches a substrate (premature reaction). As a result, it becomes a cause of a jam of a source outlet unit and particle of a materials outlet unit.

There is a report that the high temperature growth is performed using the MOCVD method (for example, refer to Non Patent Literature 4).

In Non Patent Literature 4, it is growing homo epitaxially on the ZnO substrate using DMZn and $O_2$ gas. There is a report that the surface where an atomic step appears by combining a high VI/II ratio and the substrate temperature of 1000 degrees C. is obtained. According to the result of an image of the AFM (Atomic Force Microscope) in Non Patent Literature 4, the direction of step is not match such as the ZnO substrate. Furthermore, a result that the height of step is also higher compared with a monolayer step is obtained. Moreover, an abnormality part of hexagonal prism shape with the size of about 50 nm appears, and further improvement is required for the homo epitaxial growth of high quality, as described in Non Patent Literature 2.

Moreover, according to the present inventors' experience, in the MOCVD method, the growth rate reduces as the high temperature growth is performed, and if the material partial pressure is increased in order to avoid the reduction of the growth rate, the material utilization efficiency is reduced by the above-mentioned premature reactions. As a result, there is a problem that realistic material utilization efficiency is not obtained.

In particular, the matter for which the ZnO is applied as p type becomes a great barrier of ZnO device development, and many organizations are concentrating on applying ZnO as p type even currently. As for the p type doping materials to the ZnO based semiconductor, a method of displacing an oxygen atom to a group V element is examined by many organizations, and N (nitrogen), As (arsenic), P (phosphorus), Sb (antimony), etc. are mentioned to a candidate. Also among this candidate, the ion radius of N is the same extent as oxygen, and N is leading as the p type dopant candidate of ZnO.

It is known that many acceptors in a wide gap semiconductor are trapped in deep levels usually, and an activation rate is low near room temperature. For example, the case of gallium nitride having a bandgap of the same extent as ZnO, the activation rate in the room temperature of Mg which is a p type dopant is as low as several percent, and in order to achieve carrier concentration (the concentration exceeding $1\times10^{17}$ cm$^{-3}$ is needed) used with optical devices, Mg more than $10^{19}$ cm$^{-3}$ grade is doped usually.

It has been considered conventional that high doping of the nitrogen to ZnO is difficult in a high temperature region (for example, refer to Patent Literature 3).

For example, in Patent Literature 3, it is proposed the method of: forming a ZnO layer doped with high-concentration N at the low temperature which is about 300 degrees C. which nitrogen can dope mostly; and repeating the sequence which anneals at high temperature of about 800 degrees C. and forms a low concentration N doping layer. In Patent Literature 3, although the PLD method for annealing the substrate by laser is adopted, and it is a method in which rapid temperature increasing and rapid temperature decreasing are possible in a short time of several minutes, the step for growing ZnO is included also in the temperature increasing and temperature decreasing of a sample, and in particular, therefore it is difficult to control temperature with sufficient reproducibility during the temperature decreasing which is self-cooling.

As mentioned above, although the doping efficiency of nitrogen is strongly dependent on the growth temperature, since the crystallinity reduces and nitrogen is not activated if the substrate temperature is reduced, it is very difficult to form the p type ZnO.

Moreover, although there is also a MBE apparatus in the high vacuum process apparatus for performing nitrogen doping besides the above-mentioned PLD apparatus, N plasma using a radical cell for N doping source is used in many cases. Thus, in the apparatus using the radical cell, if plasma power is raised in order that a radical element is increased, there is a fault that sputtering of the internal wall of the cell is performed and an internal wall material is doped in ZnO.

If the internal wall material is doped in ZnO, it will also become a pollution source in many cases. As a result, there was a problem that it is not only difficult to obtain desired composition and p type doping, but also the controllability of ion concentration is difficult by introducing an impurity which is not aimed.

On the other hand, in the MOCVD method, there is a problem that the rate of the zinc which can be contributed to growth of the ZnO based semiconductor on the growth substrate is small, and the efficiency of material including zinc is low, according to the problem of zinc vapor pressure.

Moreover, since carbon mixes into the ZnO based semiconductor by the hydrocarbon group occurred when organic metal material gas including zinc is decomposed, there is a problem that growth of the ZnO based semiconductor which does not include carbon is difficult.

CITATION LIST

Patent Literature 1: Japanese Patent No. 3257344
Patent Literature 2: Japanese Patent No. 3424814
Patent Literature 3: Japanese Patent Application Laying-Open Publication No. 2005-223219
Non Patent Literature 1: N. Takahashi, et al. "Atmospheric pressure vapor-phase growth of ZnO using chloride source", Journal of Crystal Growth. 209 (2000), 822
Non Patent Literature 2: H. Amano, N. Sawaki and I. Akasaki, "Metalorganic vapor phase epitaxy growth of a high quality GaN film using an AlN buffer layer", Appl. Phys. Lett. 48(5), 3 February 1986, 353
Non Patent Literature 3: H. KATO, M. SANO, K. MIYAMOTO, and T. YAO, "Effect of O/Zn Flux Ratio on Crystalline Quality of ZnO Films Grown by Plasma-Assisted Molecular Beam Epitaxy", Jpn. J. Appl. Phys. Vol. 42 (2003), 2241
Non Patent Literature 4: S. Heinze, et al. "Homo epitaxial growth of ZnO by metalorganic vapor phase epitaxy in two-dimensional growth mode", Jounal of Crystal Growth 308 (2007) 170

SUMMARY OF THE INVENTION

Technical Problem

In the case of ZnO based semiconductor crystal growth on the heterogeneous substrate, such as a sapphire substrate, even when the halogenide of Zn is applied as materials, the wettability of ZnO toward the heterogeneous substrate is low when high temperature growth is performed, a crystalline nucleus grows sparsely without the ZnO on the heterogeneous substrate becoming a film, and it cannot become continuous membrane easily.

Moreover, in the case where the high temperature growth is performed by the MOCVD method or the MBE method, since growth of ZnO is difficult in high temperature growth even when the buffer layer is used as mentioned above, and raw material efficiency not only worsens, but oxygen material reacts to Zn easily when the amount of supply of Zn material is increased, the premature reaction in the vapor phase occurs and it becomes a cause of a particles generation.

The purpose of the present invention is to provide a hetero epitaxial growth method that it can grow up a ZnO based semiconductor crystal on a heterogeneous substrate, such as a sapphire substrate, at a temperature higher than 800 degrees C.

Moreover, the purpose of the present invention is to provide a hetero epitaxial crystal structure and a semiconductor device which are formed by using the above-mentioned hetero epitaxial growth method.

Furthermore, the purpose of the present invention is to provide a hetero epitaxial crystal growth apparatus in order to grow up a ZnO based semiconductor crystal on a heterogeneous substrate, such as a sapphire substrate, at a temperature higher than 800 degrees C.

High temperature growth is indispensable on the crystal quality of the semiconductor layer which grows. On the other hand, if the melting point of 1975 degrees C. of ZnO is taken into consideration, growth of about 1000 degrees C. is desired as well as GaN.

The present inventors found out that a ZnO based semiconductor layer of satisfactory crystal quality could be grown up by supplying halogenide of zinc and/or magnesium and oxygen containing material on the ZnO substrate set as not less than 1000 degrees C. Moreover, the present inventors found out that a clear atomic step appears on the surface of a growth film by setting the material partial pressure of the halogenide of zinc and/or magnesium as not more than $1 \times 10^{-4}$ atm (preferably not more than $3 \times 10^{-5}$ atm).

The purpose of the present invention is to provide a homo epitaxial growth method which can grow the ZnO based semiconductor crystal on the ZnO substrate at a temperature higher than 1000 degrees C.

Moreover, the purpose of the present invention is to provide a homo epitaxial crystal structure and a semiconductor device which are formed by using the above-mentioned homo epitaxial growth method.

Furthermore, the purpose of the present invention is to provide a homo epitaxial crystal growth apparatus in order to grow up the ZnO based semiconductor crystal on the ZnO substrate at a temperature higher than 1000 degrees C.

On the other hand, in the HVPE method, since it is growing up in atmospheric pressure or the state near atmospheric pressure, plasma used by the MBE method or the PLD method cannot be used for applying the nitrogen doping of a group V element as a p type impurity by the HVPE method. Moreover, if it uses in the state of $N_2$ gas, the triple bond of N is strong and it is not function as nitrogen doping gas in the growth temperature which is degree 1000 degrees C. On the other hand, as a nitrogen source, the gas which can become a nitrogen source exists even if it is plasma-less gas, such as $N_2O$ and $NO_2$ gas.

However, in the HVPE method, the premature reaction in which a reaction occurs before material gas reaches to the substrate is prevented by growing up by the small system of an equilibrium constant using $H_2O$ gas and a halogenide. Then, introducing the gas having oxidizing power, such as $N_2O$ and $NO_2$ gas, in its state causes the premature reaction, and it may cause occurring of particle and deterioration of raw material efficiency.

On the other hand, As, P, and Sb which are other group V elements are a solid at room temperature, and are not fit for doping of the vapor phase epitaxial crystal growth applying the single substance as the starting material.

The present inventors found out that enough nitrogen can be doped for even if the growth temperature is set up highly by reacting p type impurity material gas as hydride gas of group V material to the halide gas including Zn. Furthermore, it has verified that the crystallinity is improved when ZnO doped with the p type impurity is grown up by the above-mentioned HVPE method, even if it is a growth temperature region to which the crystallinity reduces by undoped ZnO etc. conventionally.

The purpose of the present invention is to provide a ZnO based semiconductor which can prevent mixing of the impurity which is not aimed and can dope a p type impurity enough also at high temperature, and a fabrication method and a fabricating apparatus for the ZnO based semiconductor.

Solution to Problem

According to an aspect of the invention, a hetero epitaxial growth method comprises forming a buffer layer on a heterogeneous substrate; and performing crystal growth of a zinc oxide based semiconductor layer on the buffer layer using a halogenated group II metal and an oxygen material.

According to another aspect of the invention, a hetero epitaxial crystal structure comprises a heterogeneous substrate; a buffer layer disposed on the heterogeneous substrate; and a zinc oxide based semiconductor layer disposed on the buffer layer and formed by crystal growth using a halogenated group II metal and an oxygen material.

According to another aspect of the invention, a semiconductor device comprises a heterogeneous substrate; a buffer layer disposed on the heterogeneous substrate; a n type zinc oxide based semiconductor layer disposed on the buffer layer and impurity-doped with a n type impurity; a zinc oxide based semiconductor active layer disposed on the n type zinc oxide based semiconductor layer; and a p type zinc oxide based semiconductor layer disposed on the active layer and impurity-doped with a p type impurity.

According to another aspect of the invention, a hetero epitaxial growth apparatus comprises a first source zone for holding a first group II metallic material including a zinc single metal substance; a second source zone for holding a second group II metallic material including a group II single metal substance except zinc; a first halogen gas supplying unit for supplying first halogen gas to the first source zone; a second halogen gas supplying unit for supplying second halogen gas to the second source zone; an oxygen material supplying unit for supplying an oxygen material including oxygen; a first doping gas supplying unit for supplying n type doping gas for impurity-doping a n type impurity; a second doping gas supplying unit for supplying p type doping gas for impurity-doping a p type impurity; and a growth zone for reacting the halogenated gas of the first and second group II metal generated from the group II metallic material, the oxygen material, the n type and p type doping gas.

According to another aspect of the invention, a homo epitaxial growth method comprises introducing reactant gas mixing zinc containing gas and oxygen containing gas on a zinc oxide substrate; and performing crystal growth of a zinc oxide based semiconductor layer on the zinc oxide substrate.

According to another aspect of the invention, a homo epitaxial crystal structure comprises a zinc oxide substrate; and a zinc oxide based semiconductor layer disposed on the zinc oxide substrate and formed by crystal growth using a halogenated group II metal and an oxygen material.

According to another aspect of the invention, a semiconductor device comprises a zinc oxide substrate; a n type zinc oxide based semiconductor layer disposed on the zinc oxide substrate and impurity-doped with an type impurity; a zinc oxide based semiconductor active layer disposed on the n type zinc oxide based semiconductor layer; and a p type zinc oxide based semiconductor layer disposed on the active layer and impurity-doped with a p type impurity.

According to another aspect of the invention, a homo epitaxial growth apparatus comprises a first source zone for holding a first group II metallic material including a zinc single metal substance; a second source zone for holding a second group II metallic material including a group II single metal substance except zinc; a first halogen gas supplying unit for supplying first halogen gas to the first source zone; a second halogen gas supplying unit for supplying second halogen gas to the second source zone; an oxygen material supplying unit for supplying an oxygen material including oxygen; a first doping gas supplying unit for supplying n type doping gas for impurity-doping a n type impurity; a second doping gas supplying unit for supplying p type doping gas for impurity-doping a p type impurity; and a growth zone for reacting the halogenated gas of the first and second group II metal generated from the group II metallic material, the oxygen material, the n type and p type doping gas.

According to another aspect of the invention, a fabrication method for a ZnO based semiconductor comprises introducing reactant gas mixing halogenated group II metallic gas including zinc and oxygen containing gas on one of a substrate and a semiconductor layer; and introducing hydride gas of group V as p type impurity material gas on one of the substrate and the semiconductor layer, wherein crystal growth of the zinc oxide based semiconductor layer doped with a p type impurity is performed on one of the substrate and the semiconductor layer.

According to another aspect of the invention, an apparatus for fabricating a ZnO based semiconductor comprises a source zone for holding a group II metallic material including a zinc single metal substance; a halogen gas supplying unit for supplying halogen gas to the source zone; an oxygen material supplying unit for supplying an oxygen material including oxygen; a hydride gas supplying unit for supplying hydride gas of group V for impurity-doping a p type impurity; and a growth zone for reacting the hydride gas of the group V, the halogenated group II metallic gas generated from the group II metallic material, and the oxygen material, wherein a gas supply line connected to the hydride gas supplying unit is disposed by extending to the growth zone, and a gas supplying outlet port of the aforesaid gas supply line is disposed the upper side of the substrate or the semiconductor.

Advantageous Effects of Invention

According to the present invention, the hetero epitaxial growth method that the ZnO based semiconductor crystal can be grown up on the heterogeneous substrate, such as a sapphire substrate, at a temperature higher than 800 degrees C. can be provided.

Moreover, according to the present invention, the hetero epitaxial crystal structure and the semiconductor device which are formed by using the above-mentioned hetero epitaxial growth method can be provided.

Moreover, according to the present invention, the hetero epitaxial crystal growth apparatus in order to grow up the ZnO based semiconductor crystal on the heterogeneous substrate, such as a sapphire substrate, at a temperature higher than 800 degrees C. can be provided.

According to the present invention, the homo epitaxial growth method which can grow up the ZnO based semiconductor crystal on the ZnO substrate at a temperature higher than 1000 degrees C. can be provided.

Moreover, according to the present invention, the homo epitaxial crystal structure and the semiconductor device which are formed by using the above-mentioned homo epitaxial growth method can be provided.

Moreover, according to the present invention, the homo epitaxial crystal growth apparatus in order to grow up the ZnO based semiconductor crystal on the ZnO substrate at a temperature higher than 1000 degrees C. can be provided.

According to the present invention, since the step of introducing the hydride gas of group V material as p type impurity material gas in addition to the step of introducing the reactant gas which mixed the halogenated group II metallic gas which includes zinc at least and oxygen containing gas, on the substrate or the semiconductor layer is provided, the premature reaction can be prevented and the p type impurity can fully be doped also at high growth temperature. Moreover, the crystal quality of the ZnO based semiconductor can also be improved by applying high growth temperature. Moreover, since plasma is not used, mixing of the impurity which is not aimed can be prevented.

BRIEF DESCRIPTION OF DRAWINGS

FIG. 2 is a schematic bird's-eye view structural drawing of a hetero epitaxial crystal structure in the formation process of the ZnO layer by halogenide vapor phase epitaxy, in the hetero epitaxial growth method according to the first embodiment of the present invention.

FIG. 44A is an enlarged drawing of an AFM photograph showing the surface morphology of 1 ML step of +c-plane ZnO based semiconductor layer surface in alignment with m-axial direction <1-10> and a-axial direction <110>, in the homo epitaxial crystal structure formed by the homo epitaxial growth method according to the second embodiment of the present invention.

FIG. 44B is a schematic planar structure diagram of the step morphology of 1 ML step corresponding to FIG. 44A.

FIG. 44C is a schematic cross-sectional configuration diagram of the step morphology between A-B corresponding to FIG. 44B.

FIG. 44D is an explanatory diagram of the m-axial direction <1-10> and the a-axial direction <110> in hexagonal shape.

DESCRIPTION OF EMBODIMENTS

Figure 1A:
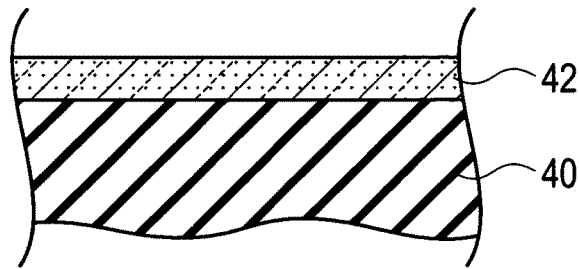
FIG. 1A shows a hetero epitaxial growth method of a hetero epitaxial crystal structure according to a first embodiment of the present invention, and is a schematic cross-sectional configuration diagram showing a buffer layer formation process.

Next, embodiments of the invention will be described with reference to drawings. It explains simple by attaching the same reference numeral as the same block or element to below, and avoiding duplication of description. Drawings are schematic, not actual, and may be inconsistent in between in scale, ratio, etc.

The embodiment shown in the following exemplifies the apparatus and method for materializing the technical idea of this invention, and the embodiments of the invention do not specify assignment of each component parts, etc. as the following. Various changes can be added to the technical idea of the present invention in scope of claims.

The "ZnO based compound semiconductor" as used in the following explanation means the group II oxide semiconductor containing the group II element Zn.

First Embodiment

Hetero Epitaxial Growth Method

A hetero epitaxial growth method of a hetero epitaxial crystal structure according to a first embodiment of the present invention will be explained with reference to FIG. 1.

Figure 1B:
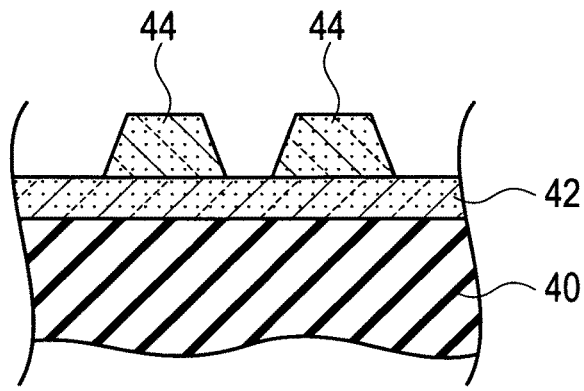
FIG. 1B shows the hetero epitaxial growth method of the hetero epitaxial crystal structure according to the first embodiment of the present invention, and is a schematic cross-sectional configuration diagram showing a formation process of the ZnO facet by halogenide vapor phase epitaxy.
Figure 1C:
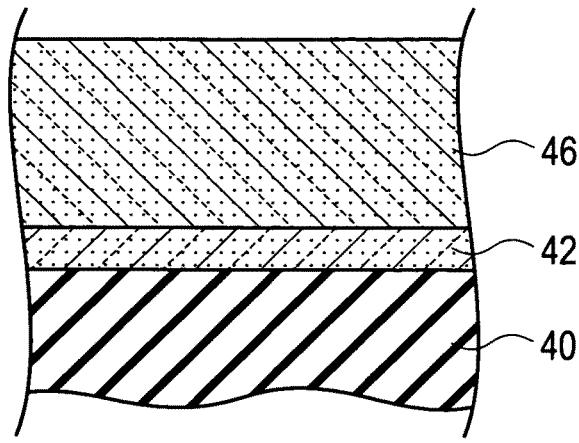
FIG. 1C shows the hetero epitaxial growth method of the hetero epitaxial crystal structure according to the first embodiment of the present invention, and is a schematic cross-sectional configuration diagram showing a formation process of the ZnO layer by halogenide vapor phase epitaxy.

A buffer layer formation process is expressed as shown in FIG. 1A. A formation process of a ZnO facet 44 by halogenide vapor phase epitaxy is expressed as shown in FIG. 1B. A formation process of a ZnO layer by halogenide vapor phase epitaxy is expressed as shown in FIG. 1C.

(a) First of all, as shown in FIG. 1A, a ZnO template is formed by a laser ablation method on a heterogeneous substrate 40, using an a-plane sapphire substrate for example as the heterogeneous substrate 40. The ZnO template is composed of a buffer layer 42. The buffer layer 42 can also be formed with the orienting film of an oxide, or the orienting film of nitride. More specifically, for example, the orienting film of the oxide composed of ZnO or MgO, or the orienting film of the nitride composed of AlN or GaN is applicable. The temperature for forming the ZnO template is about 500 degrees C., for example. Moreover, the thickness of the buffer layer 42 is about 0.3 μm, for example.

As other formation methods of the ZnO template, a sputtering method, a pulse laser method, a MBE method, a HVPE method, etc. can be used, for example. Alternatively, a VPE method, etc. for merely reacting steam of Zn to water vapor are also applicable. In addition, in these formation methods, not less than 400 degrees C. of growth temperature is preferable, for example. It is because the performance of an underlying crystal substrate can be reflected to the ZnO template the more satisfactory, the more it becomes high temperature. The VPE method for merely reacting steam of Zn to vapor is later described with reference to FIG. 14 to FIG. 30.

In particular, considering compatibility with the subsequent high temperature growth using a halogenated group II metal, the HVPE method, the VPE method, etc. achievable in the same growth furnace are preferable.

Although the growth temperature of the buffer layer 42 is not specified in particular, the orientation of the buffer layer 42 can be improved and the crystallinity of a subsequent high temperature grown film also improves by heating the heterogeneous substrate 40 to the moderate temperature level (to 500 degrees C.). Although a thickness of the film is also not specified in particular, since the orientation and surface flatness of the buffer layer 42 may deteriorate with the method for film deposition of the buffer layer 42 if the film thickness is too thick, and it will not become continuous membrane if the film thickness is too thin, the film thickness of about 0.02 μm to about 0.5 μm is preferable, for example.

As for the ZnO crystal formed on the above-mentioned a-plane sapphire substrate, the c-plane oriented in the c-axial direction is obtained.

In addition, a silicon substrate, a SiC substrate, a GaAs substrate, a GaP substrate, a GaN based substrate, etc. are applicable as the heterogeneous substrate 40 except the above-mentioned a-plane sapphire substrate.

(b) Next, as shown in FIG. 1B, a ZnO facet 44 is formed on the buffer layer 42 by the HVPE method. More specifically, the halogenide vapor phase epitaxy using zinc chloride ($ZnCl_2$) and water ($H_2O$) is applied. As the crystal growth conditions, the partial pressure $PZnCl_2$ of $ZnCl_2$ is set as about $2.2 \times 10^{-5}$ atm against total pressure 1 atm, for example, the VI/II ratio which is a supply ratio between oxygen which is a group VI element and Zn which is group II elements is set to about 20 to 200, for example, the crystal growth temperature $T_g$ is set as about 1000 degrees C., for example, and the crystal growth period is set up in about 1 hour, for example. Here, in the case of partial pressure $PZnCl_2$ of $ZnCl_2=2.2 \times 10^{-5}$ atm, if the VI/II ratio=20 to 200, it will be set to partial pressure $PH_2O$ of $H_2O=4.4 \times 10^{-4}$ to $4.4 \times 10^{-3}$ atm.

In the hetero epitaxial growth method according to the first embodiment, the temperature $T_g$ of crystal growth is enforcing the high temperature growth method higher than 800 degrees C. If the melting point of 1975 degrees C. of the ZnO crystal is taken into consideration, ⅓ to about ½ of the melting point is needed, and the more the temperature $T_g$ of crystal growth is high, the more the satisfactory crystal of quality can be obtained. Therefore, in the above-mentioned example, the growth of about 1000 degrees C. same as GaN is performed.

(c) Next, a ZnO layer 46 of desired thickness is formed by performing lateral growth and vertical growth further for the ZnO facet 44 formed on the buffer layer 42 by using the HVPE method, setting up the crystal growth period still longer, as shown in FIG. 1C. More specifically, the halogenide vapor phase epitaxy using zinc chloride ($ZnCl_2$), water ($H_2O$), and $N_2$ which is carrier gas is applied as well as the formation of the ZnO facet 44. As the crystal growth conditions, the partial pressure $PZnCl_2$ of $ZnCl_2$ is set as about $2.2 \times 10^{-5}$ atm, for example, the VI/II ratio which is a supply ratio between the oxygen which is a group VI element and the Zn which is group II elements is set as about 20 to about 200, for example, the crystal growth temperature $T_g$ is set as about 1000 degrees C., for example, and the crystal growth period is set up in about 1 hour to about 6 hours, for example.

In the hetero epitaxial growth method according to the first embodiment, it is characterized by obtaining the single crystal of ZnO by depositing the buffer layer of ZnO at low temperature on the heterogeneous substrate, and then mixing Zn material composed of a halogenide of Zn and oxygen material in the vapor phase with high temperature at not less than 800 degrees C.

The wettability of ZnO can be improved by forming the buffer layer 42 to improve the wettability of ZnO on the heterogeneous substrate 40, such as ZnO, before the high temperature growth using Zn material composed of halogenide.

(High Temperature ZnO Growth on Buffer Layer)

In the hetero epitaxial growth method according to the first embodiment, a schematic bird's-eye view structure of the hetero epitaxial crystal structure in a formation process of the ZnO layer by the HVPE method is expressed as shown in FIG. 2. An aspect that the lateral growth (GL) and vertical growth (GV) of the ZnO facet 44 are performed on a surface 40a of the heterogeneous substrate 40 is shown schematically.

Figure 3A:
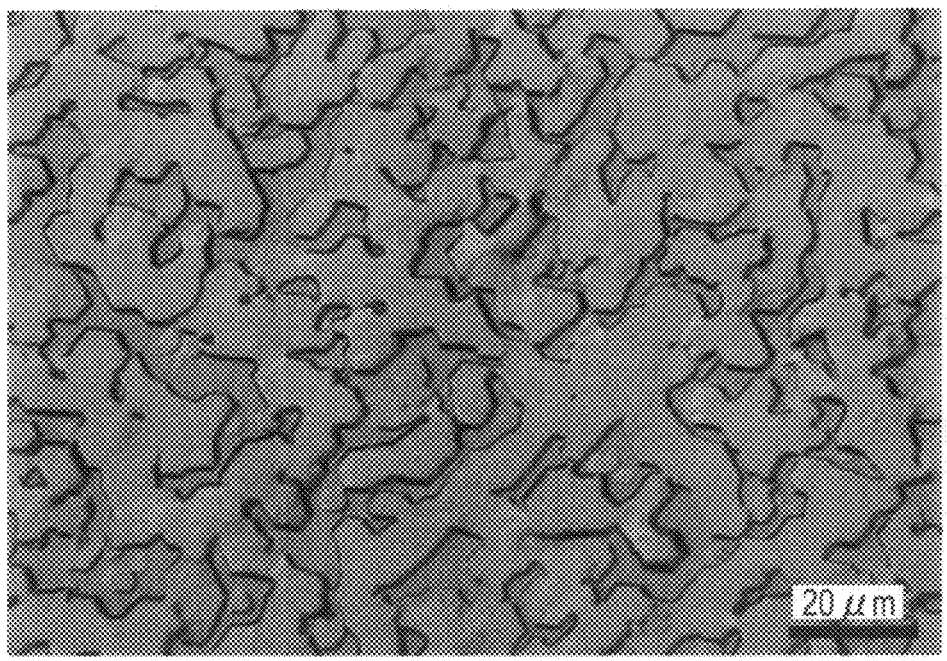
FIG. 3A shows the hetero epitaxial crystal structure formed by the hetero epitaxial growth method according to the first embodiment of the present invention, and is an optical microscope photograph of the surface of the ZnO layer.
Figure 3B:
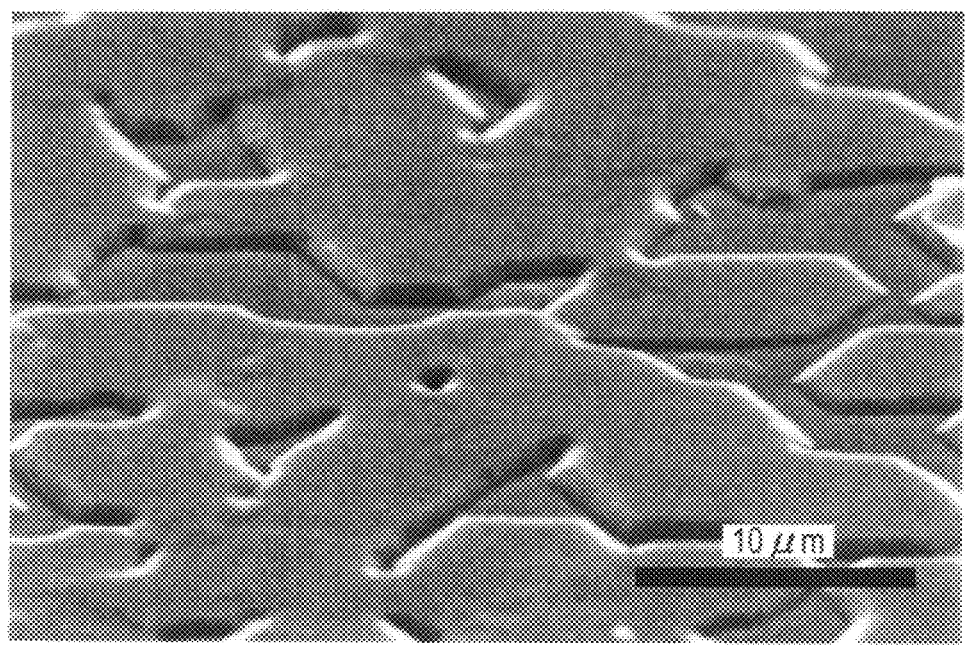
FIG. 3B shows the hetero epitaxial crystal structure formed by the hetero epitaxial growth method according to the first embodiment of the present invention, and is a bird's-eye view SEM photograph of the ZnO layer.

In the hetero epitaxial crystal structure formed by the hetero epitaxial growth method according to the first embodiment, an example of the optical microscope photograph on the surface of the ZnO layer is expressed as shown in FIG. 3A. Moreover, a bird's-eye view SEM photograph of the ZnO layer corresponding to FIG. 3A is expressed as shown in FIG. 3B. The example of FIG. 3A and FIG. 3B corresponds to the structure of FIG. 1B and FIG. 2. That is, it is an example which forms the ZnO facet 44 on the buffer layer 42 formed on the a-plane sapphire substrate using the a-plane sapphire substrate as the heterogeneous substrate 40.

As the crystal growth conditions, partial pressure $P_{ZnCl_2}$ of $ZnCl_2$ is set as $2.2 \times 10^{-5}$ atm, the VI/II ratio is set as 20, the crystal growth temperature $T_g$ is set as 1000 degrees C., and the crystal growth period is set up in 1 hour.

Figure 4A:
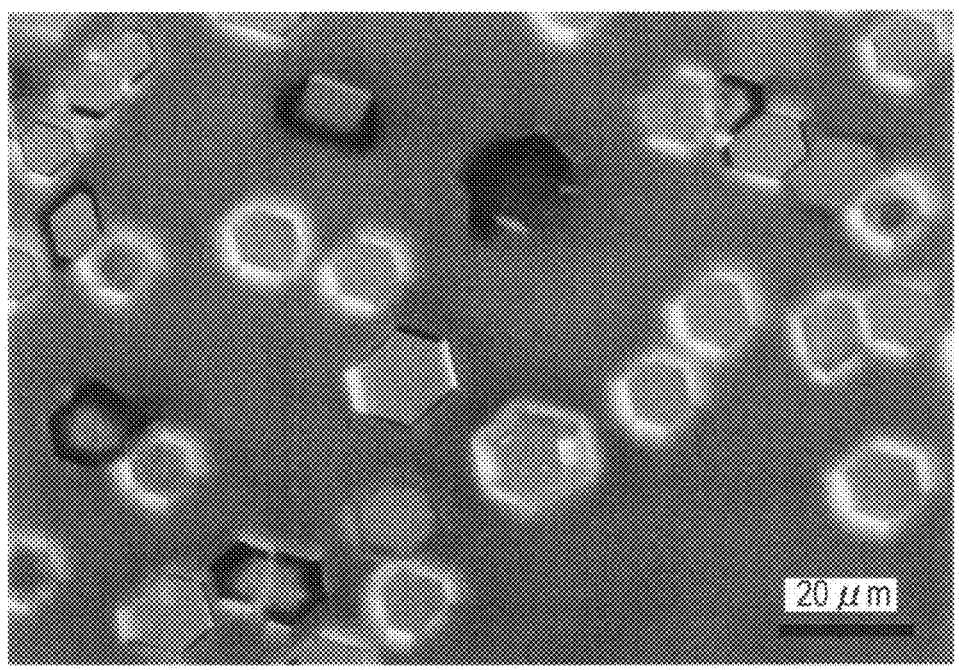
FIG. 4A shows a hetero epitaxial crystal structure formed by a hetero epitaxial growth method according to a comparative example of the present invention, and is an optical microscope photograph on the surface of the ZnO layer.
Figure 4B:
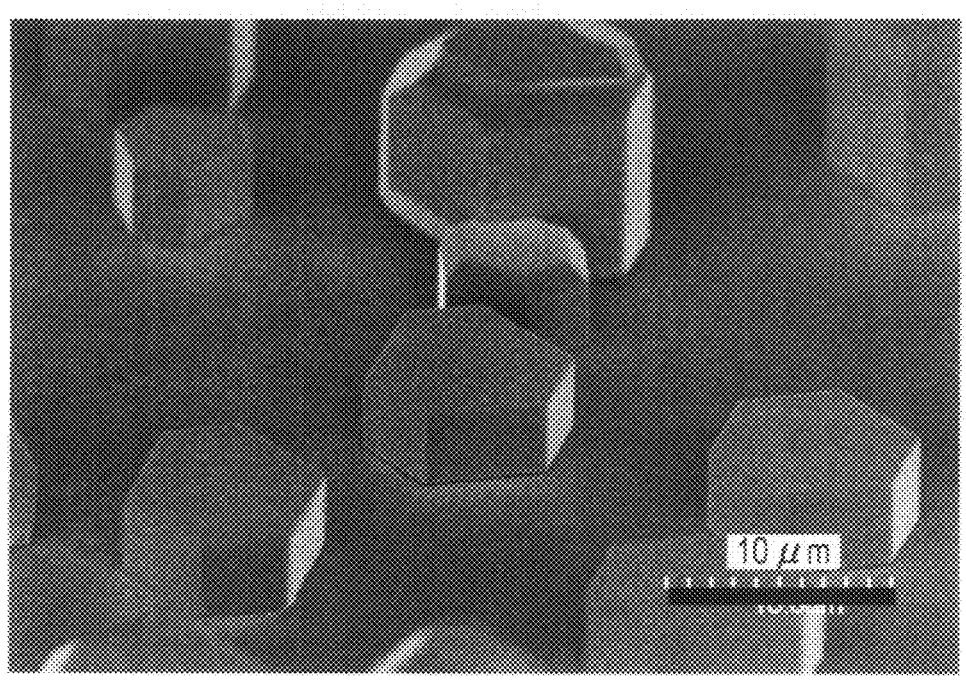
FIG. 4B shows the hetero epitaxial crystal structure formed by the hetero epitaxial growth method according to the comparative example of the present invention, and is a bird's-eye view SEM photograph of the ZnO layer.

Moreover, in a hetero epitaxial crystal structure formed by a hetero epitaxial growth method according to a comparative example of the present invention, an example of the optical microscope photograph on the surface of the ZnO layer is expressed as shown in FIG. 4A. Moreover, a bird's-eye view SEM photograph of the ZnO layer corresponding to FIG. 4A is expressed as shown in FIG. 4B. The example of FIG. 4A and FIG. 4B corresponds to the example which forms the ZnO crystal directly on the a-plane sapphire substrate not using the buffer layer 42 in the structure of FIG. 1B.

As the crystal growth conditions, the partial pressure $P_{ZnCl_2}$ of $ZnCl_2$ is set $2.2 \times 10^{-5}$ atm, the VI/II ratio is set as 600, the crystal growth temperature $T_g$ is set as 1000 degrees C., and the crystal growth period is set up in 1 hour.

By comparison of FIG. 3 and FIG. 4, when there is the buffer layer 42, the lateral growth (GL) of the ZnO facet 44 is accelerated, and the vertical growth (GV) of the ZnO facet 44 is further performed. On the other hand, when there is no buffer layer 42, the lateral growth (GL) of the ZnO facet 44 hardly occurs, but the vertical growth (GV) of the ZnO facet 44 mainly occurs. Accordingly, since the growth inside the plane is not performed even if the crystallinity of the ZnO crystal itself formed on the plane of the ZnO facet 44 is satisfactory, it is difficult to form the ZnO epitaxial growth layer. In addition, when direct growth of the ZnO is performed on the a-plane sapphire substrate on condition of the VI/II ratio=20 same as the conditions of FIG. 3, the nucleus growth of ZnO is observed extremely sparsely.

Figure 5A:
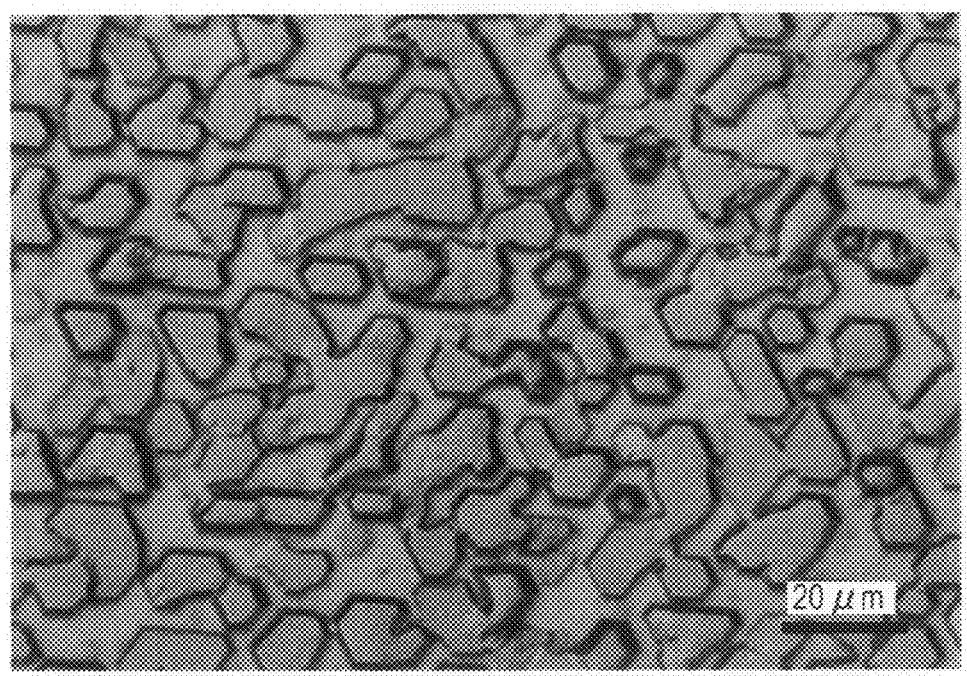
FIG. 5A shows the hetero epitaxial crystal structure formed by the hetero epitaxial growth method (example of VI/II ratio=200) according to the first embodiment of the present invention, and is an optical microscope photograph on the surface of the ZnO layer.
Figure 5B:
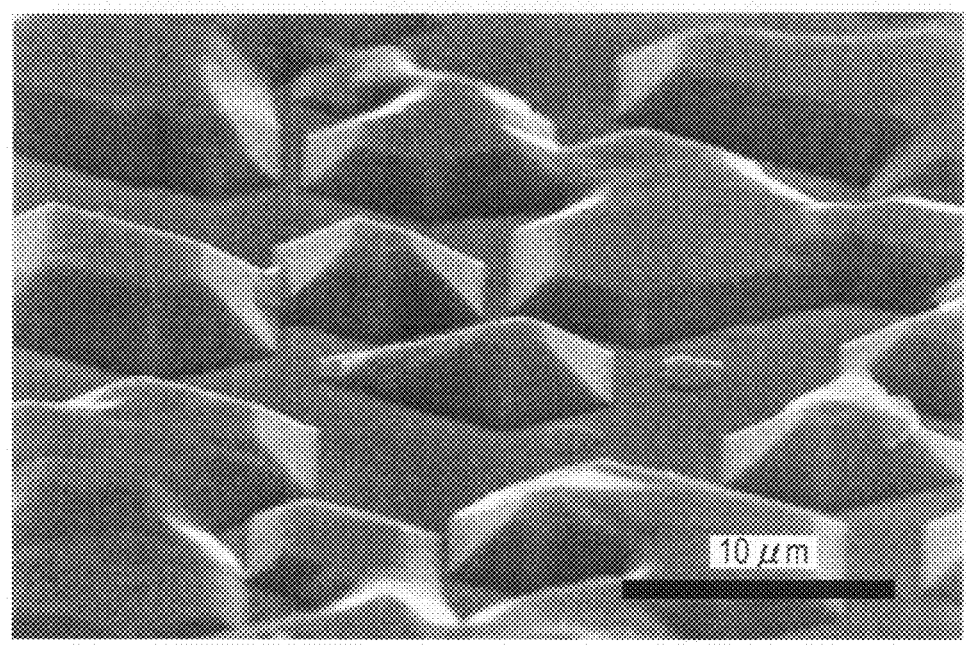
FIG. 5B shows the hetero epitaxial crystal structure formed by the hetero epitaxial growth method (example of VI/II ratio=200) according to the first embodiment of the present invention, and is a bird's-eye view SEM photograph of the ZnO layer.

In the hetero epitaxial crystal structure formed by the hetero epitaxial growth method according to the first embodiment, an optical microscope photograph on the surface of the ZnO layer in the example of VI/II ratio=20 is expressed as shown in FIG. 3A, and a SEM photograph of the ZnO layer corresponding to FIG. 3A is expressed as shown in FIG. 3B. Similarly, the optical microscope photograph on the surface of a ZnO layer in the example of VI/II ratio=200 is expressed as shown in FIG. 5A, and a bird's-eye view SEM photograph of the ZnO layer corresponding to FIG. 5A is expressed as shown in FIG. 5B.

As the crystal growth conditions, the partial pressure $PZnCl_2$ of $ZnCl_2$ is set as $2.2 \times 10^{-5}$ atm, the crystal growth temperature $T_g$ is set as 1000 degrees C., and the crystal growth period is set up in 1 hour.

As clearly from FIG. 3A and FIG. 3B, in the case of the VI/II ratio=20, since the partial pressure $PH_2O$ of $H_2O$ is set as $4.4 \times 10^{-4}$ atm, and the surface migration of molecules of $ZnCl_2$ occurs easily, the lateral growth of the ZnO facet 44 occurs easily. On the other hand, as clearly from FIG. 5A and FIG. 5B, in the case of the VI/II ratio=200, the partial pressure $PH_2O$ of $H_2O$ is set to $4.4 \times 10^{-3}$ atm, the more the partial pressure $PH_2O$ of $H_2O$ is high, the more the surface migration of $ZnCl_2$ molecules is suppressed, and the result that the lateral growth (GL) does not occur easily although the vertical growth (GV) is occurred is obtained.

Therefore, when accelerating the lateral growth (GL) of the ZnO facet 44 and obtaining the ZnO layer 46 of desired thickness, it proves that low VI/II ratio growth becomes an important growing condition.

Thus, since the speed of lateral growth becomes slow when the VI/II ratio in the case of crystal growth is large, the VI/II ratio is effective to apply not more than 100. Moreover, since the speed of crystal growth becomes slow when the VI/II ratio in the case of crystal growth is small, the VI/II ratio is effective to apply more than 1.

Moreover, it may not be limited to the above-mentioned VI/II ratio, the VI/II ratio may be set as value of more than 1 to not more than 100 (for example, 20) until the continuous membrane is made because the facet combines, for example, and then the VI/II ratio may be set as value of more than 100 (for example, 200).

(Growth Period Dependence of High Temperature ZnO)

Figure 6A:
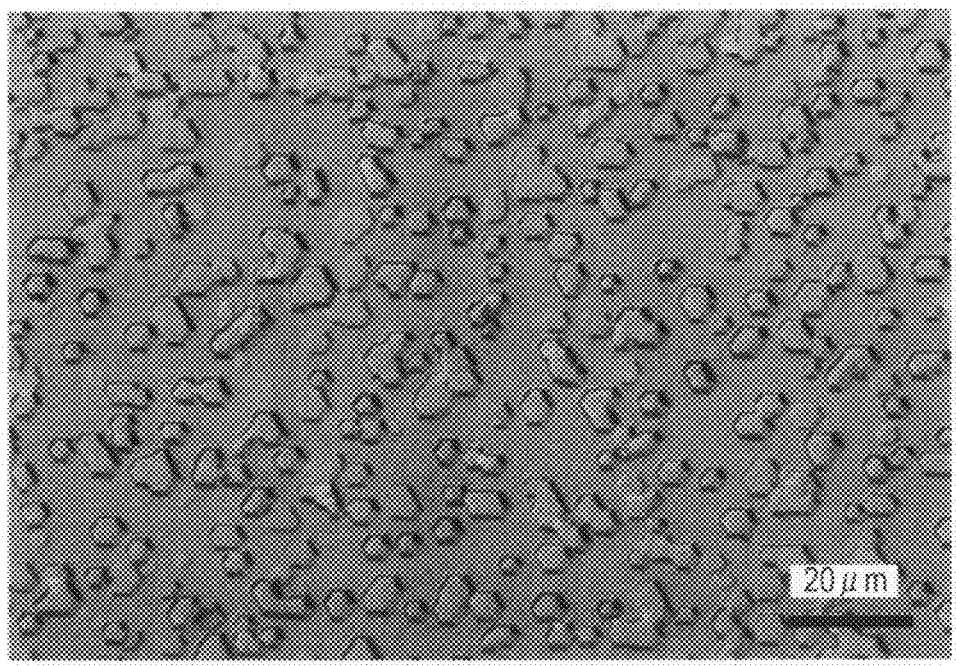
FIG. 6A shows the hetero epitaxial crystal structure formed by the hetero epitaxial growth method (example of 20 minutes of growth period) according to the first embodiment of the present invention, and is an optical microscope photograph on the surface of the ZnO layer.
Figure 6B:
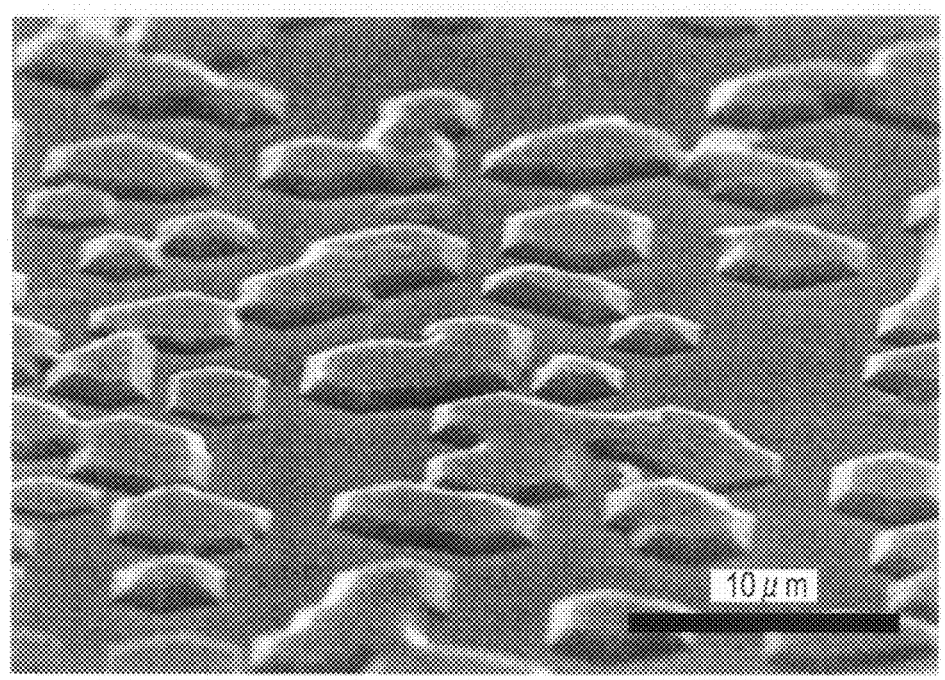
FIG. 6B shows the hetero epitaxial crystal structure formed by the hetero epitaxial growth method (example of 20 minutes of growth period) according to the first embodiment of the present invention, and is a bird's-eye view SEM photograph of the ZnO layer.
Figure 7A:
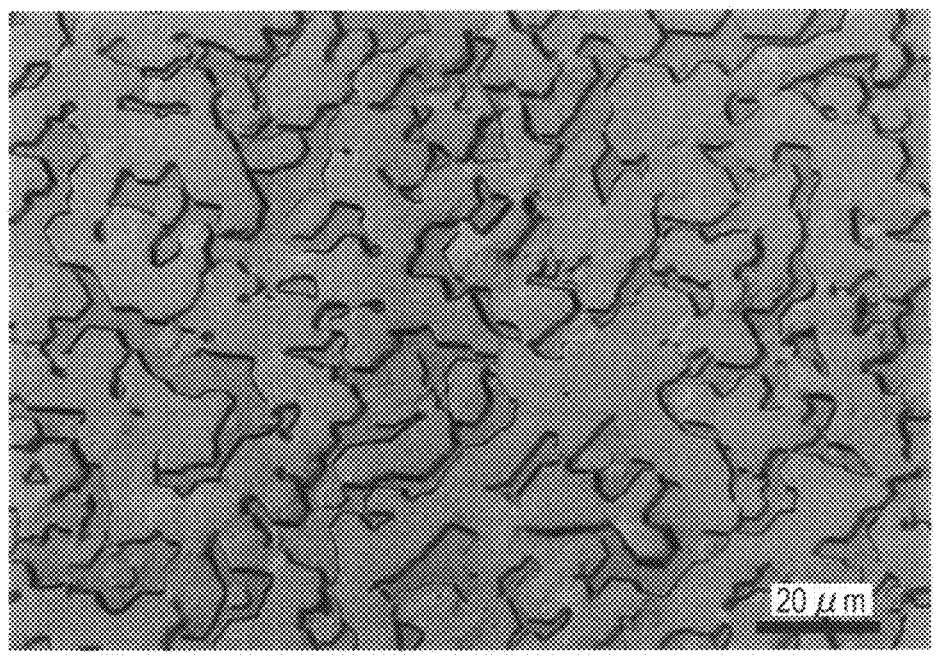
FIG. 7A shows the hetero epitaxial crystal structure formed by the hetero epitaxial growth method (example of 60 minutes of growth period) according to the first embodiment of the present invention, and is an optical microscope photograph on the surface of the ZnO layer.
Figure 7B:
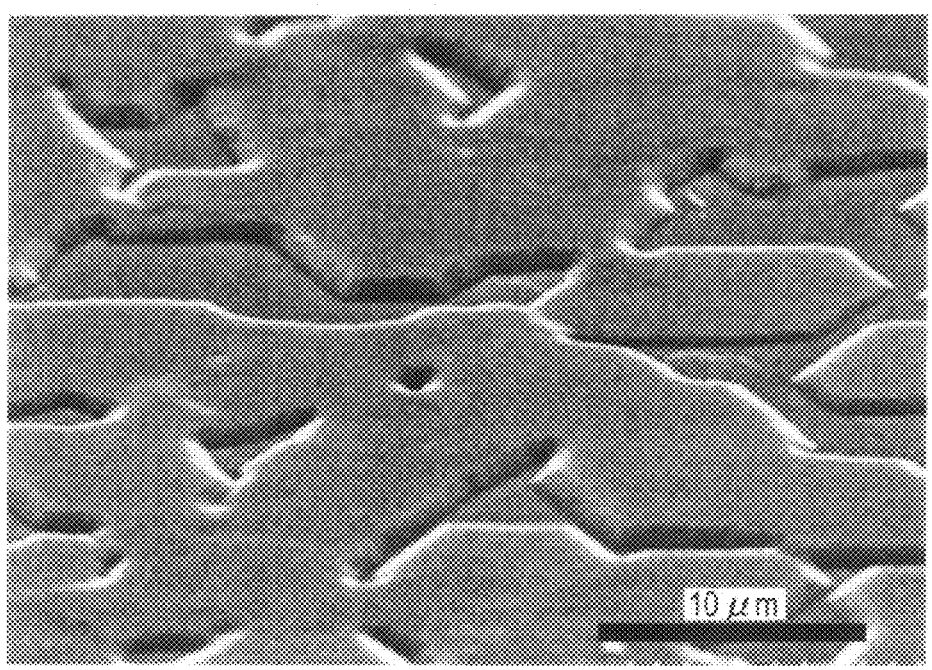
FIG. 7B shows the hetero epitaxial crystal structure formed by the hetero epitaxial growth method (example of 60 minutes of growth period) according to the first embodiment of the present invention, and is a bird's-eye view SEM photograph of the ZnO layer.
Figure 8A:
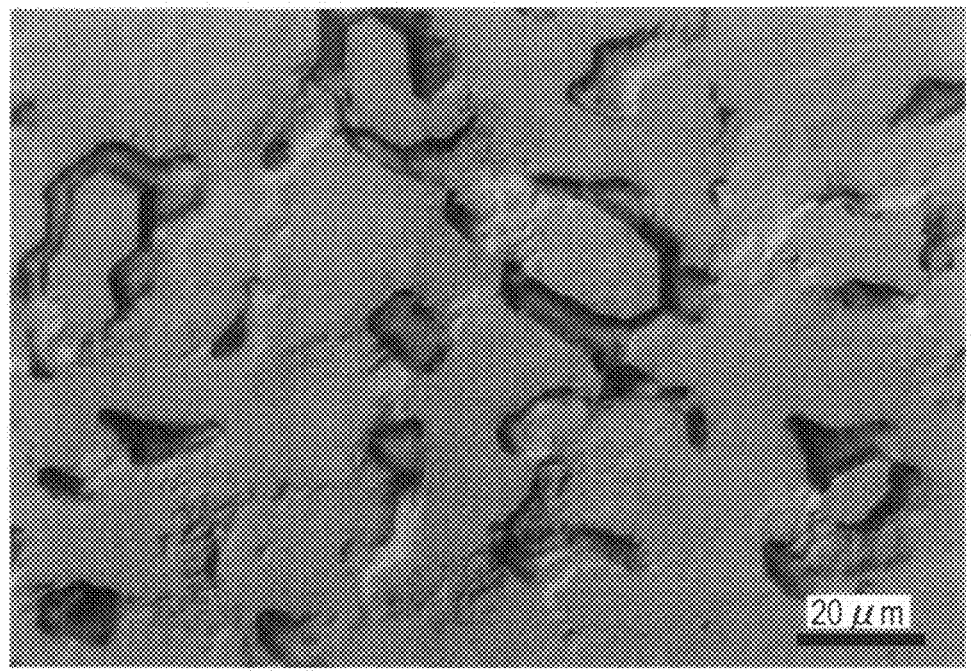
FIG. 8A shows the hetero epitaxial crystal structure formed by the hetero epitaxial growth method (example of 180 minutes of growth period) according to the first embodiment of the present invention, and is an optical microscope photograph on the surface of the ZnO layer.
Figure 8B:
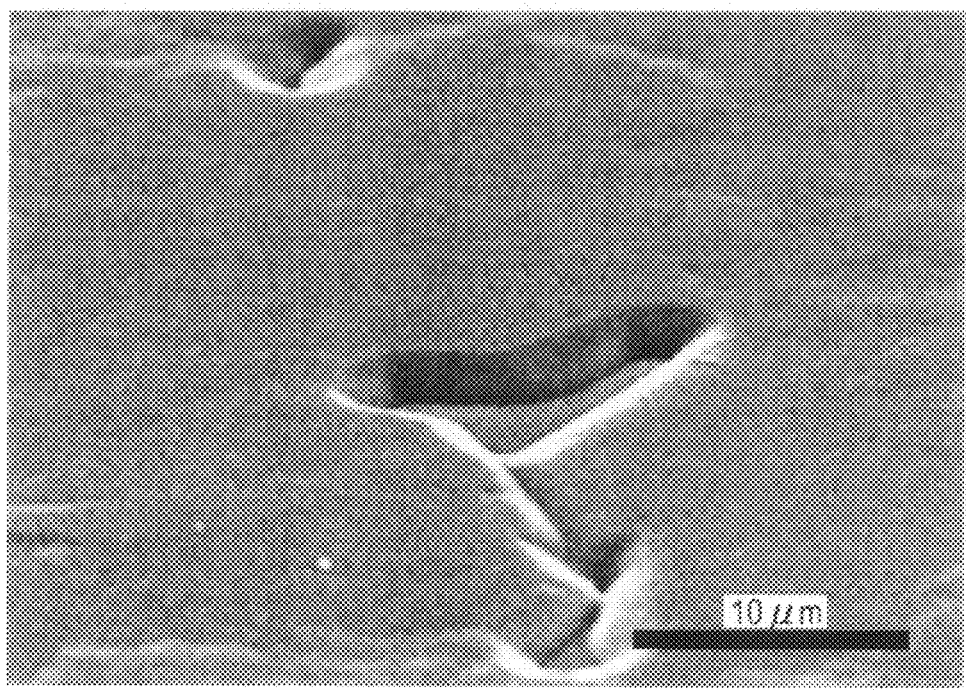
FIG. 8B shows the hetero epitaxial crystal structure formed by the hetero epitaxial growth method (example of 180 minutes of growth period) according to the first embodiment of the present invention, and is a bird's-eye view SEM photograph of the ZnO layer.
Figure 9A:
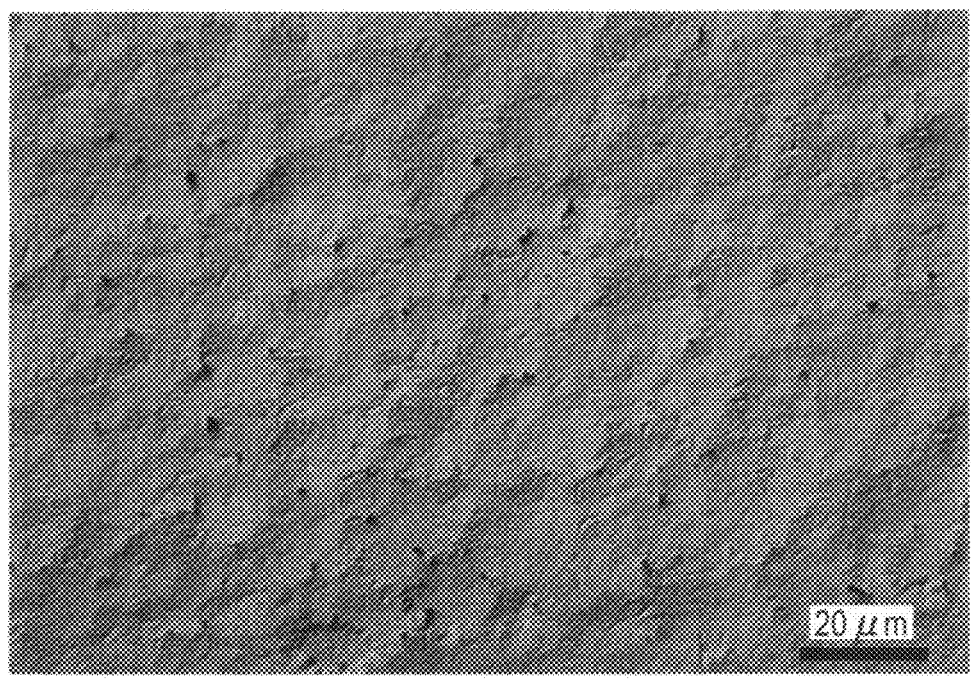
FIG. 9A shows the hetero epitaxial crystal structure formed by the hetero epitaxial growth method (example of 360 minutes of growth period) according to the first embodiment of the present invention, and is an optical microscope photograph on the surface of the ZnO layer.
Figure 9B:
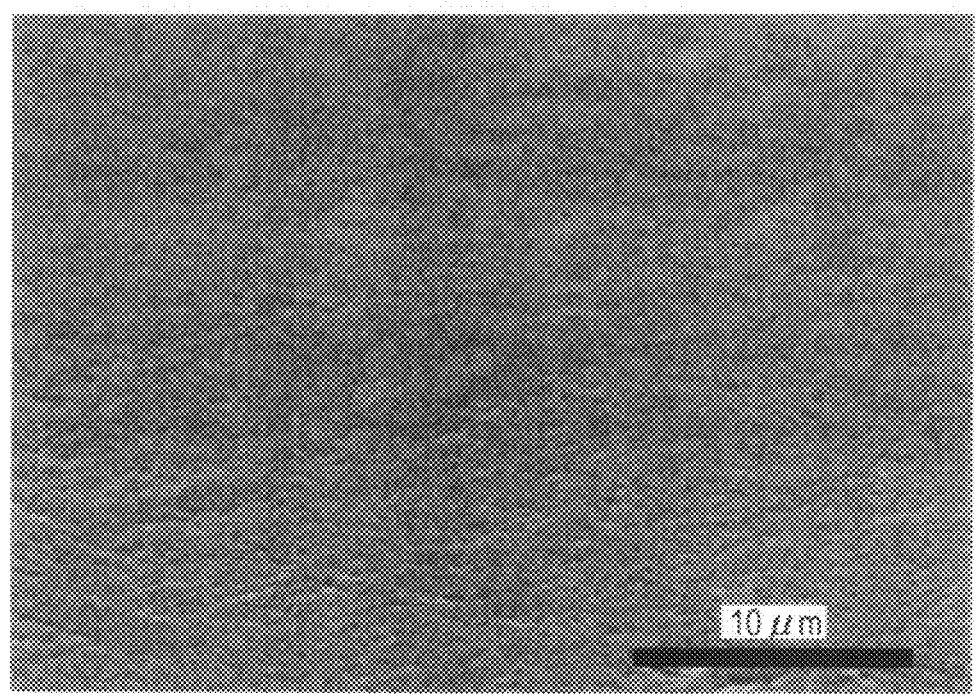
FIG. 9B shows the hetero epitaxial crystal structure formed by the hetero epitaxial growth method (example of 360 minutes of growth period) according to the first embodiment of the present invention, and is a bird's-eye view SEM photograph of the ZnO layer.

In the hetero epitaxial crystal structure formed by the hetero epitaxial growth method according to the first embodiment, an optical microscope photograph on the surface of the ZnO layer in the case that the growth period is 20 minutes is expressed as shown in FIG. 6A, and a bird's-eye view SEM photograph of the ZnO layer corresponding to FIG. 6A is expressed as shown in FIG. 6B. Similarly, an optical microscope photograph on the surface of the ZnO layer in the case that the growth period is 60 minutes is expressed as shown in FIG. 7A, a bird's-eye view SEM photograph of the ZnO layer corresponding to FIG. 7A is expressed as shown in FIG. 7B, an optical microscope photograph on the surface of the ZnO layer in the case that the growth period is 180 minutes is expressed as shown in FIG. 8A, a bird's-eye view SEM photograph of the ZnO layer corresponding to FIG. 8A is expressed as shown in FIG. 8B, an optical microscope photograph on the surface of the ZnO layer in the case that the growth period is 360 minutes is expressed as shown in FIG. 9A, and a bird's-eye view SEM photograph of the ZnO layer corresponding to FIG. 9A is expressed as shown in FIG. 9B.

As the crystal growth conditions, the partial pressure $P_{ZnCl2}$ of $ZnCl_2$ is set as $2.2 \times 10^{-5}$ (atm), the VI/II ratio is set as 20, and the crystal growth temperature $T_g$ is set as 1000 degrees C.

According to the hetero epitaxial growth method according to the first embodiment, as for the high temperature ZnO layer, it proves an aspect that the lateral crystal growth (GL) progresses with the passage of time of crystal growth, the vertical crystal growth (GV) progresses further, and the epitaxial layer grows.

The high temperature growth using the halogenide can reduce the crystalline nucleus on the buffer layer 42 as compared with the MBE method or the MOCVD method. Moreover, the buffer layer 42 improves the wettability of ZnO. Accordingly, the high temperature growth using the halogenide follows the growth process which forms the film by the great crystalline nucleus on the buffer layer 42 being linked with a lateral direction, as well as the high temperature GaN on the buffer layer by the MOCVD method.

If the conditions of the high temperature growth and the low VI/II ratio are adopted in order to accelerate in particular the lateral growth of the crystalline nucleus, as shown in FIG. 6 to FIG. 9, the crystalline nucleus can be combined at an early stage, and flattening of the high temperature grown film can be possible.

In the case of the high temperature growth using the halogenide of Zn, the reactivity of the halogenide of Zn and oxygen material is not as high as Zn and oxygen material. Accordingly, the high temperature growth using the halogenide of Zn has few reactions in the vapor phase, and there is little occurrence of particle.

This reactant lowness has had great influence also on the crystalline nucleus growth process. That is, since the crystalline nucleus does not form the film by occurring innumerably on the buffer layer 42 but the high temperature growth using the halogenide of Zn can grow up the sparse crystalline nucleus greatly, it can grow up effective crystalline ZnO layer 46 with little grain boundaries.

(Crystallinity of ZnO Crystal)

Figure 10:
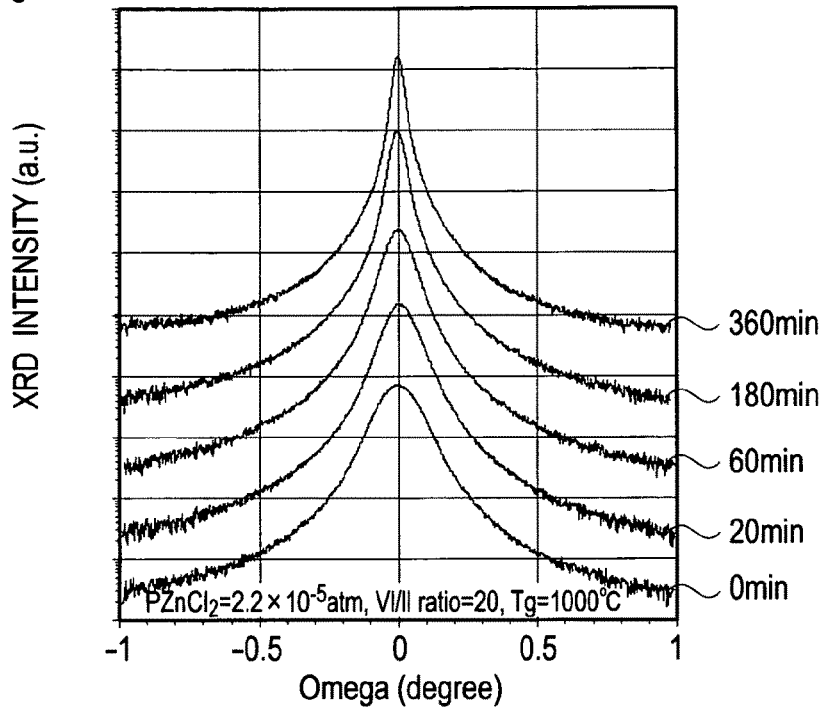
FIG. 10 shows the X-ray rocking curve of the ZnO crystal of the hetero epitaxial crystal structure formed by the hetero epitaxial growth method (example of ZnO (002) plane) according to the first embodiment of the present invention.

In the hetero epitaxial crystal structure formed by the hetero epitaxial growth method according to the first embodiment, a X-ray rocking curve of the (002) plane of ZnO is expressed as shown in FIG. 10. In FIG. 10, each curve expresses an example whose the crystal growth periods are 0 minute, 20 minutes, 60 minutes, 180 minutes, and 360 minutes, as a parameter. The crystal growth period=0 minute is equivalent to the state after forming the buffer layer. In a ZnO crystal, the (002) plane is a plane vertical to a c-axis, and the X-ray rocking curve shown in FIG. 10 expresses a tilt profile which is fluctuation of the c-axial direction which is a growth direction. It proves that the film growth thickness of the ZnO crystal rises, the full width at half maximum of the X-ray rocking curve of the ZnO crystal decreases, and the crystallinity of the ZnO crystal having the (002) plane is improving, in accordance with the crystal growth period passes with 20 minutes, 60 minutes, 180 minutes, and 360 minutes.

Figure 11:
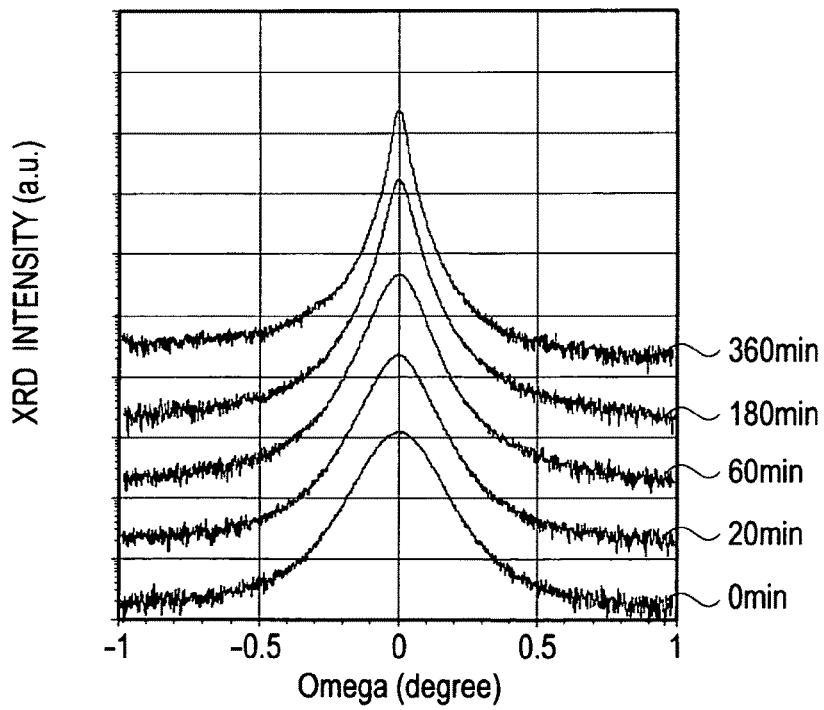
FIG. 11 shows the X-ray rocking curve of the ZnO crystal of the hetero epitaxial crystal structure formed by the hetero epitaxial growth method (example of ZnO (101) plane) according to the first embodiment of the present invention.

In the hetero epitaxial crystal structure formed by the hetero epitaxial growth method according to the first embodiment, a X-ray rocking curve of (101) plane of ZnO is expressed as shown in FIG. 11. Each curve expresses an example whose the crystal growth periods are 0 minute, 20 minutes, 60 minutes, 180 minutes, and 360 minutes, as a parameter, same as that of FIG. 10. The crystal growth period=0 minute is equivalent to the state after forming the buffer layer. In the ZnO crystal, the (101) plane is a semi-polar plane, and the X-ray rocking curve shown in FIG. 11 expresses a twist profile and a tilt profile which are fluctuation of a direction vertical to the semi-polar plane. It proves that the film growth thickness of the ZnO crystal rises, the full width at half maximum of the X-ray rocking curve of the ZnO crystal decreases, and the crystallinity of the ZnO crystal is improving, in accordance with the passage of time of crystal growth.

Figure 12:
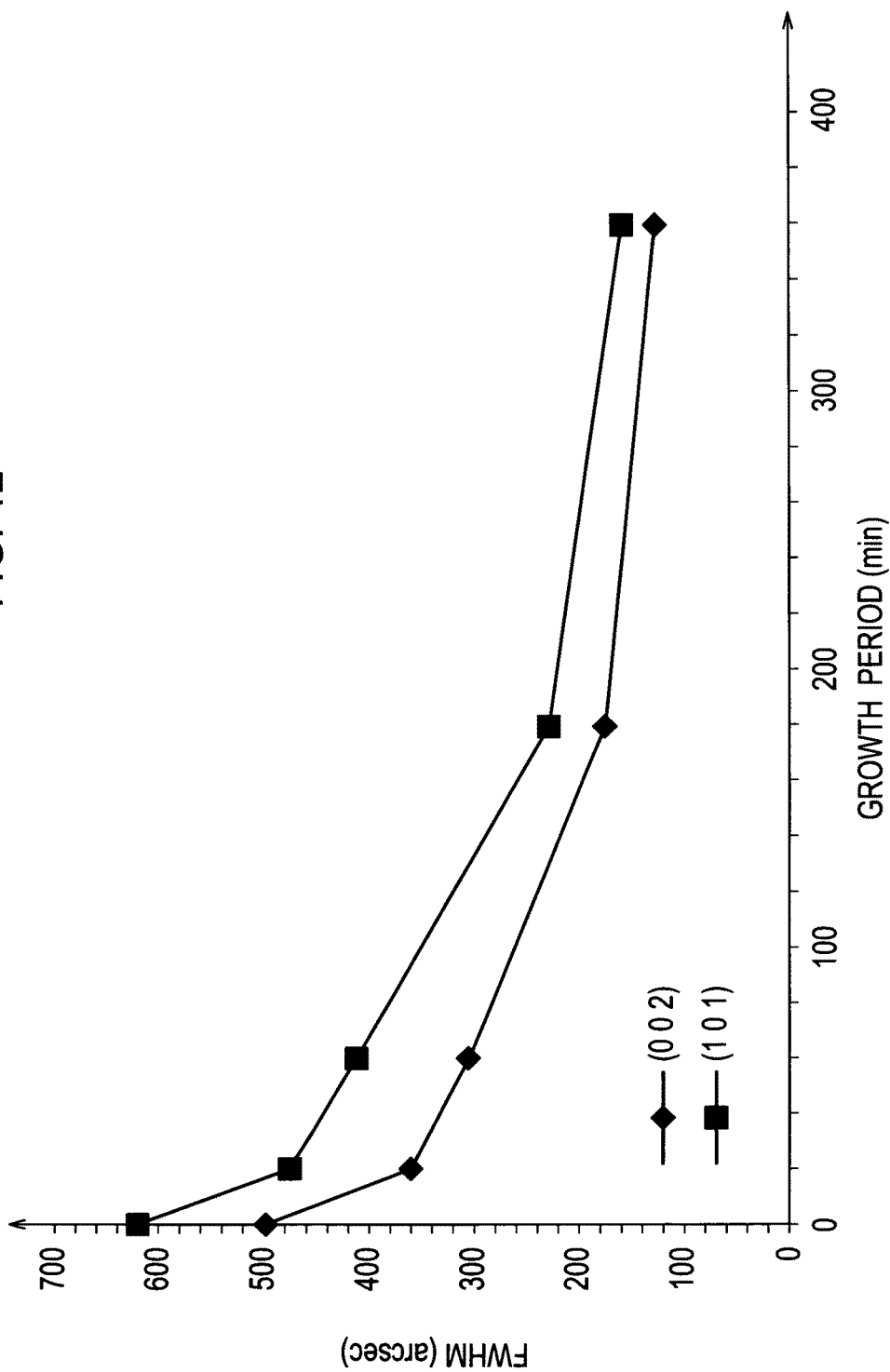
FIG. 12 is a drawing showing the relation between full width at half maximum FWHM (arc sec.) and crystal growth period (min.) of the X-ray rocking curve of the ZnO crystal of the hetero epitaxial crystal structure formed by the hetero epitaxial growth method according to the first embodiment of the present invention (example of ZnO (002) plane, and example of ZnO (101) plane).

In the hetero epitaxial crystal structure formed by the hetero epitaxial growth method according to the first embodiment, the relation between the full width at half maximum FWHM (arcsec) of the X-ray rocking curve of the ZnO crystal and the crystal growth period (min.) is expressed as shown in FIG. 12. An example of the ZnO (002) plane and an example of the ZnO (101) plane are shown in FIG. 12. The vertical axis of FIG. 12 expresses the FWHM (Full Width at Half Maximum) (arc sec.). Here, it is equivalent to 3600 (arcsec)=1 (degree).

In the ZnO crystal by which hetero epitaxial growth is performed on the sapphire substrate, the value of full width at half maximum FWHM of the rocking curve of the (101) plane and (002) plane improves in accordance with the passage of time of crystal growth. In particular, it is decreasing rather than 0.1 (degree)=360 (arcsec), and the crystallinity is satisfactory.

Here, in the case of this embodiment, when the crystal growth period is 180 minutes, about 1.5 μm of ZnO crystal layer on the buffer layer grows, and when crystal growth period is 360 minutes, about 3 μm of ZnO crystal layer on the buffer layer grows. Therefore, in this embodiment, as for after the crystal growth period at 180 minutes when not less than about 1.5 μm of ZnO crystal layer grows, the full width at half maximum FWHM becomes not more than 0.1 (degree) in the crystal (002) and (101) planes. In particular, although the (101) plane is measured as an example of the semi-polar plane according to the first embodiment, it does not limit to the example. Of course about other semi-polar planes, transition of same full width at half maximum FWHM is obtained. As an example of other semi-polar planes, there are (102) plane, (103) plane, (111) plane, (112) plane, (113) plane, (201) plane, (203) plane, (221) plane, (223) plane, etc. Moreover, in the non-polar plane (100) or (110) vertical to the (001) plane, the same full width at half maximum is also obtained.

(Crystal Growth Apparatus)

Figure 13:
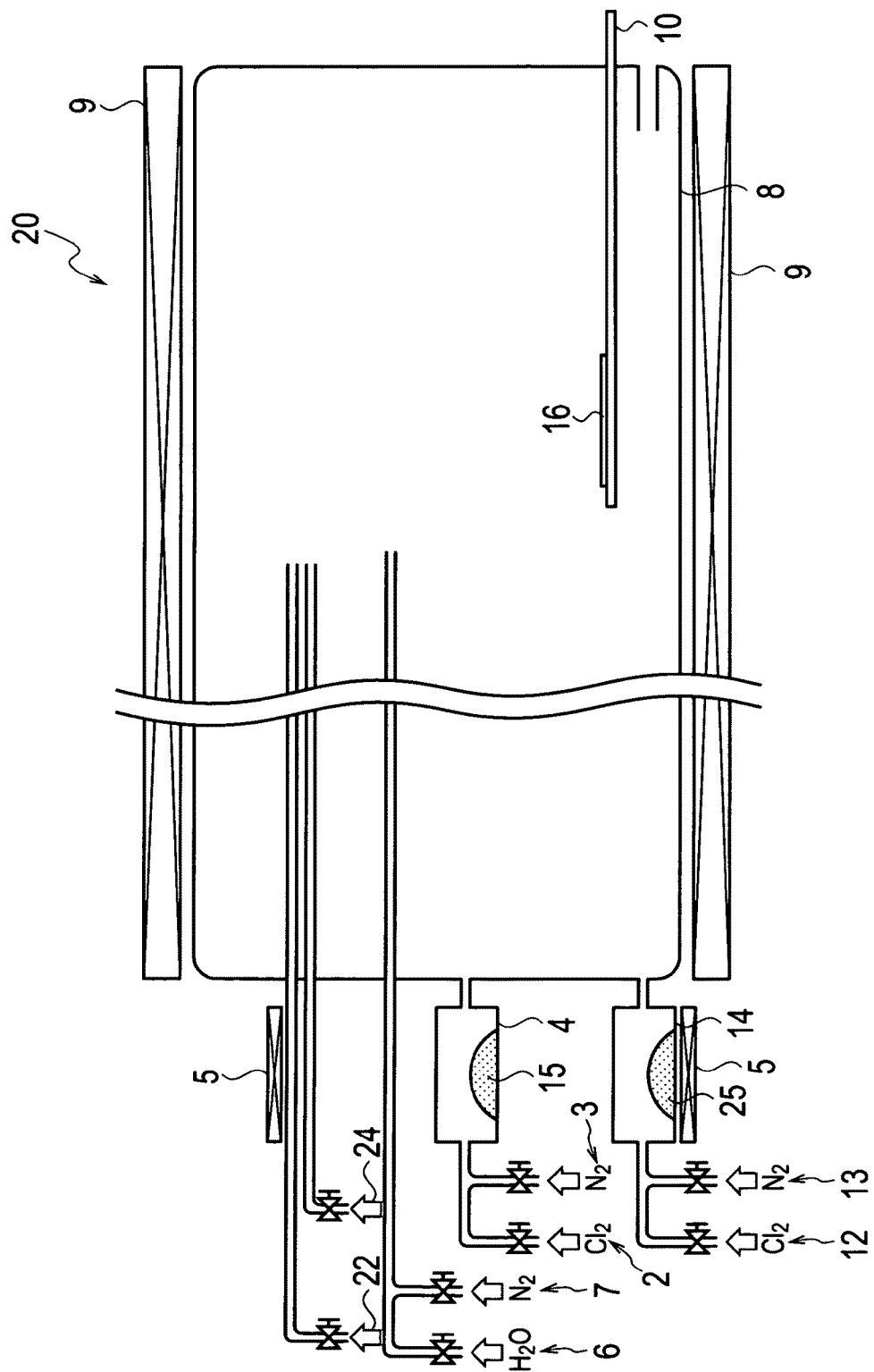
FIG. 13 is a schematic diagram of an epitaxial crystal growth apparatus applying to the hetero epitaxial growth method according to the first embodiment of the present invention.

As shown in FIG. 13, a schematic configuration of an epitaxial crystal growth apparatus 20 applying to the hetero epitaxial growth method according to the first embodiment includes a gaseous chlorine supplying unit 2, a carrier gas supplying unit 3, a source zone 4, an heating unit 5, a water supplying unit 6, a carrier gas supplying unit 7, a growth zone 8, an heating unit 9, and a substrate holding unit 10.

A configuration for applying to the hetero epitaxial growth method of a MgZnO semiconductor (ZnO based semiconductor) is also disposed in the epitaxial crystal growth apparatus 20 applying to the hetero epitaxial growth method. That is, as shown in FIG. 13, the epitaxial crystal growth apparatus 20 includes a gaseous chlorine supplying unit 12, a carrier gas supplying unit 13, and a source zone 14 by which group II metallic material 25 including the single metal substance of magnesium is held.

In the hetero epitaxial growth method of the ZnO based semiconductor (ZnO, MgZnO), the apparatus configuration for performing impurity doping of a n type impurity or a p type impurity is also disposed on the epitaxial crystal growth apparatus 20. That is, as shown in FIG. 13, the epitaxial crystal growth apparatus 20 includes a first doping gas supplying unit 22 for supplying a n type doping gas for performing impurity doping of the n type impurity, and a second doping gas supplying unit 24 for supplying a p type doping gas for performing impurity doping of the p type impurity.

The source zone 4 is for holding a group II metallic material 15 consisting of a zinc single metal substance. Moreover, the source zone 4 is a zone for generating zinc chloride gas by reacting the gaseous chlorine, which are supplied from the gaseous chlorine supplying unit 2, and zinc. A source zone 14 is for holding magnesium of single substance instead of the zinc held by the source zone 4.

The growth zone 8 is a zone for growing up the ZnO semiconductor on a growth substrate 16 held on a substrate holding unit 10 by reacting the zinc chloride gas supplied from the source zone 4 connected by a supplying pipe, and the water (vapor) supplied from the water supplying unit 6 as an oxygen material.

In addition, each supplying pipe for connecting the source zone 4, the growth zone 8 and each gas supplying unit, and the growth zone 8 is composed by quartz glass.

The heating unit 5 is for heating the source zones 4 and 14 and the supply route of water. The heating unit 9 is for annealing the growth zone 8. The hetero epitaxial crystal growth apparatus 20 achieves a hot wall method by the heating units 5 and 9. In addition, the heating unit 5 is not limited to the illustrated configuration. For example, it is effective also as a configuration in which a heating unit 5a heats the source zone 14, a heating unit 5b anneals the source zone 4, a heating unit 5c heats the quartz tube of water supplying unit 6 and the carrier gas supplying unit 7, and a heating unit 5d heats the quartz tube of n type doping gas supplying unit 22 and a p type doping gas supplying unit 24, by using the heating units 5a, 5b, 5c, and 5d which are not illustrated.

The nitrogen gas supplied from the carrier gas supplying units 3, 7, and 13 is for carrying the zinc chloride gas generated by the source zone 4, the water supplied from the water supplying unit 6, and the magnesium chloride gas generated by the source zone 14 to the growth zone 8.

Next, a fabrication method of the ZnO semiconductor by the epitaxial crystal growth apparatus 20 mentioned above will be explained.

First of all, the gaseous chlorine and the nitrogen gas are carried to the source zone 4, respectively from the gaseous chlorine supplying unit 2 and the carrier gas supplying unit 3. Then, in the source zone 4, the reaction by the following reaction formula (1) occurs by the group II metallic material 15 consisting of the single metal substance of the zinc currently held, and the supplied gaseous chlorine, and the zinc chloride gas is generated.

$$Zn(s,l)+Cl_2(g)<=>ZnCl_2(g) \quad (1)$$

In this case, as for the single metal substance of the zinc held at the source zone 4, it is preferred that it is a single metal substance with high purity, for example, not less than 99.99999% of its single metal substance is effective. In addition, (s), (l), and (g) in the reaction formula show a solid, a fluid, and gas, respectively.

The source zone 4 becomes the structure which enlarges surface area of the group II metallic material 15 consisting of the zinc single metal substance and a suitable temperature so that most reactions in the reaction formula (1) are advanced to the right-hand side, and the flow rate of zinc chloride gas can be controlled by the amount of supply of gaseous chlorine. As such the suitable temperature, about 300 degrees C. to about 450 degrees C. are preferable. Moreover, the temperature of the source zone 4 is set as not more than about 500 degrees C., in order to suppress that the zinc gas with extremely high vapor pressure also in metal is carried to the growth zone 8. Then, the zinc chloride gas generated by the above-mentioned reaction formula (1) is carried to the growth zone 8 by the nitrogen gas supplied from the carrier gas supplying unit 3.

Moreover, the water (vapor) supplied from the water supplying unit 6 is carried to the growth zone 8 as an oxygen material through other paths by the nitrogen gas supplied from the carrier gas supplying unit 7.

Then, in the growth zone 8, the thin film of the ZnO semiconductor grows on the growth substrate 16 with the zinc chloride gas and water which are carried when the reaction of the following reaction formula (2) proceeds to the right-hand side.

$$ZnCl_2(g)+H_2O(g)<=>ZnO(s)+2HCl(g) \quad (2)$$

In this case, the temperature of the growth zone 8 is set as high temperature rather than the temperature of the source zone 4 so that the zinc chloride gas may not deposit in the intermediate path to the growth zone 8. More specifically, the temperature of the growth zone 8 is set as about 500 degrees C. to about 1100 degrees C.

In the fabrication method of the MgZnO semiconductor according to the epitaxial crystal growth apparatus 20, the gaseous chlorine is carried to the source zone 14 with carrier gas, and the magnesium chloride gas is generated in the source zone 14. Then, the MgZnO semiconductor can be grown up on the growth substrate 16 by carrying the magnesium chloride gas to the growth zone 8 by the nitrogen gas supplied from the carrier gas supplying unit 13, and reacting the zinc chloride gas, the magnesium chloride gas and the water in the growth zone 8.

In the hetero epitaxial growth method of the ZnO based semiconductor (ZnO, MgZnO), it can perform impurity doping of a desired n type impurity or p type impurity toward the growth layer by using the n type doping gas supplying unit 22 and the p type doping gas supplying unit 24.

As mentioned above, in the epitaxial crystal growth apparatus 20 according to the first embodiment, since the single metal substance of the zinc with high purity instead of zinc chloride is adopted as the group II metallic material 15, the ZnO based semiconductor of high quality can be fabricated easily.

Moreover, it can suppress that the zinc chloride gas generated by the source zone 4 deposits during being carried to the growth zone 8 by setting the temperature of the source zone 4 lower than the growth temperature of the growth zone 8.

Moreover, since not the gaseous chlorine but the hydrochloric acid gas is generated in the growth zone 8 by adopting not the single oxygen substance but the water as an oxygen material, the reaction formula (2) can be proceeded to the right-hand side in the state where it is more stabilized thermodynamically.

For example, the single metal substance of cadmium may be adopted instead of the single metal substance of magnesium, as the group II metallic material.

Moreover, oxygen gas may be adopted instead of the water as the oxygen material.

Moreover, bromine gas may be adopted instead of the gaseous chlorine as the halogen gas.

Moreover, the kind of group II metallic material may not be limited to two kinds, and it may use more than three kinds of group II metallic materials.

(Formation Method for ZnO Template)

As a formation method for a ZnO template, the VPE method for merely reacting steam of Zn with vapor will be explained hereinafter. In addition, in the formation method, not less than 400 degrees C. of the growth temperature is preferable, for example, and the more growth temperature becomes high temperature, the more it can reflect the performance of an underlying crystal substrate in the ZnO template satisfactory.

The configuration shown in FIG. 13 can be used for the crystal growth apparatus 20 also about the VPE method for merely reacting steam of Zn with the vapor, as the formation method for the ZnO template.

Figure 14A:
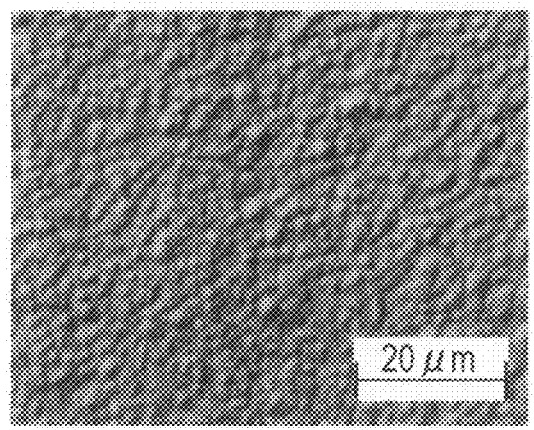
FIG. 14A shows an optical microscope photograph of the surface of a ZnO buffer layer formed by reacting a zinc metal to water, in the hetero epitaxial growth method according to the first embodiment of the present invention.
Figure 14B:
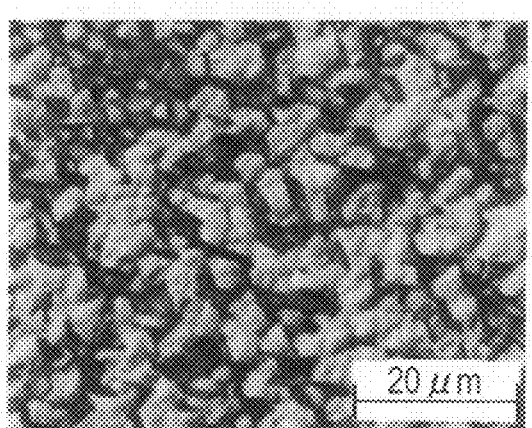
FIG. 14B shows an optical microscope photograph of the surface of a ZnO buffer layer formed by reacting zinc chloride to water, in the hetero epitaxial growth method according to the first embodiment of the present invention.

In the hetero epitaxial growth method according to the first embodiment, an optical microscope photograph of the ZnO buffer layer surface formed by reacting the zinc metal to the water is expressed as shown in FIG. 14A, and an optical microscope photograph of the ZnO buffer layer surface formed by reacting the zinc chloride to the water is expressed as shown in FIG. 14B. In FIG. 14, the growth temperature is about 400 degrees C., and the growth period is about 60 minutes. The partial pressure $P_{H_2O}$ of $H_2O$ is $2.2 \times 10^{-2}$ atm in FIG. 14A, and the partial pressure $P_{H_2O}$ of $H_2O$ is $1.32 \times 10^{-2}$ atm in FIG. 14B. As clearly from FIG. 14B, although about 0.93 μm in thickness is obtained in the result of the optical microscope photograph of the ZnO buffer layer surface formed by reacting zinc chloride with water, non-homogeneous nucleation is observed. On the other hand, although about 0.28 μm in thickness is obtained in the result of the optical microscope photograph of the ZnO buffer layer surface formed by reacting zinc metal with water, growth of continuous membrane is observed.

In the hetero epitaxial growth method according to the first embodiment, the method for growing up the thin film of the ZnO semiconductor on the growth substrate 16 by the HVPE method after forming the ZnO buffer layer formed by reacting zinc metal with water is expressed as follows.

(a) First of all, nitrogen gas is carried to the source zone 4 from the carrier gas supplying unit 3, as Step 1. Then, in the source zone 4, the group II metallic material 15 consisting of the single metal substance of the zinc currently held is evaporated, and is introduced in the growth zone 8. On the other hand, the evaporated zinc reacts with the vapor introduced in the growth zone 8 from the water supplying unit 6, and then the thin film of the ZnO semiconductor grows on the growth substrate 16 according to the reaction according to the following formula (3). In this case, the crystal growth temperature of the ZnO buffer layer 42 is not less than about 400 degrees C., for example, and the thickness is not more than about 0.3 micrometer, for example.

$$Zn(g) + H_2O(g) \Longleftrightarrow ZnO(s) + H_2(g) \quad (3)$$

(b) Next, it anneals with the nitrogen gas in the atmosphere of the vapor $H_2O(g)$, as Step 2. The annealing temperature is about 1000 degrees C., for example. By annealing in the manner, the crystallinity and the surface flatness of the ZnO buffer layer 42 can be improved.

(c) Next, as Step 3, the gaseous chlorine is carried to the source zone 4 from the gaseous chlorine supplying unit 2, and the nitrogen gas is simultaneously carried to the source zone 4 from the carrier gas supplying unit 3. Then, in the source zone 4, the reaction according to the reaction formula (1) occurs by the group II metallic material 15 consisting of the single metal substance of the zinc currently held, and the supplied gaseous chlorine, and the zinc chloride gas is generated. Then, the zinc chloride gas generated according to the reaction formula (1) is carried to the growth zone 8 by the nitrogen gas supplied from the carrier gas supplying unit 3. Moreover, the water (vapor) supplied from the water supplying unit 6 is carried to the growth zone 8 as an oxygen material through other paths by the nitrogen gas supplied from the carrier gas supplying unit 7. Then, in the growth zone 8, the thin film of the ZnO semiconductor grows on the growth substrate 16 with the zinc chloride gas and the water which are carried, when the reaction of the reaction formula (2) proceeds to the right-hand side. Here, the crystal growth temperature is about 1000 degrees C., for example.

Figure 15A:
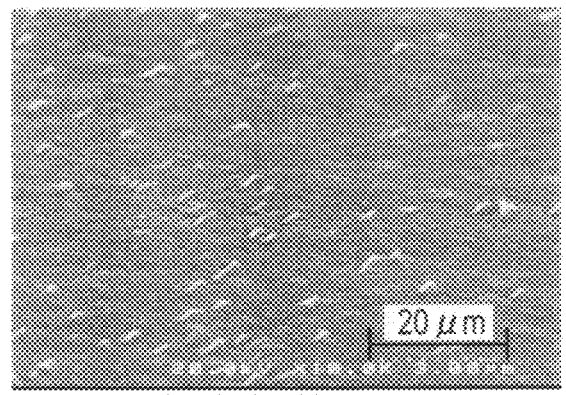
FIG. 15A shows a bird's-eye view SEM photograph of the surface of the ZnO buffer layer which formed by reacting the zinc metal to the water, in the hetero epitaxial growth method according to the first embodiment of the present invention (Step 1).
Figure 15B:
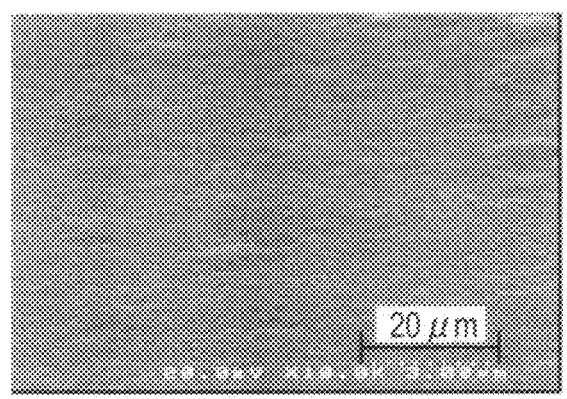
FIG. 15B shows a bird's-eye view SEM photograph of the surface of the ZnO buffer layer annealed with nitrogen gas in a steam atmosphere, in the hetero epitaxial growth method related to the first embodiment of the present invention (Step 2).
Figure 15C:
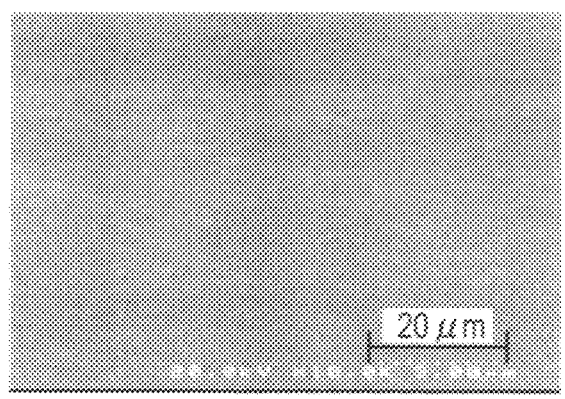
FIG. 15C shows a bird's-eye view SEM photograph of the surface of the ZnO layer formed by reacting the zinc chloride and the water continuously, in the hetero epitaxial growth method according to the first embodiment of the present invention (Step 3).

In the hetero epitaxial growth method according to the first embodiment, a SEM photograph of the ZnO buffer layer surface formed by reacting zinc metal with water (Step 1) is expressed as shown, for example in FIG. 15A, a SEM photograph of the ZnO buffer layer surface annealed with the nitrogen gas in the steam atmosphere (Step 2) is expressed as shown, for example in FIG. 15(b), and a SEM photograph on the surface of the ZnO layer formed by reacting zinc chloride with water (Step 3) is expressed as shown, for example in FIG. 15C.

In FIG. 15A, the growth temperature is about 400 degrees C., the growth period is about 60 minutes, and the partial pressure $P_{H_2O}$ of $H_2O$ is about $2.2 \times 10^{-2}$ atm.

In FIG. 15B, the annealing temperature is about 1000 degrees C., the heat treating time is about 60 minutes, and the partial pressure $P_{H_2O}$ of $H_2O$ is about $4.4 \times 10^{-3}$ atm.

In FIG. 15C, the growth temperature is about 1000 degrees C., the growth period is about 60 minutes, the partial pressure $P_{H_2O}$ of $H_2O$ is about $4.4 \times 10^{-4}$ atm, and the VI/II ratio is about 20. As shown in FIG. 15A to FIG. 15C, an aspect that the crystallinity becomes satisfactory is observed in accordance with Steps 1-3.

Figure 16:
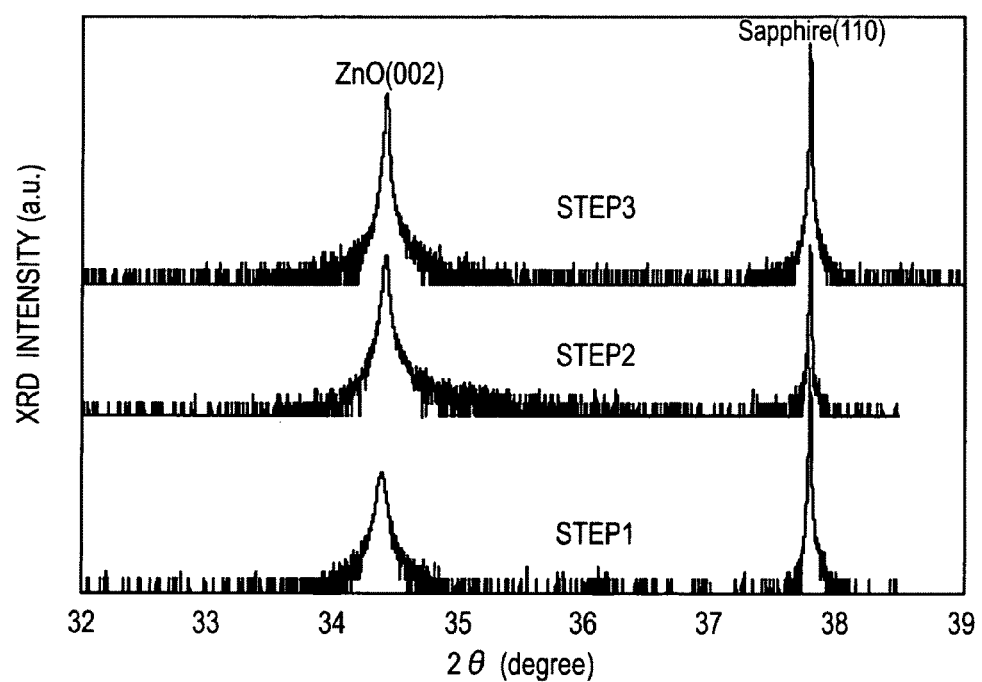
FIG. 16 shows an example of a result of a measurement of the X-ray diffraction measurement (2 theta-omega method) for explaining an orientation of a crystal of the ZnO layer corresponding to each step of FIG. 15, in the hetero epitaxial growth method according to the first embodiment of the present invention.

In the hetero epitaxial growth method related to the first embodiment, an example of a result of a measurement of a X-ray diffraction measurement (2 theta-omega method) for explaining the orientation of the ZnO crystal corresponding to each step of FIG. 15 is expressed as shown in FIG. 16. In FIG. 16, a vertical axis expresses XRD intensity (a.u.), and a horizontal axis expresses 2θ. It is observed that the ZnO (002) plane orients toward the a-plane sapphire substrate, and the peak intensity of ZnO (002) increases and the orientation of the crystal is improving in accordance with shifting to Step 1 to Step 3.

Figure 17A:
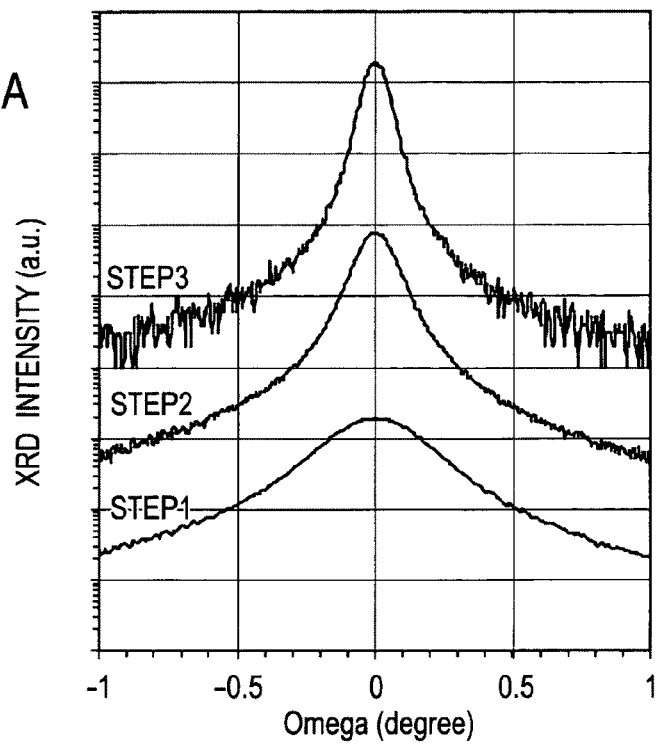
FIG. 17A shows the X-ray rocking curve for explaining the crystallinity of the ZnO layer corresponding to each step of FIG. 15 (example of ZnO (002) plane), in the hetero epitaxial growth method according to the first embodiment of the present invention.
Figure 17B:
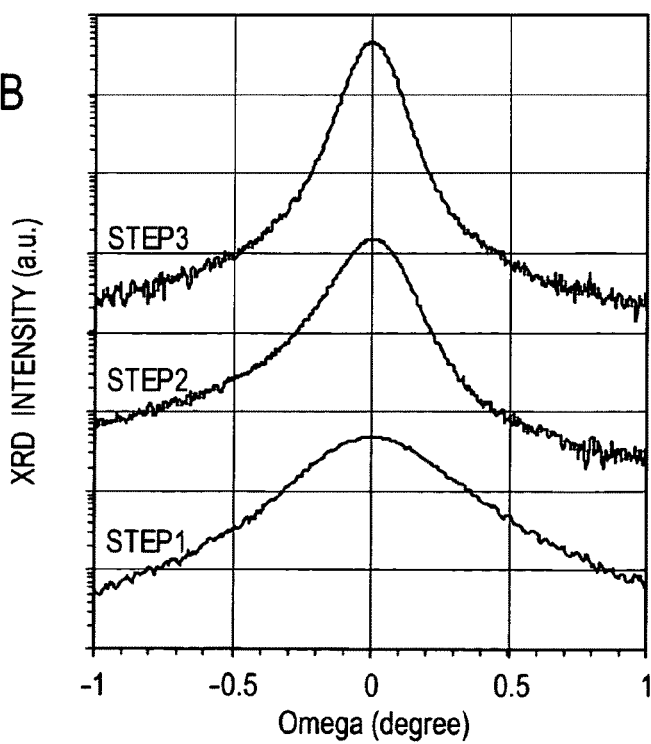
FIG. 17B shows the X-ray rocking curve for explaining the crystallinity of the ZnO layer corresponding to each step of FIG. 15 (example of ZnO (101) plane), in the hetero epitaxial growth method according to the first embodiment of the present invention.

In the hetero epitaxial growth method according to the first embodiment, a X-ray rocking curve (example of the ZnO (002) plane) for explaining the crystallinity of the ZnO crystal corresponding to each step of FIG. 15 is expressed as shown, for example in FIG. 17A, and a X-ray rocking curve (example of the ZnO (101) plane) for explaining the crystallinity of the ZnO buffer layer corresponding to each step of FIG. 15 is expressed as shown, for example in FIG. 17B.

As clearly from FIG. 17A, the value of full width at half maximum FWHM (arcsec) of the rocking curve of the (002) plane of ZnO is about 1209 (arcsec) at Step 1, is about 460 (arcsec) at Step 2, and is about 327 (arcsec) at Step 3. Moreover, as clearly from FIG. 17B, the value of full width at half maximum FWHM (arcsec) of the rocking curve of the (101) plane of ZnO is about 1458 (arcsec) at Step 1, is about 702 (arcsec) at Step 2, and is about 493 (arcsec) at Step 3. As clear from FIG. 17A and FIG. 17B, it proves that the twist profile and the tilt profile of the ZnO layer oriented to (002) decrease, and the crystallinity is improving, since the full width at half maximum of the rocking curve of the (002) plane and (101) plane decreases in accordance with shifting to Step 1 to Step 3.

(Thickness Dependency of Buffer Layer)

Figure 18:
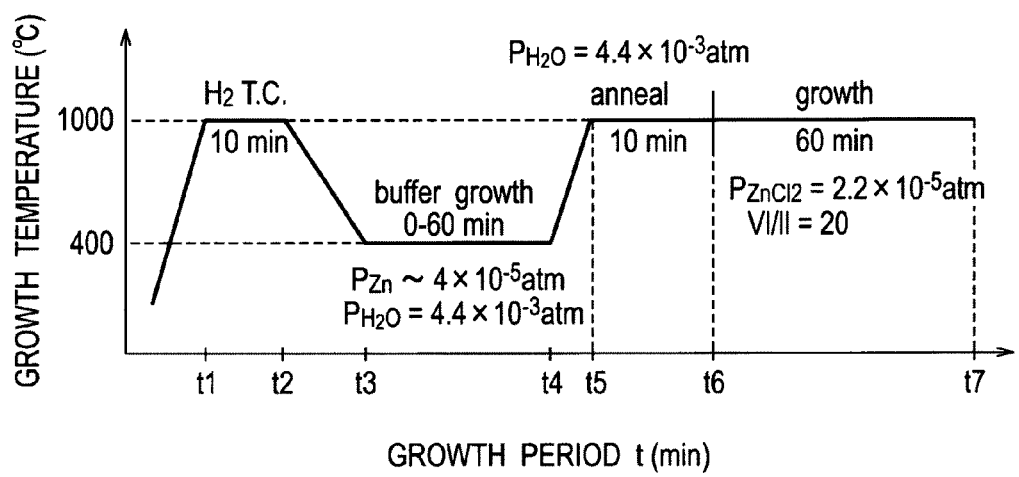
FIG. 18 is a drawing showing the relation between the growth temperature and growth period in order to investigate the thickness dependency of a buffer layer, in the hetero epitaxial growth method according to the first embodiment of the present invention.

In the hetero epitaxial growth method according to the first embodiment, the relation between the crystal growth temperature and the growth period is expressed as shown in FIG. 18. The case where the growth period of the buffer layer is 0 (minute) is correspond to the case where there is no buffer layer.

(a) In FIG. 18, first of all, the a-plane sapphire substrate surface is cleaned by performing thermal cleaning (T. C.) in $H_2$ at high temperature of 1000 degrees C., in the time t1 to t2.

(b) Next, the carrier gas is switched to $N_2$ and the buffer layer is grown up, in the time t3 to t4, as Step 1. In order to investigate the thickness dependency of the buffer layer, the crystal growth period of the buffer layer is changed to 0 (minute) to 60 (minutes). The growth temperature of the buffer layer is about 400 degrees C., the partial pressure $P_{Zn}$ of Zn(g) is about $4\times10^{-5}$ atm, and the partial pressure $PH_2O$ of $H_2O$ is about $4.4\times10^{-3}$ atm.

(c) Next, the annealing treatment is performed, as Step 2, in the time t5 to t6. The annealing temperature in this case is about 1000 degrees C., the annealing time is about 10 (minutes), and the partial pressure $PH_2O$ of $H_2O$ is about $4.4\times10^{-3}$ atm.

(d) Next, the crystal growth of the ZnO layer is performed by the HVPE method, as Step 3, in the time t6 to t7. The crystal growth temperature in this case is about 1000 degrees C., the crystal growth period is about 60 (minutes), the supplied partial pressure $P_{ZnCl2}$ of $ZnCl_2$ is about $2.2\times10^{-5}$ atm, and the VI/II ratio is about 20.

Figures 19A, 19B, 19C, 19D, 19E, 19F, 19G, 19H:
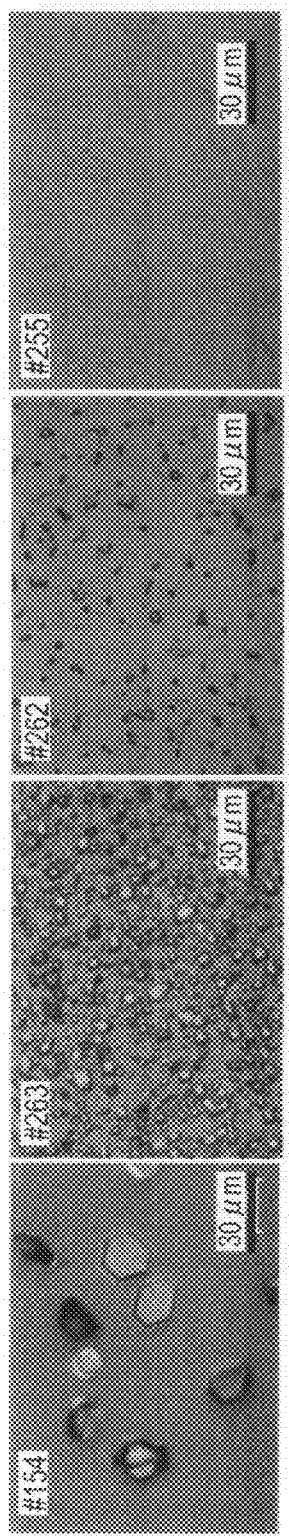
FIG. 19A shows an optical microscope photograph in the case of setting the growth period of the buffer layer to 0 minute, in the hetero epitaxial growth method according to the first embodiment of the present invention.
FIG. 19B shows a bird's-eye view SEM photograph corresponding to FIG. 19A.
FIG. 19C shows an optical microscope photograph in the case of setting the growth period of the buffer layer to 10 minutes, in the hetero epitaxial growth method according to the first embodiment of the present invention.
FIG. 19D shows a bird's-eye view SEM photograph corresponding to FIG. 19C.
FIG. 19E shows an optical microscope photograph in the case of setting the growth period of the buffer layer to 30 minutes, in the hetero epitaxial growth method according to the first embodiment of the present invention.
FIG. 19F shows a bird's-eye view SEM photograph corresponding to FIG. 19E.
FIG. 19G shows an optical microscope photograph in the case of setting the growth period of the buffer layer to 60 minutes, in the hetero epitaxial growth method according to the first embodiment of the present invention.
FIG. 19H shows a bird's-eye view SEM photograph corresponding to FIG. 19G.

A result obtained by the growing condition shown in FIG. 18 is expressed as shown in FIG. 19. FIG. 19A shows an optical microscope photograph of the ZnO crystal surface in the case of setting the growth period of the buffer layer to 0 (minute), and FIG. 19B shows a bird's-eye view SEM photograph corresponding to FIG. 19A. FIG. 19C shows an optical microscope photograph of the ZnO crystal surface in the case of setting the growth period t3 to t4 of the buffer layer to 10 (minutes), and FIG. 19D shows a bird's-eye view SEM photograph corresponding to FIG. 19C.

FIG. 19E shows an optical microscope photograph of the ZnO crystal surface in the case of setting the growth period t3 to t4 of the buffer layer to 30 (minutes), and FIG. 19F shows a bird's-eye view SEM photograph corresponding to FIG. 19E.

FIG. 19G shows an optical microscope photograph of the ZnO crystal surface in the case of setting the growth period t3 to t4 of the buffer layer to 60 (minutes), and FIG. 19H shows a bird's-eye view SEM photograph corresponding to FIG. 19G.

As a result of investigating the state of the crystal surface of the ZnO layer which grows by the HVPE method on the buffer layer by changing the thick film (growth period) of the buffer layer formed by low-temperature growth of about 400 degrees C., as clearly from FIG. 19A to FIG. 19H, the state of the crystal surface of the ZnO layer is as satisfactory as the film thickness of the buffer layer being thick (growth period being long). It is considered because the two-dimensional growth of the ZnO layer by the HVPE method is as accelerated as the film thickness of the buffer layer being thick (growth period being long).

Figure 20A:
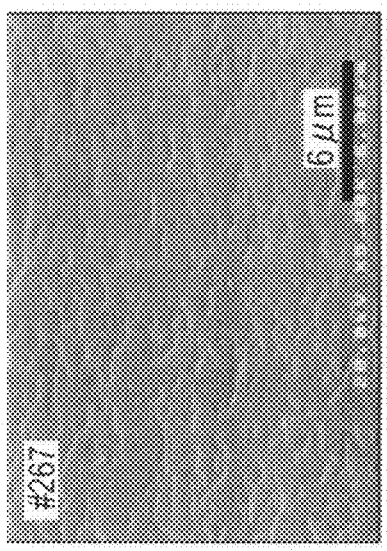
FIG. 20A shows a bird's-eye view SEM photograph in the case of setting growth period of the buffer layer to 20 minutes and setting growth period of the ZnO layer to 20 minutes, on an a-plane sapphire substrate, in the hetero epitaxial growth method according to the first embodiment of the present invention.
Figure 20B:
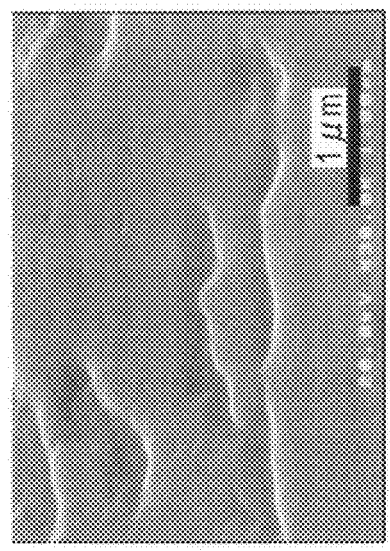
FIG. 20B shows a bird's-eye view SEM photograph at a high magnifiction corresponding to FIG. 20A.
Figure 20C:
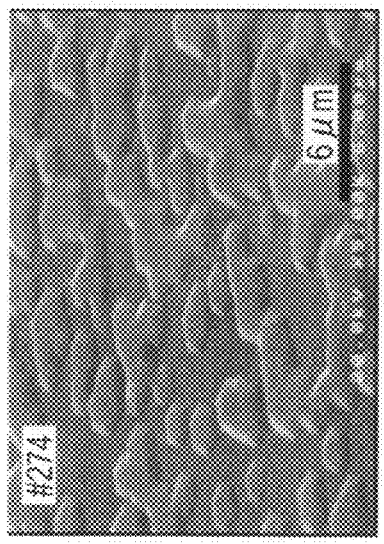
FIG. 20C shows a bird's-eye view SEM photograph in the case of setting growth period of the buffer layer to 60 minutes and setting growth period of the ZnO layer to 20 minutes, on the a-plane sapphire substrate, in the hetero epitaxial growth method according to the first embodiment of the present invention.
Figure 20D:
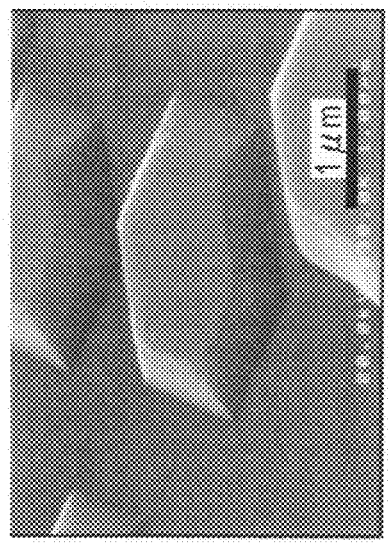
FIG. 20D shows a expansion bird's-eye view SEM photograph at a high magnifiction corresponding to FIG. 20C.

A SEM photograph of the crystal surface of the ZnO layer in the case of setting the growth period of the buffer layer on the a-plane sapphire substrate to 20 minutes and setting the growth period of the ZnO layer to 20 minutes is expressed as shown in FIG. 20A, and an expansion bird's-eye view SEM photograph corresponding to FIG. 20A is expressed as shown in FIG. 20B. Moreover, a SEM photograph of the crystal surface of the ZnO layer in the case of setting the growth period of the buffer layer on the a-plane sapphire substrate to 60 minutes and setting the growth period of the ZnO layer to 20 minutes is expressed as shown in FIG. 20C, and an expansion bird's-eye view SEM photograph corresponding to FIG. 20C is expressed as shown in FIG. 20D.

As clearly from FIG. 20A to FIG. 20D, a growth mode, by which a hexagon-shaped growth nucleus is generated on the crystal surface of the ZnO layer formed on the buffer layer formed at low temperature, the growth nucleus of the shape of the hexagon combines with each other, and flattening is performed, is achieved. Moreover, the lateral growth of the ZnO layer formed by the HVPE method on the buffer layer is as accelerated as the thickness of the buffer layer formed at low temperature being thick.

(X-ray Diffraction Measurement (2 Theta-Omega Method))

Figure 21:
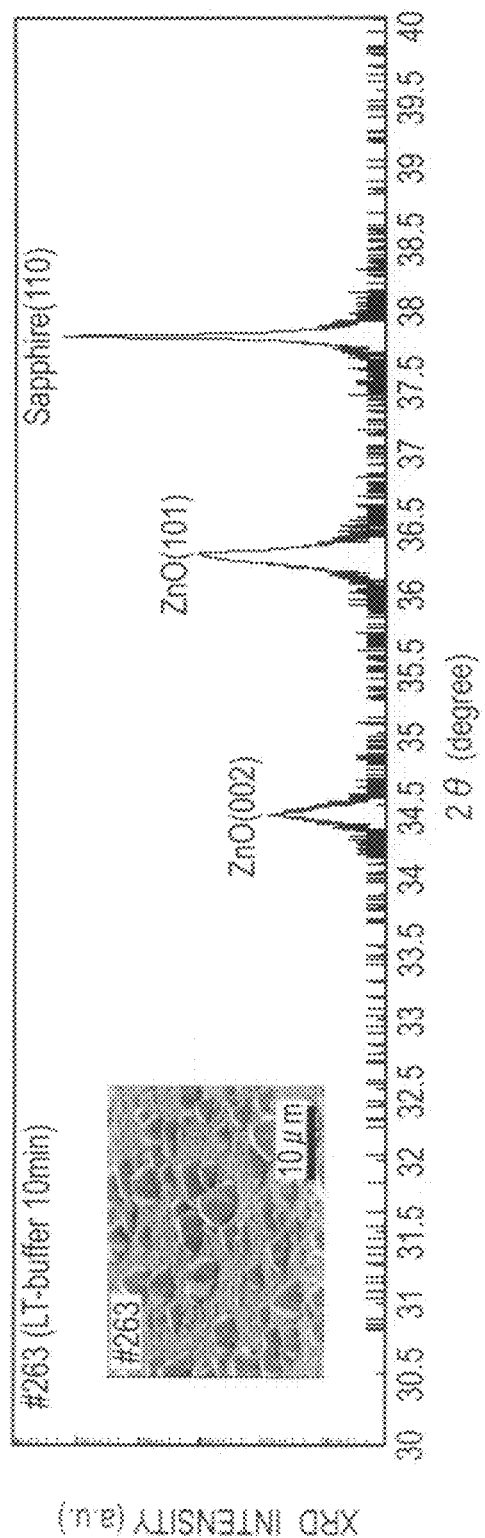
FIG. 21 is an example of the result of a measurement of the X-ray diffraction measurement (2 theta-omega method) after performing crystal growth of the ZnO layer by the HVPE method during 60 minutes after performing formation of the buffer layer during 10 minutes, on the a-plane sapphire substrate, in the hetero epitaxial growth method according to the first embodiment of the present invention.

In the hetero epitaxial growth method according to the first embodiment, a result of a measurement of X-ray diffraction measurement (2 theta-omega method) of the crystal of the ZnO layer after performing the crystal growth of the ZnO layer by the HVPE method for 60 minutes after formation of the buffer layer on the a-plane sapphire substrate for 10 minutes is expressed as shown, for example in FIG. 21. Similarly, a X-ray diffraction result of a measurement after performing the crystal growth of the ZnO layer by the HVPE method for 60 minutes after the formation of the buffer layer for 30 minutes is expressed as shown, for example in FIG. 22. Furthermore, a X-ray diffraction result of a measurement after performing the crystal growth of the ZnO layer by the HVPE method for 60 minutes after the formation of the buffer layer for 60 minutes is expressed as shown, for example in FIG. 23. The result of FIG. 21 corresponds to FIG. 19C and FIG. 19D, the result of FIG. 22 corresponds to FIG. 19E and FIG. 19F, and the result of FIG. 23 corresponds to FIG. 19G and FIG. 19H.

Figure 22:
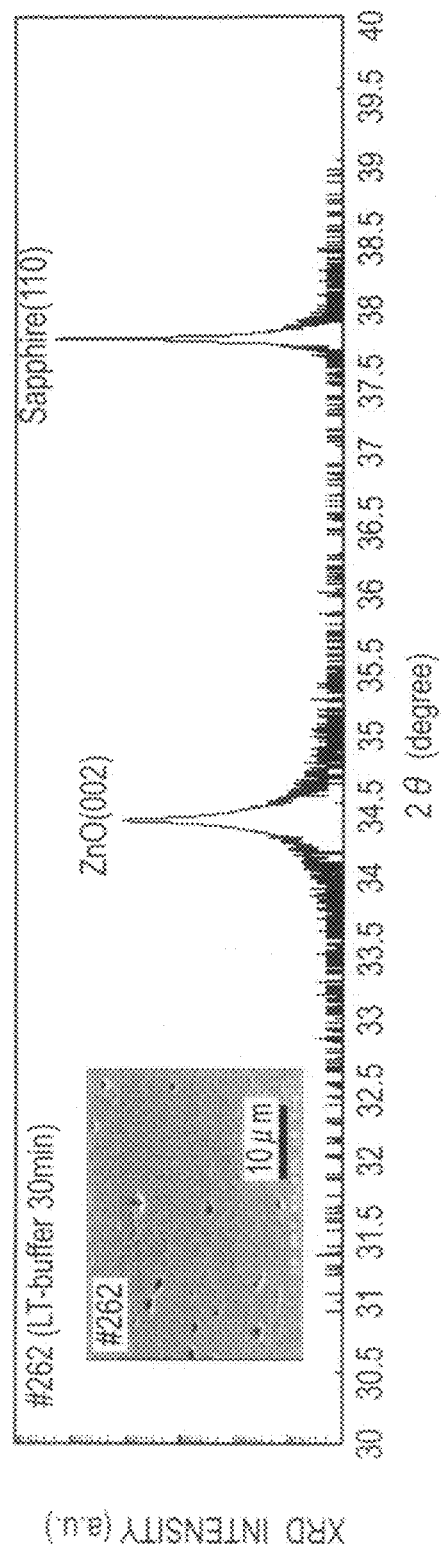
FIG. 22 is an example of the result of a measurement of the X-ray diffraction measurement (2 theta-omega method) after performing crystal growth of the ZnO layer by the HVPE method during 60 minutes after performing formation of the buffer layer during 30 minutes, on the a-plane sapphire substrate, in the hetero epitaxial growth method according to the first embodiment of the present invention.
Figure 23:
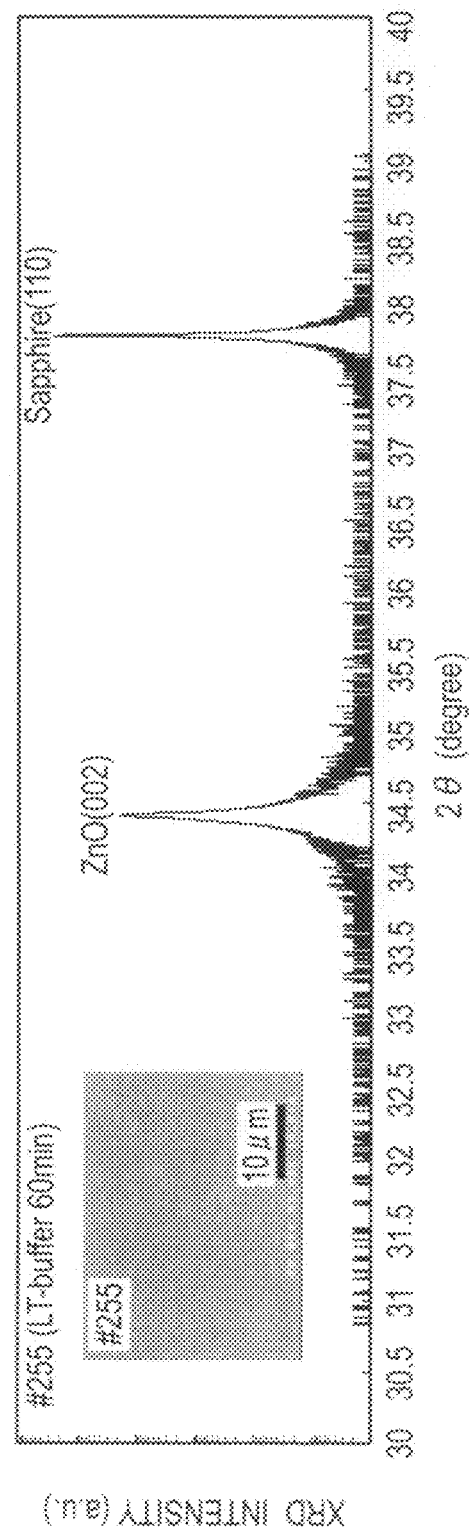
FIG. 23 is an example of the result of a measurement of the X-ray diffraction measurement (2 theta-omega method) after performing crystal growth of the ZnO layer by the HVPE method during 60 minutes after performing formation of the buffer layer during 60 minutes, on the a-plane sapphire substrate, in the hetero epitaxial growth method according to the first embodiment of the present invention.

As shown in FIG. 21, when the thickness of the buffer layer formed by low-temperature growth is thin, the orientation of the ZnO layer formed by the HVPE method on the buffer layer is not match, and ZnO (101) plane except a desired ZnO (002) plane are detected. On the other hand, as shown in FIG. 22 and FIG. 23, when the thickness of the buffer layer formed by low-temperature growth becomes thick, the orientation of the ZnO layer formed by the HVPE method on the buffer layer becomes satisfactory, and the desired ZnO (002) plane is detected.

(X-ray Rocking Curve)

Figure 24A:
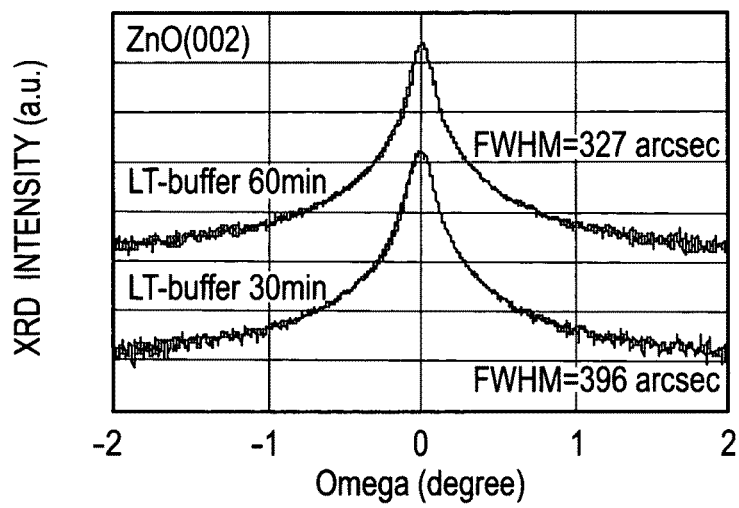
FIG. 24A shows an example of the X-ray rocking curve after performing crystal growth of the ZnO layer by the HVPE method during 60 minutes after performing formation of the buffer layer during 30 minutes and 60 minutes, respectively, on the a-plane sapphire substrate, in the hetero epitaxial growth method according to the first embodiment of the present invention (ZnO (002) plane).
Figure 24B:
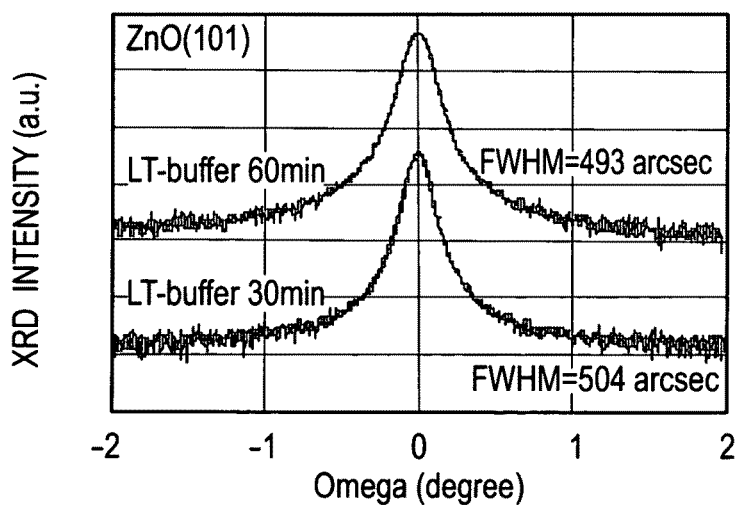
FIG. 24B shows an example of the X-ray rocking curve in the case of the ZnO (101) plane which grows the ZnO layer on the same conditions, in the hetero epitaxial growth method according to the first embodiment of the present invention.

In the hetero epitaxial growth method according to the first embodiment, examples of the X-ray rocking curve after performing the crystal growth of the ZnO layer (ZnO (002) plane) by the HVPE method on the buffer layer for 60 minutes after performing the formation of the buffer layer on the a-plane sapphire substrate for 30 minutes and 60 minutes, respectively, are expressed as shown in FIG. 24A in the (002) plane and expressed as shown in FIG. 24B in the (101) plane.

As clearly from FIG. 24A, the values of full width at half maximum FWHM (arcsec) of the rocking curve of the (002) plane of ZnO are 396 (arcsec) and 327 (arcsec), respectively, when the buffer layer is grown for 30 minutes and 60 minutes. Similarly, as clearly from FIG. 24B, the values of full width at half maximum FWHM (arcsec) of the rocking curve of the (101) plane of ZnO are 504 (arcsec) and 493 (arcsec), respectively, when the buffer layer is grown for 30 minutes and 60 minutes.

The full width at half maximum FWHM (arcsec) of the XRD rocking curve of the ZnO layer which became a film is as satisfactory as not more than 500 (arcsec) by accelerating two dimensional crystal growth as shown in FIG. 24A and FIG. 24B, and the reduction of the value of the full width at half maximum of the rocking curve can be expected with the further increase in the film growth thickness as well as FIG. 12.

(X-Ray Phi Scan)

Figure 25:
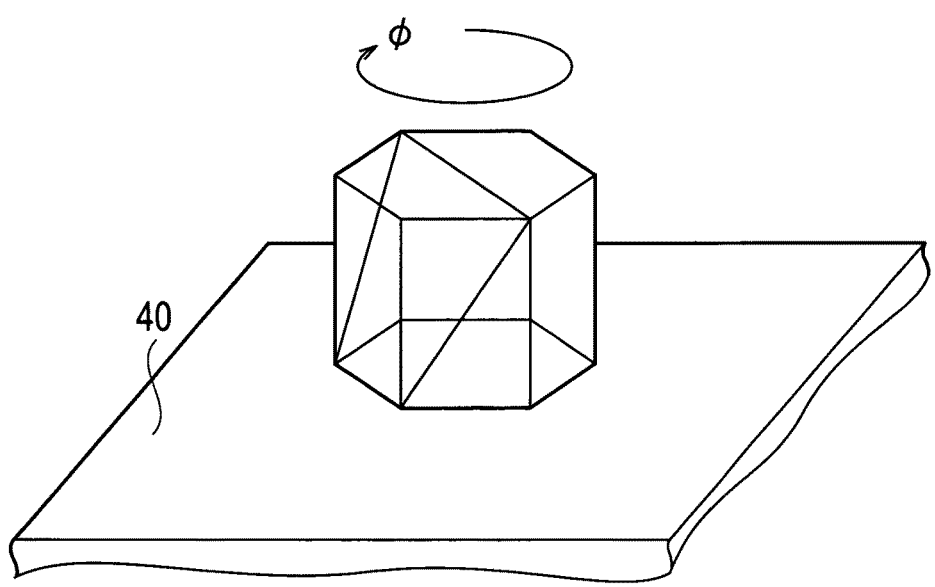
FIG. 25 is an explanatory diagram of a X-ray phi scan of the ZnO layer formed on the a-plane sapphire substrate, in the hetero epitaxial growth method according to the first embodiment of the present invention.
Figure 26:
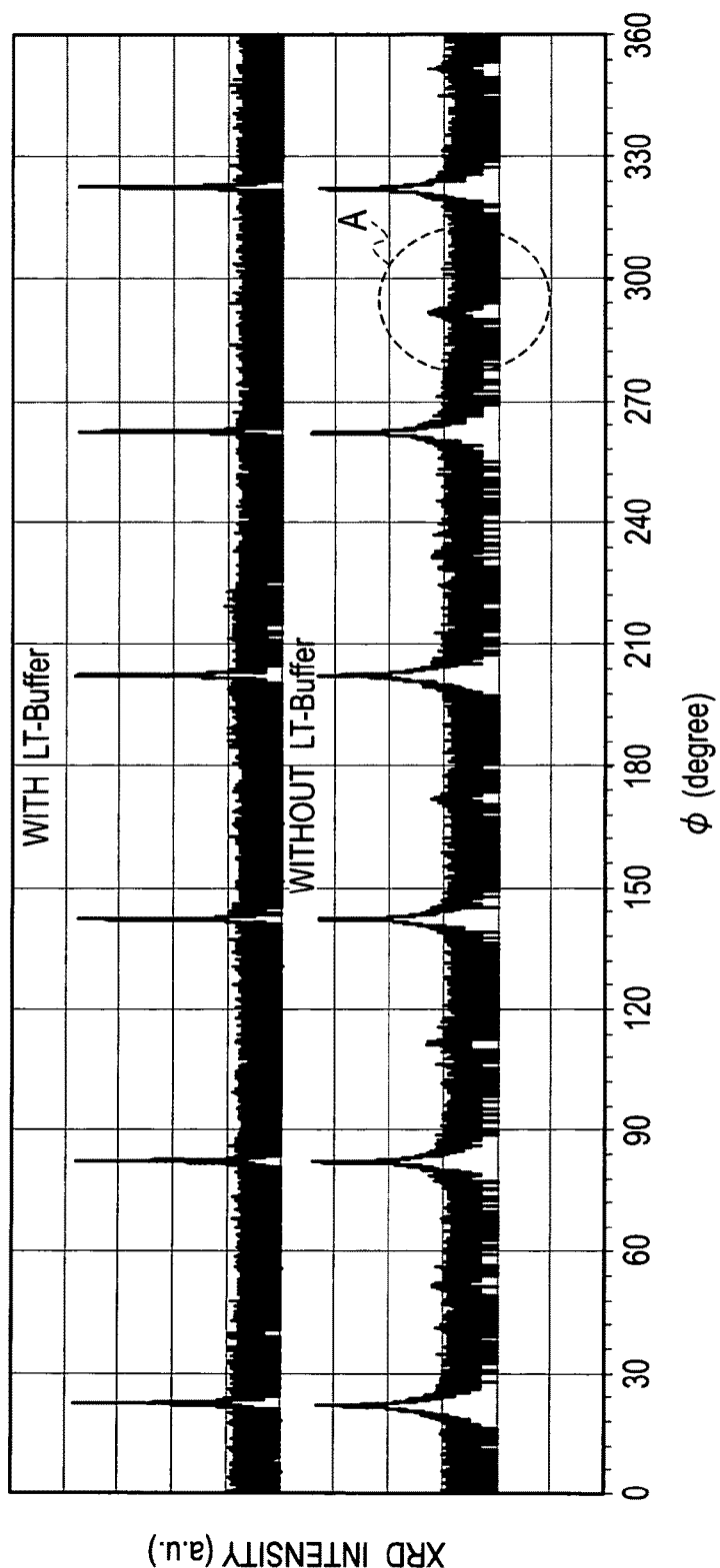
FIG. 26 shows a result of a measurement of the X-ray phi scan of the ZnO (101) plane based on the existence or nonexistence of the buffer layer formed on the a-plane sapphire substrate, in the hetero epitaxial growth method according to the first embodiment of the present invention.

In the hetero epitaxial growth method according to the first embodiment, a X-ray phi scan of the c-axis oriented ZnO layer formed on the a-plane sapphire substrate 40 is performed by setting incident X ray and a X-ray detector, and rotating centering on a c-axial direction, so that the ZnO (101) plane may be detected, as shown in FIG. 25. A result of a measurement of the X-ray phi scan of a ZnO layer 46 by the existence or nonexistence of a buffer layer 42 formed on an a-plane sapphire substrate 40 is expressed as shown in FIG. 26. When there is no buffer layer 42 (WITHOUT LT-Buffer), as the dashed line A in FIG. 26 other than a great peak symmetrical with 6 times shows, the crystalline nucleus in the case of rotating 30 degrees is observed, and the crystallinity of the direction of twist which is the direction of Φ is disordered. On the other hand, when there is the buffer layer 42 (WITH LT-Buffer), the hexagonal 6 times symmetry of ZnO layer 46 is observed exactly. Moreover, when there is the buffer layer 42, the crystalline nucleus in the case of rotating 30 degrees is not observed, but it is effective in matching crystallinity also in the direction of twist which is the direction of Φ.

(r-Plane Sapphire Substrate)

Figure 27A:
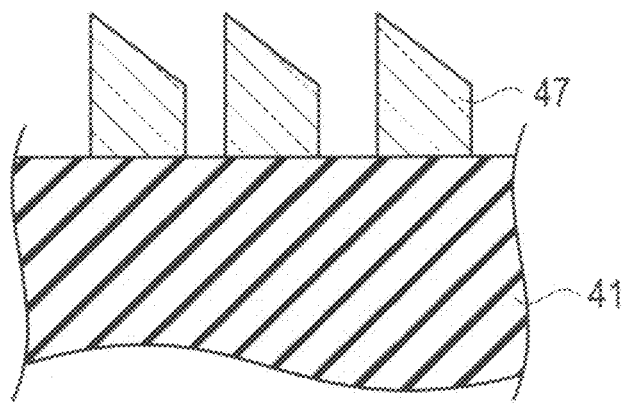
FIG. 27A is a schematic cross-sectional configuration diagram of the ZnO layer performed the crystal growth on a r-plane sapphire substrate without forming the buffer layer, in the hetero epitaxial growth method according to the first embodiment of the present invention.
Figure 27B:
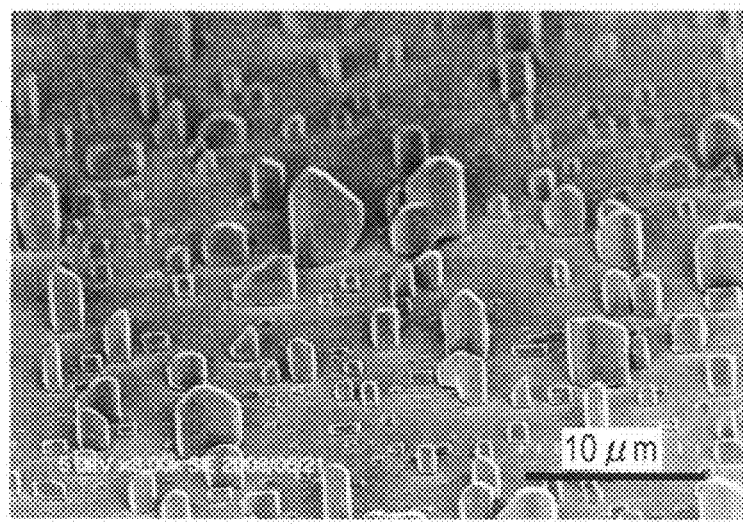
FIG. 27B shows a surface bird's-eye view SEM photograph after performing crystal growth of the ZnO layer by the HVPE method during 60 minutes on the r-plane sapphire substrate without forming the buffer layer, in the hetero epitaxial growth method according to the first embodiment of the present invention.

In the hetero epitaxial growth method according to the first embodiment, a schematic cross-section structure of ZnO layer 47 performed the crystal growth, without forming the buffer layer, on the r-plane sapphire substrate 41 is expressed as shown in FIG. 27A. Moreover, a surface bird's-eye view SEM photograph after performing the crystal growth of ZnO layer 47 by the HVPE method for 60 minutes, without forming the buffer layer, on the r-plane sapphire substrate 41 is expressed as shown in FIG. 27B. As shown in FIG. 27A and FIG. 27B, as for the shape of ZnO layer 47 performed the crystal growth, without forming a buffer layer, on the r-plane sapphire substrate 41, the hexagonal pillar crystal is observed.

Figure 28A:
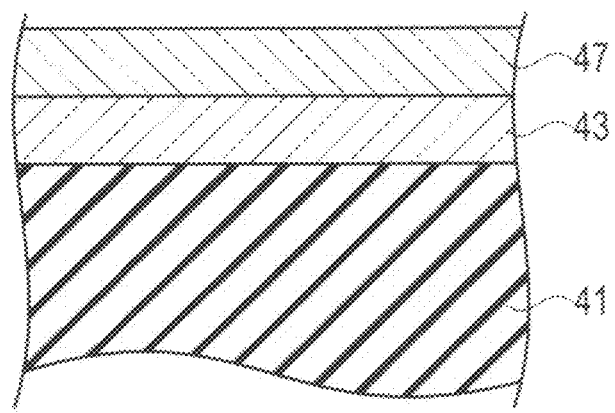
FIG. 28A is a schematic cross-sectional configuration diagram of the ZnO layer performed the crystal growth after forming the buffer layer on the r-plane sapphire substrate, in the hetero epitaxial growth method according to the first embodiment of the present invention.
Figure 28B:
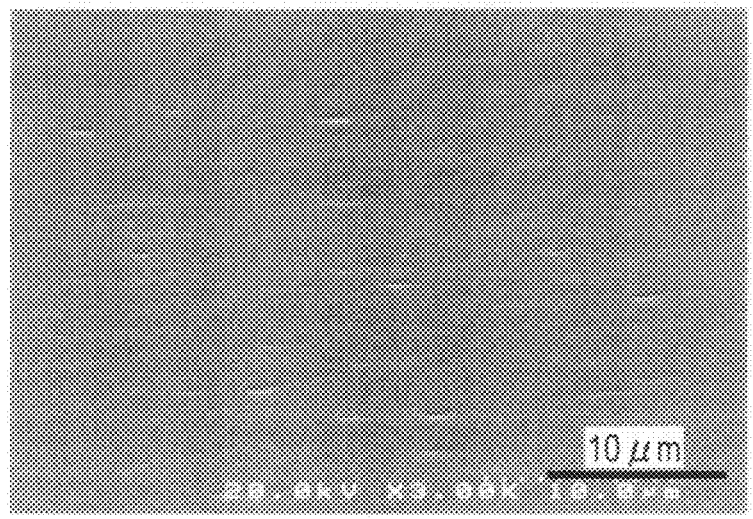
FIG. 28B shows a surface bird's-eye view SEM photograph after performing the crystal growth of the ZnO layer by the HVPE method during 60 minutes after forming the buffer layer on the r-plane sapphire substrate, in the hetero epitaxial growth method according to the first embodiment of the present invention.

On the other hand, in the hetero epitaxial growth method according to the first embodiment, a schematic cross-section structure of ZnO layer 47 performed the crystal growth, after forming the buffer layer 43, on the r-plane sapphire substrate 41 is expressed as shown in FIG. 28A. Moreover, a surface bird's-eye view SEM photograph after performing the crystal growth of ZnO layer 47 by the HVPE method for 60 minutes after forming the buffer layer 43 on the r-plane sapphire substrate 41 is expressed as shown in FIG. 28B. An effect is found in planarizing formation of ZnO layer 47 by the HVPE method deposited on the buffer layer by the ZnO buffer layer 43 not only on the a-plane sapphire substrate 40, but also on the r-plane sapphire substrate 41.

Figure 29A:
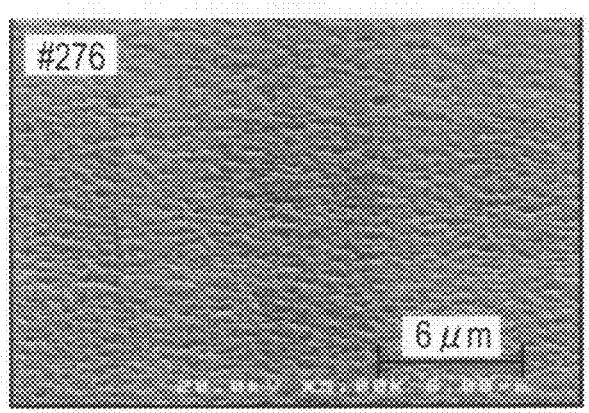
FIG. 29A shows a surface bird's-eye view SEM photograph performed the crystal growth of the buffer layer at 400 degrees C. during 60 minutes on the r-plane sapphire substrate, in the hetero epitaxial growth method according to the first embodiment of the present invention.
Figure 29B:
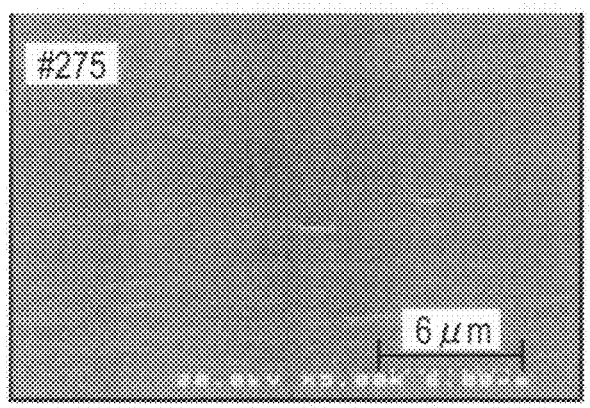
FIG. 29B shows a surface bird's-eye view SEM photograph of the ZnO layer performed the crystal growth further at 1000 degrees C. during 60 minutes, in the hetero epitaxial growth method according to the first embodiment of the present invention.

In the hetero epitaxial growth method according to the first embodiment, a surface bird's-eye view SEM photograph performed the crystal growth of the buffer layer 43 at 400 degrees C. for 60 minutes on the r-plane sapphire substrate 41 is expressed as shown in FIG. 29A, and a surface bird's-eye view SEM photograph of the ZnO layer further performed the crystal growth at 1000 degrees C. for 60 minutes is expressed as shown in FIG. 29B. As clearly from FIG. 29, an effect is found in planarizing formation of ZnO layer 47 by the HVPE method deposited on the buffer layer by the ZnO buffer layer 43 also on the r-plane sapphire substrate 41.

Figure 30:
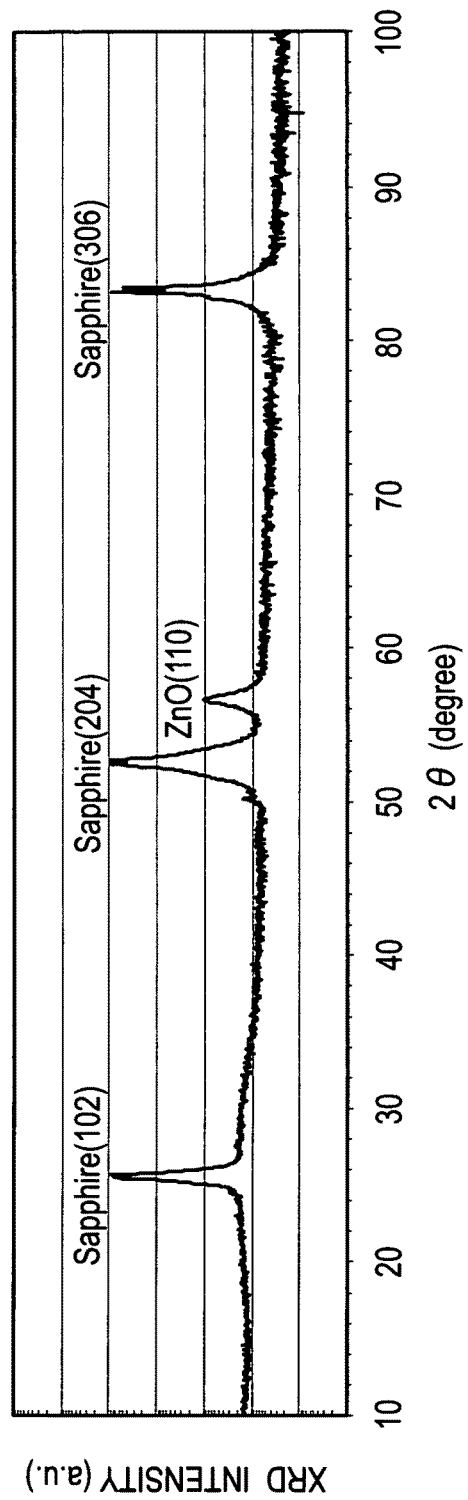
FIG. 30 shows an example of a result of a measurement of X-ray diffraction measurement (2 theta-omega method) of the ZnO layer formed as shown in FIG. 29.

A result of a measurement of X-ray diffraction measurement (2 theta-omega method) of the ZnO layer formed in FIG. 29 is expressed as shown, for example in FIG. 30. Since the peak of ZnO (110) is observed as shown in FIG. 30, the ZnO layer 47 which performs a-axis oriented is formed on the r-plane sapphire substrate 41.

(Semiconductor Device)

Figure 31:
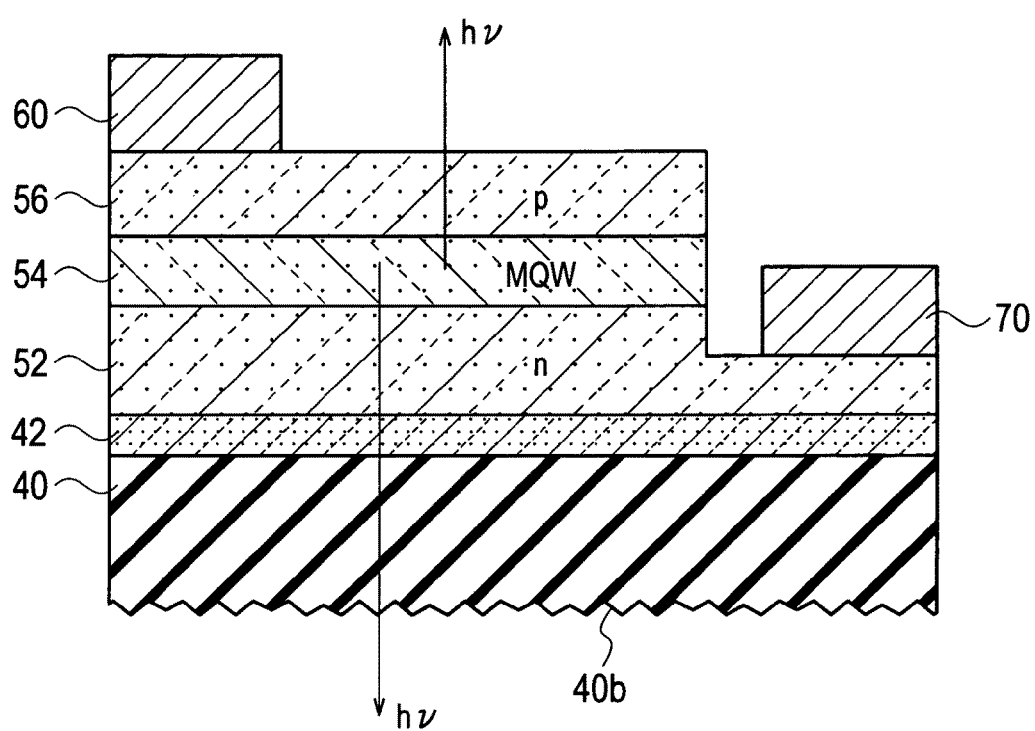
FIG. 31 is a schematic cross-sectional configuration diagram of a semiconductor device having the hetero epitaxial crystal structure formed by the hetero epitaxial growth method according to the first embodiment of the present invention.

As shown in FIG. 31, an example of schematic cross-section structure of a semiconductor device having the hetero epitaxial crystal structure formed by the hetero epitaxial growth method according to the first embodiment includes: a heterogeneous substrate 40; a buffer layer 42 disposed on the heterogeneous substrate 40; a n type ZnO based semiconductor layer 52 disposed on the buffer layer 42 and impurity-doped with the n type impurity; a ZnO based semiconductor active layer 54 disposed on the n type ZnO based semiconductor layer 52; and a p type ZnO based semiconductor layer 56 disposed on the ZnO based semiconductor active layer 54 and impurity-doped with the p type impurity.

Each of the n type ZnO based semiconductor layer 52, the ZnO based semiconductor active layer 54, and the p type ZnO based semiconductor layer 56 are formed by the above-mentioned hetero epitaxial crystal growth apparatus 20, and the hetero epitaxial growth method used for the above-mentioned halogenation group II metal and oxygen material.

A p side electrode 60 is disposed on the p type ZnO based semiconductor layer 56, and a n side electrode 70 is disposed on the surface of the n type ZnO based semiconductor layer 52 exposed by mesa etching. As a material of the p side electrode 60, the layered structure of a Ni layer and an Au layer is adoptable, for example. Moreover, as a material of the n side electrode 70, the layered structure of a Ti layer and an Au layer is adoptable, for example.

Moreover, in the example shown in FIG. 31, in order that the extraction efficiency of the light from the ZnO based semiconductor active layer 54 is raised, as for the back side 40b of the heterogeneous substrate 40, uneven random shape, such as a surface roughening process, is formed.

In addition, as the n type impurity supplied with the n type doping gas, any one of B, Ga, Al, In or Tl is applicable, for example.

Moreover, as the p type impurity supplied with the p type doping gas, any one of N, P, As, Sb, Bi, Li, or Cu is applicable, for example.

The ZnO based semiconductor active layer 54 includes a MQW (Multi-Quantum Well) structure where a barrier layer composed of $Mg_xZn_{1-x}O$ (where $0<x<1$) and a well layer composed of ZnO are deposited, for example.

Alternatively, the ZnO based semiconductor active layer 54 may include a MQW structure where a well layer composed of $Cd_yZn_{1-y}O$ (where $0<y<1$) and a barrier layer composed of ZnO is deposited.

The number of pairs of the quantum well is decided from the transit distance of electrons and holes. That is, it determines by the number of pairs of MQW corresponding to the predetermined thickness of the ZnO based semiconductor active layer 54 from which the recombination radiation efficiency of electrons and holes becomes the most satisfactory.

Here, since the bandgap energy of MgO is 7.8 eV in contrast to the bandgap energy of ZnO is 3.37 eV, a MQW structure by which a barrier layer composed of $Mg_xZn_{1-x}O$, and a well layer composed of ZnO are deposited can be formed, by adjusting the composition ratio x of $Mg_xZn_{1-x}O$.

On the other hand, since the bandgap energy of CdO is 0.8 eV in contrast to the bandgap energy of ZnO is 3.37 eV, a MQW structure by which a well layer composed of $Cd_yZn_{1-y}O$, and a barrier layer composed of ZnO are deposited can also be formed, by adjusting the composition ratio y of $Cd_yZn_{1-y}O$.

The heterogeneous substrate 40 is composed of a sapphire substrate, for example. Alternatively, a silicon substrate, a SiC substrate, a GaAs substrate, a GaP substrate, a GaN based substrate, or a $ScAlMgO_4$ substrate may be applied.

As the buffer layer 42, an orienting film of an oxide or an orienting film of nitride is applicable. As the orienting film of the oxide, ZnO or MgO can be used, for example.

As the orienting film of the nitride, AlN or GaN can be used, for example.

In addition, the light-emitting (hv) from the above-mentioned semiconductor device can be extracted from the direction of a top surface and a back side, as shown in FIG. 31. As a final device structure, it is effective also as a configuration by which the light-emitting (hv) is mainly extracted from the back side 40b of the heterogeneous substrate 40, for example by making it as a flip-chip mounting structure.

According to the hetero epitaxial growth method according to the present invention, the ZnO based semiconductor crystal can be formed on the heterogeneous substrate, such as a sapphire substrate, at the temperature higher than 800 degrees C.

According to the present invention, the hetero epitaxial crystal structure and the semiconductor device, which are formed by using the above-mentioned hetero epitaxial growth method, can be provided.

According to the hetero epitaxial crystal growth apparatus according to the present invention, the ZnO based semiconductor crystal can be grown up on the heterogeneous substrate, such as a sapphire substrate, at the temperature higher than 800 degrees C.

Second Embodiment

Homo Epitaxial Growth Method

A homo epitaxial growth method of a homo epitaxial crystal structure according to a second embodiment of the present invention will be explained with reference to FIG. 32.

Figure 32A:
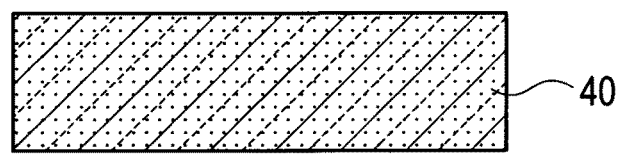
FIG. 32A shows a homo epitaxial growth method of a homo epitaxial crystal structure according to a second embodiment of the present invention, and is a schematic cross-sectional configuration diagram showing a process for which a ZnO substrate is prepared.

A schematic cross-section structure showing a process for preparing a ZnO substrate 40 is expressed as shown in FIG. 32A. A schematic cross-section structure showing a formation process of a ZnO based semiconductor layer 46 by halogenide vapor phase epitaxy is expressed as shown in FIG. 32B.

(a) First of all, as shown in FIG. 32A, +c-plane (001) substrate is prepared as the ZnO substrate 40, for example. A crystal plane is provided with the plane where the c-axis fine-inclined about 0.5 degree in the m-axial direction <1-10>, for example.

Figure 32B:
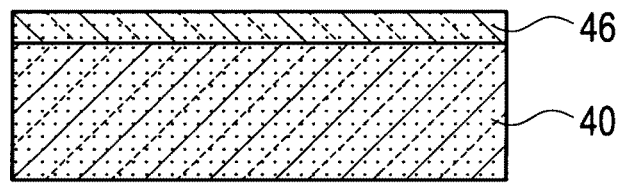
FIG. 32B shows the homo epitaxial growth method of the homo epitaxial crystal structure according to the second embodiment of the present invention, and is a schematic cross-sectional configuration diagram showing a formation process of the ZnO based semiconductor layer by halogenide vapor phase epitaxy.

(b) Next, as shown in FIG. 32B, the ZnO substrate 40 is heated to the high temperature of not less than about 1000 degrees C., and the ZnO based semiconductor layer 46 is formed on the ZnO substrate 40 by the HVPE method. More specifically, the reactant gas mixing zinc containing gas and oxygen containing gas is introduced on the ZnO substrate 40, and the crystal growth of the ZnO based semiconductor layer 46 is performed on the ZnO substrate 40. For example, the halogenide vapor phase epitaxy using zinc chloride ($ZnCl_2$) and water ($H_2O$) is applied.

As the crystal growth conditions, the partial pressure $P_{ZnCl_2}$ of $ZnCl_2$ is set to about not more than $1\times10^{-4}$ atm, for example, the VI/II ratio which is a supply ratio of oxygen which is group VI element and Zn which is group II element is set to not more than about 100, for example, the crystal growth temperature $T_g$ is set to about 1000 degrees C., for example, and the crystal growth period is set to about 1 to 6 hours, for example. Here, in the case of the partial pressure $PZnCl_2$ of $ZnCl_2=1\times10^{-4}$ atm, it will be set to the partial pressure $P_{H2O}$ of $H_2O=10^{-2}$ atm if the supply ratio VI/II=100.

As a value of the VI/II ratio which is the supply ratio of oxygen which is group VI element and Zn which is group II element, it is preferable that it is more than 1 and not more than about 100, for example.

In the homo epitaxial growth method according to the second embodiment, the temperature $T_g$ of the crystal growth is enforcing the high temperature growth method higher than 1000 degrees C. If the melting point of 1975 degrees C. of the ZnO crystal is taken into consideration, about ⅓ to ½ of the melting point is needed, and more the temperature $T_g$ of crystal growth is high, the more the satisfactory crystal of quality can be obtained. Therefore, in the above-mentioned example, the same growth of degree 1000 degrees C. as GaN is performed.

In the process of crystal growth of the ZnO based semiconductor layer 46, the reactant gas may further include magnesium containing gas. Moreover, the partial pressure of magnesium containing gas is not more than about $1\times10^{-4}$ atm, for example.

In the process of the crystal growth of the ZnO based semiconductor layer 46, it is preferable that the crystal growth temperature is not less than 1000 degrees C.

In the process of the crystal growth of the ZnO based semiconductor layer 46, it may further include a process of supplying the impurity gas composed of a halogenide of gallium or aluminum.

In this case, the n type semiconductor layer in which the ZnO based semiconductor layer 46 has the carrier concentration not less than about $1\times10^{16}$ cm$^{-1}$, for example may be formed.

(Temperature Dependence of Surface Morphology of ZnO Based Semiconductor Layer)

Figure 33A:
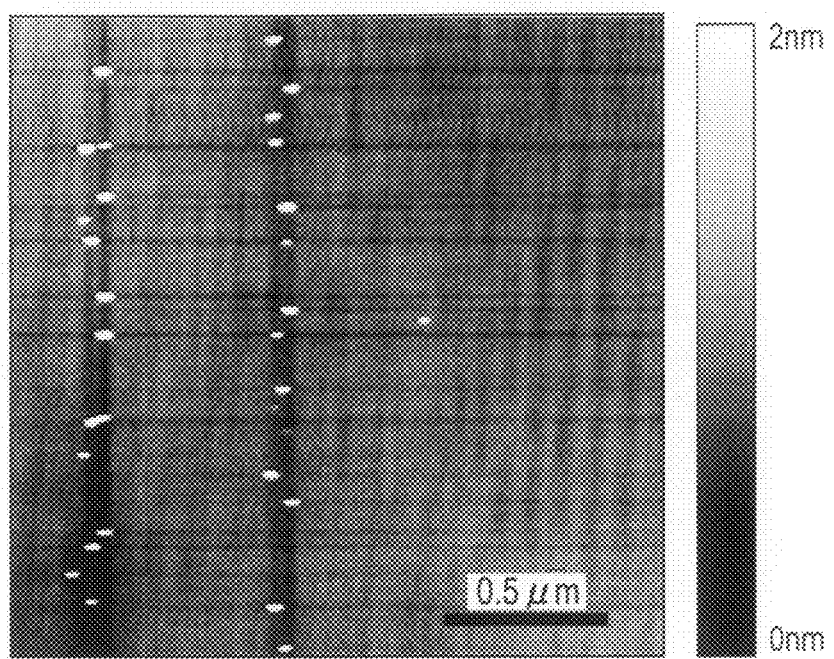
FIG. 33A shows the homo epitaxial crystal structure formed by the homo epitaxial growth method (crystal growth temperature $T_g$=700 degrees C.), and is an AFM photograph of the ZnO based semiconductor layer surface of 2 μm square part.
Figure 33B:
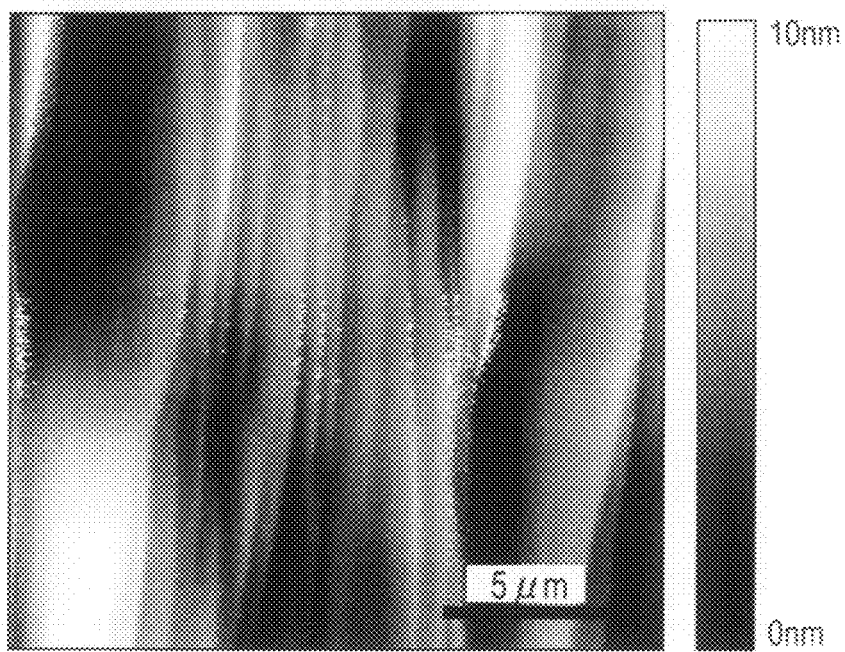
FIG. 33B shows the homo epitaxial crystal structure formed by the homo epitaxial growth method (crystal growth temperature $T_g$=700 degrees C.), and is an AFM photograph of the ZnO based semiconductor layer surface of 20 μm square part.
Figure 34A:
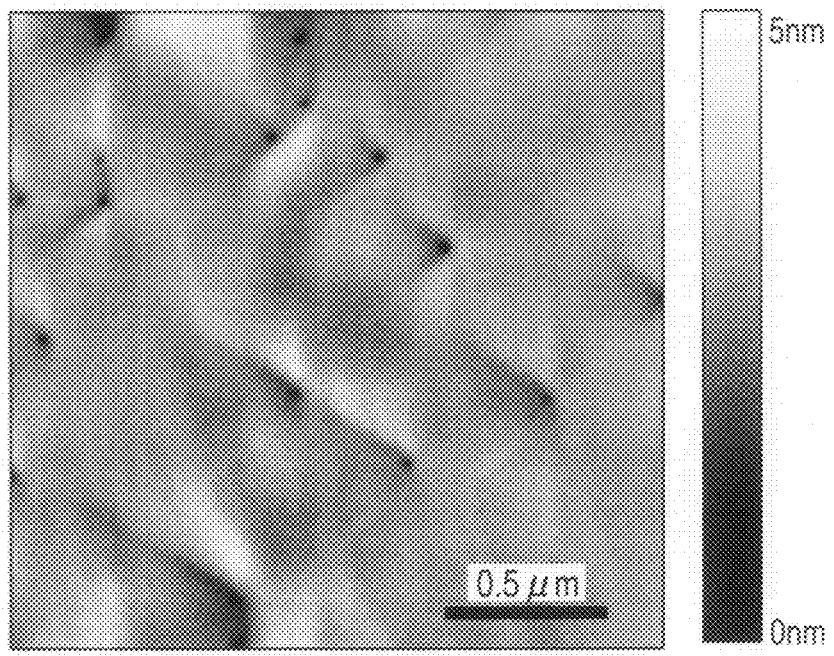
FIG. 34A shows the homo epitaxial crystal structure formed by the homo epitaxial growth method (crystal growth temperature $T_g$=800 degrees C.), and is an AFM photograph of the ZnO based semiconductor layer surface of 2 μm square part.
Figure 34B:
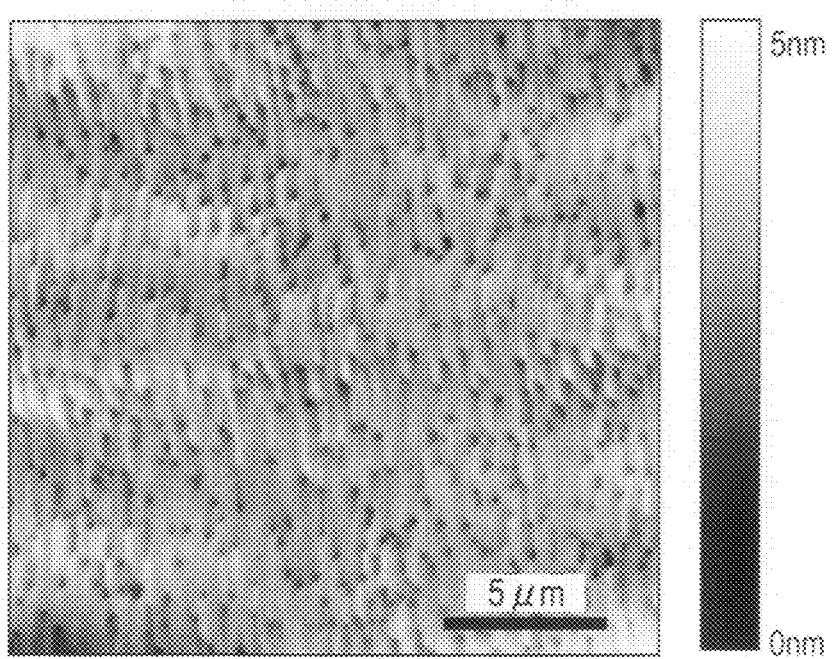
FIG. 34B shows the homo epitaxial crystal structure formed by the homo epitaxial growth method (crystal growth temperature $T_g$=800 degrees C.), and is an AFM photograph of the ZnO based semiconductor layer surface of 20 μm square part.
Figure 35A:
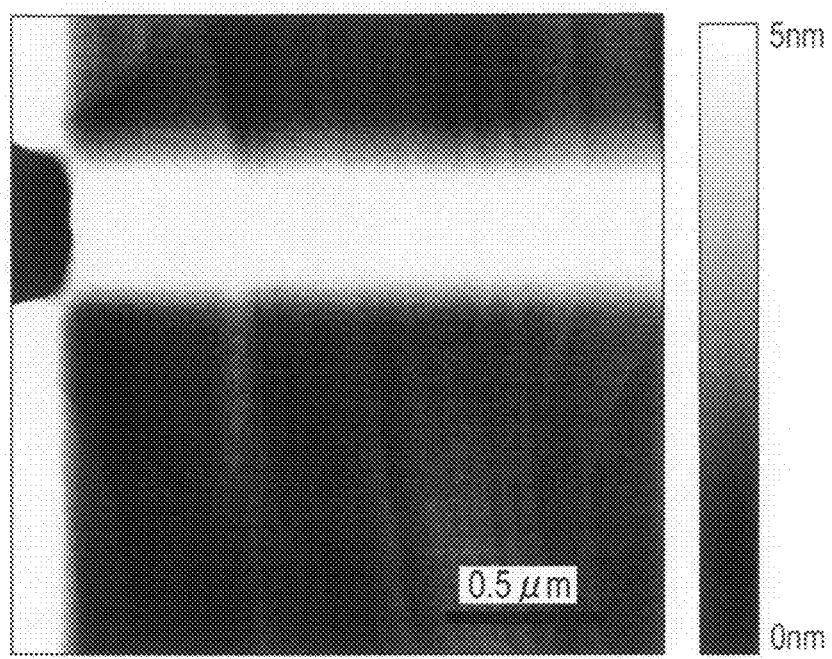
FIG. 35A shows the homo epitaxial crystal structure formed by the homo epitaxial growth method (crystal growth temperature $T_g$=900 degrees C.), and is an AFM photograph of the ZnO based semiconductor layer surface of 2 μm square part.
Figure 35B:
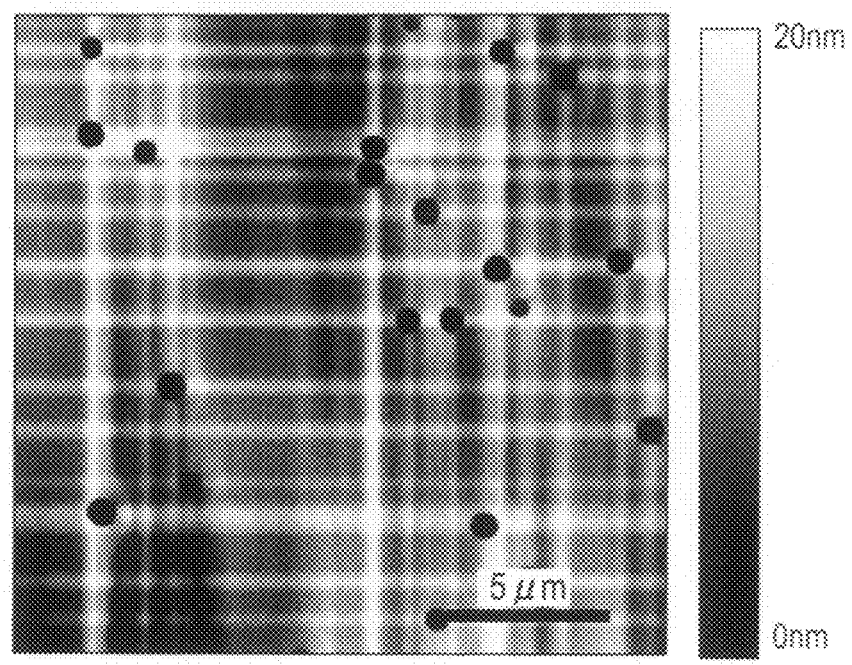
FIG. 35B shows the homo epitaxial crystal structure formed by the homo epitaxial growth method (crystal growth temperature $T_g$=900 degrees C.), and is an AFM photograph of the ZnO based semiconductor layer surface of 20 μm square part.
Figure 36A:
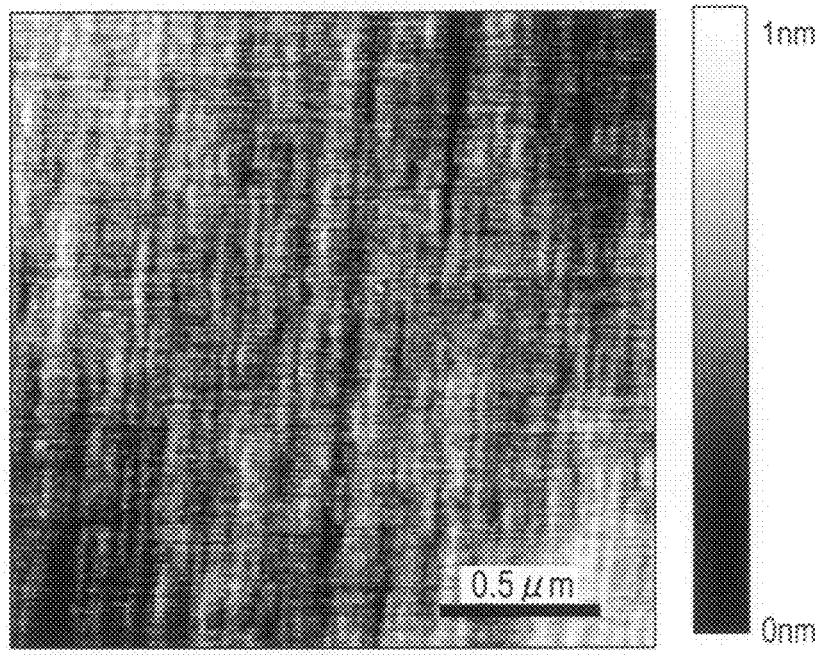
FIG. 36A shows the homo epitaxial crystal structure formed by the homo epitaxial growth method (crystal growth temperature $T_g$=1000 degrees C.) according to the second embodiment of the present invention, and is an AFM photograph of the surface of the ZnO based semiconductor layer surface of 2 μm square part.
Figure 36B:
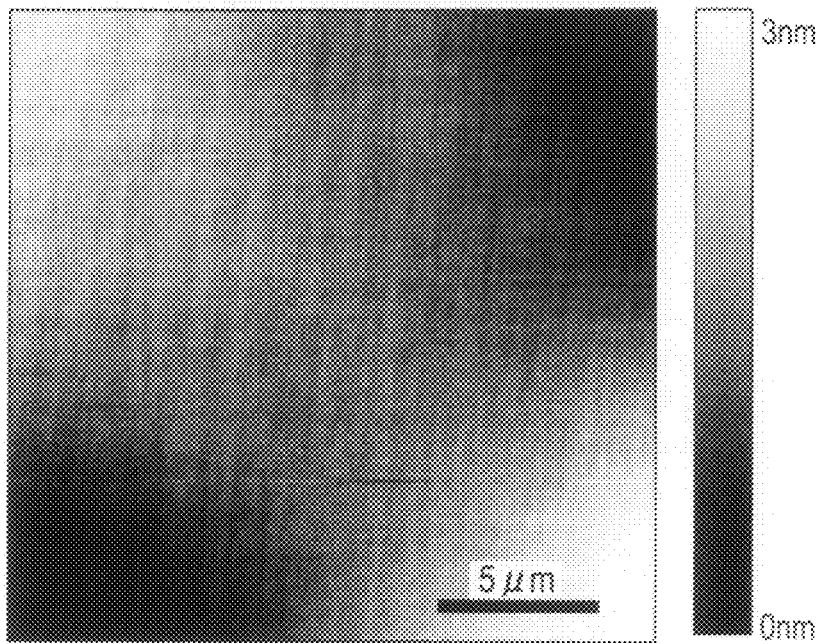
FIG. 36B shows the homo epitaxial crystal structure formed by the homo epitaxial growth method (crystal growth temperature $T_g$=1000 degrees C.) according to the second embodiment of the present invention, and is an AFM photograph of the surface of the ZnO based semiconductor layer surface of 20 μm square part.

In a homo epitaxial crystal structure (crystal growth temperature $T_g$=700 degrees C.) formed by the above-mentioned homo epitaxial growth method, an AFM photograph of the surface of the ZnO based semiconductor layer of a part of 2 μm×2 μm is expressed as shown in FIG. 33A, and an AFM photograph of the ZnO based semiconductor layer of a wide range part of 20 μm×20 μm is expressed as shown in FIG. 33B. Similarly, an example of the crystal growth temperature $T_g$=800 degrees C. is expressed as shown in FIG. 34A and FIG. 34B, an example of the crystal growth temperature $T_g$=900 degrees C. is expressed as shown in FIG. 35A and FIG. 35B, and an example of the crystal growth temperature $T_g$=1000 degrees C. is expressed as shown in FIG. 36A and FIG. 36B.

As compared with the organic metal material used for the conventional MOCVD method, the halogenide of zinc and/or magnesium is not decomposed into zinc and/or magnesium and gaseous chlorine at degree 1000 degrees C. high temperature, but the halogenide of zinc and/or magnesium and oxygen material are directly reacted on the ZnO substrate.

As for the halogenide of zinc and/or magnesium and oxygen material, since a premature reaction does not occur like main organic metals and oxygen material, the raw material efficiency of the high temperature region is also higher than the MOCVD method, without particle occurring on the ZnO substrate.

(VI/II Ratio Dependence of Surface Morphology of ZnO Based Semiconductor Layer)

Figure 37A:
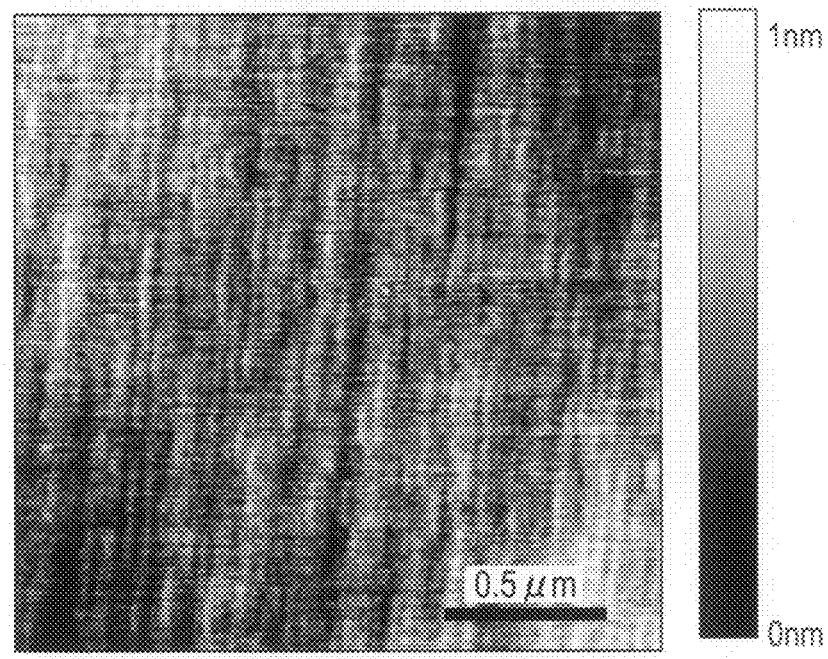
FIG. 37A shows the homo epitaxial crystal structure formed by the homo epitaxial growth method (an example of crystal growth temperature $T_g$=1000 degrees C., and VI/II ratio=20) according to the second embodiment of the present invention, and is an AFM photograph of the surface of the ZnO based semiconductor layer surface of 2 μm square part.
Figure 37B:
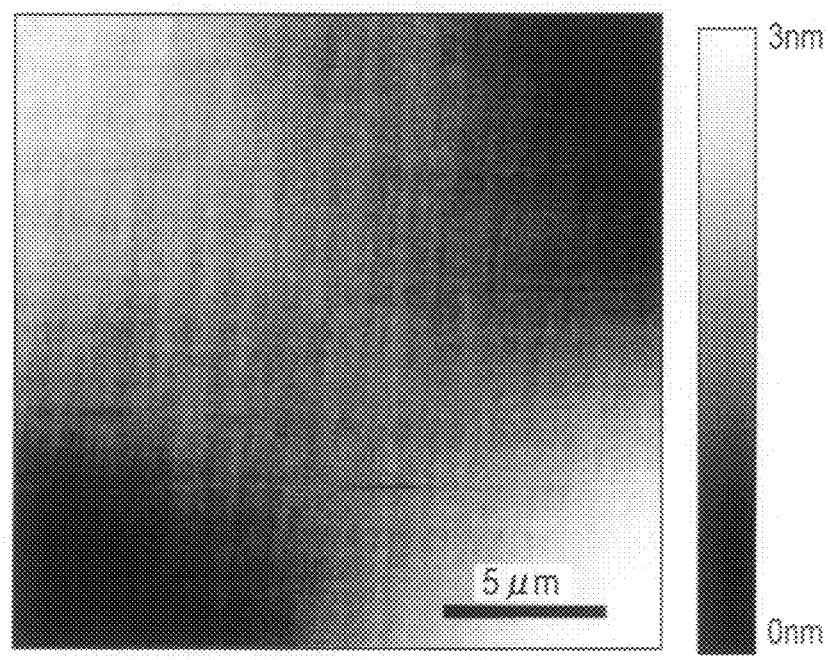
FIG. 37B shows the homo epitaxial crystal structure formed by the homo epitaxial growth method (an example of crystal growth temperature $T_g$=1000 degrees C., and VI/II ratio=20) according to the second embodiment of the present invention, and is an AFM photograph of the surface of the ZnO based semiconductor layer surface of 20 μm square part.
Figure 38A:
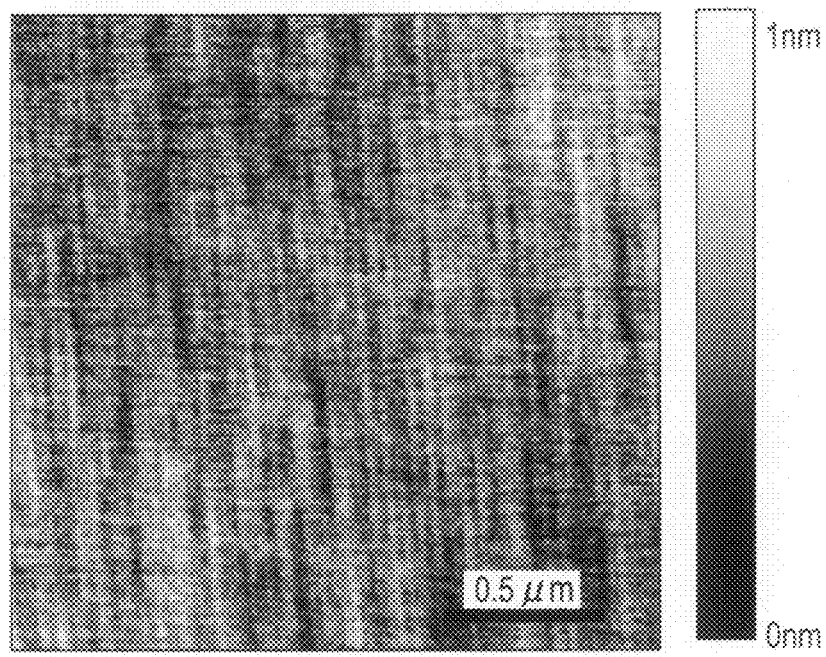
FIG. 38A shows the homo epitaxial crystal structure formed by the homo epitaxial growth method (an example of crystal growth temperature $T_g$=1000 degrees C., and VI/II ratio=50) according to the second embodiment of the present invention, and is an AFM photograph of the surface of the ZnO based semiconductor layer surface of 2 μm square part.
Figure 38B:
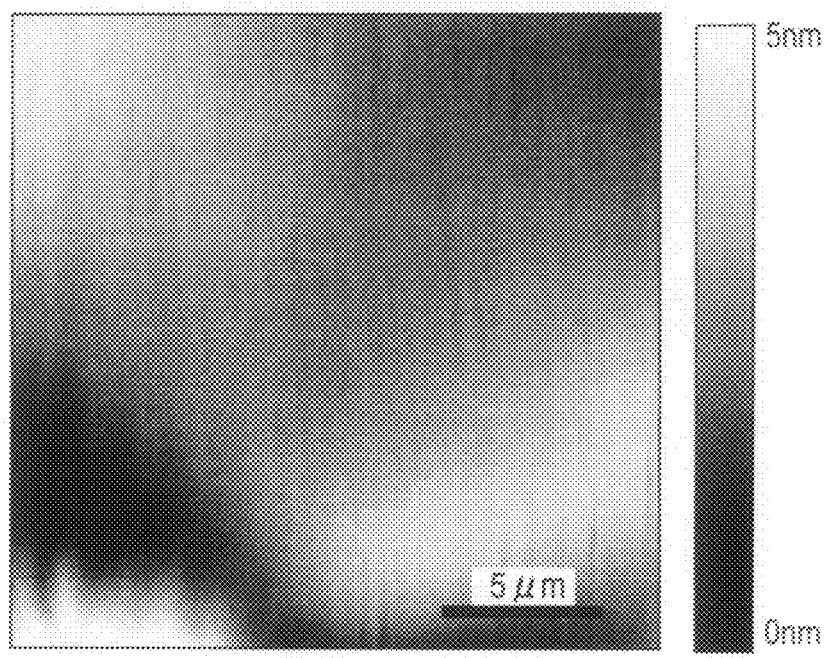
FIG. 38B shows the homo epitaxial crystal structure formed by the homo epitaxial growth method (an example of crystal growth temperature $T_g$=1000 degrees C., and VI/II ratio=50) according to the second embodiment of the present invention, and is an AFM photograph of the surface of the ZnO based semiconductor layer surface of 20 μm square part.
Figure 39A:
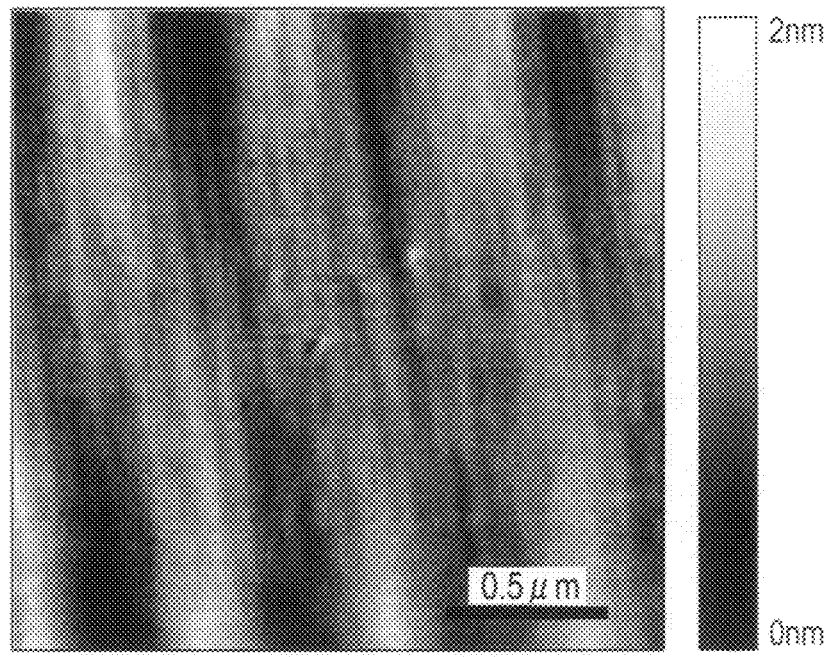
FIG. 39A shows the homo epitaxial crystal structure formed by the homo epitaxial growth method (an example of crystal growth temperature $T_g$=1000 degrees C., and VI/II ratio=1000) according to the second embodiment of the present invention, and is an AFM photograph of the surface of the ZnO based semiconductor layer surface of 2 μm square part.
Figure 39B:
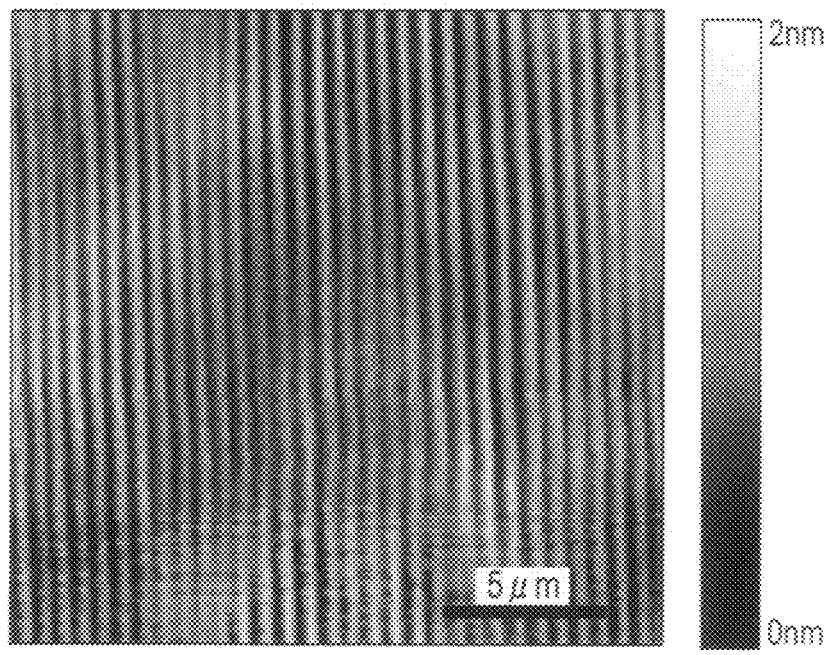
FIG. 39B shows the homo epitaxial crystal structure formed by the homo epitaxial growth method (an example of crystal growth temperature $T_g$=1000 degrees C., and VI/II ratio=1000) according to the second embodiment of the present invention, and is an AFM photograph of the surface of the ZnO based semiconductor layer surface of 20 μm square part.

In a homo epitaxial crystal structure (example of crystal growth temperature $T_g$=1000 degrees C. and VI/II ratio=20) formed by the homo epitaxial growth method according to the second embodiment, an AFM photograph of the surface of the ZnO based semiconductor layer of a part of 2 μm×2 μm is expressed as shown in FIG. 37A, and an AFM photograph of the ZnO based semiconductor layer of a wide range part of 20 μm×20 μm is expressed as shown in FIG. 37B. Similarly, an example of the crystal growth temperature $T_g$=1000 degrees C. and the VI/II ratio=50 is expressed as shown in FIG. 38A and FIG. 38B, and an example of the crystal growth temperature $T_g$=1000 degrees C. and the VI/II ratio=1000 is expressed as shown in FIG. 39A and FIG. 39B.

As the crystal growth conditions, the partial pressure $P_{ZnCl2}$ of $ZnCl_2$ is set to $2.2 \times 10^{-5}$ atm, the crystal growth temperature $T_g$ is 1000 degrees C., and the VI/II ratio is changed to 20 to 1000.

The mol supply ratio (VI/II ratio) of the oxygen materials and the halogenide of zinc and/or magnesium is also an important growth parameter. By setting the VI/II ratio to not more than 100, the migration on the substrate surface of halide materials is accelerated, and it is effective in reducing the occurrence of the abnormality part (a pit or a projection) of crystal growth, etc. Moreover, since the speed of crystal growth becomes slow when the VI/II ratio is small, the VI/II ratio is effective to apply more than 1.

(Growth Period Dependence of Surface Morphology of ZnO Based Semiconductor Layer)

Figure 40A:
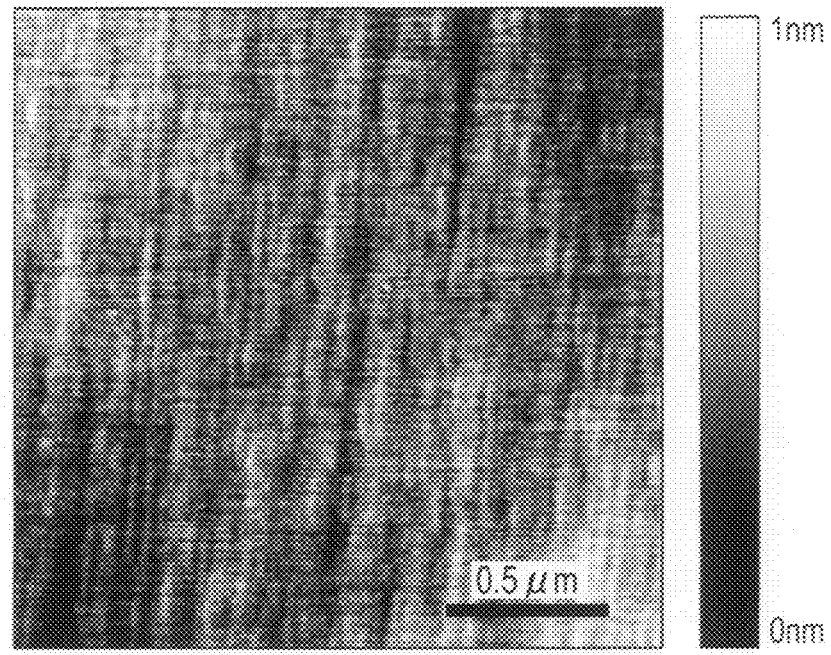
FIG. 40A shows the homo epitaxial crystal structure formed by the homo epitaxial growth method (an example of crystal growth temperature $T_g$=1000 degrees C., VI/II ratio=20, and crystal growth period=1 hour) according to the second embodiment of the present invention, and is an AFM photograph of the surface of the ZnO based semiconductor layer surface of 2 μm square part.
Figure 40B:
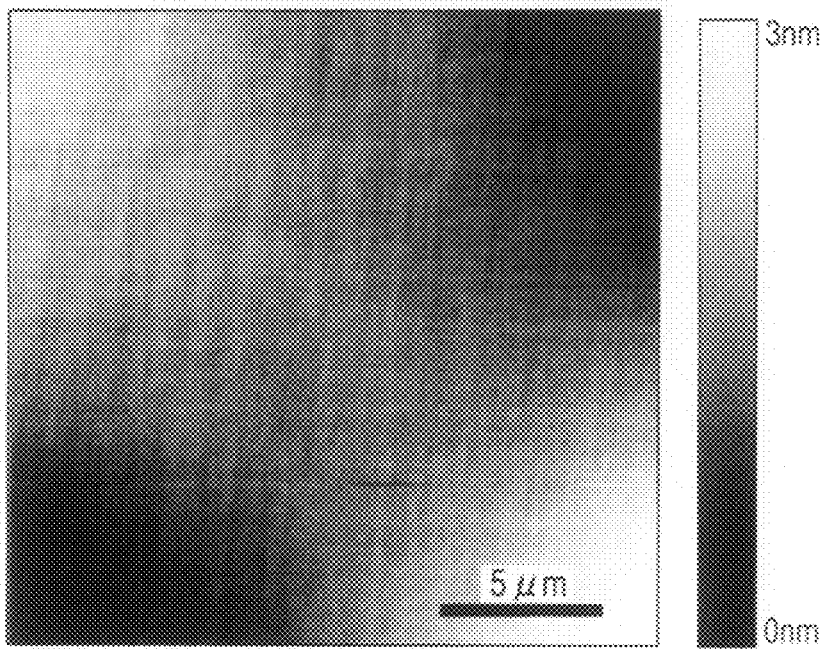
FIG. 40B shows the homo epitaxial crystal structure formed by the homo epitaxial growth method (an example of crystal growth temperature $T_g$=1000 degrees C., VI/II ratio=20, and crystal growth period=1 hour) according to the second embodiment of the present invention, and is an AFM photograph of the surface of the ZnO based semiconductor layer surface of 20 μm square part.
Figure 41A:
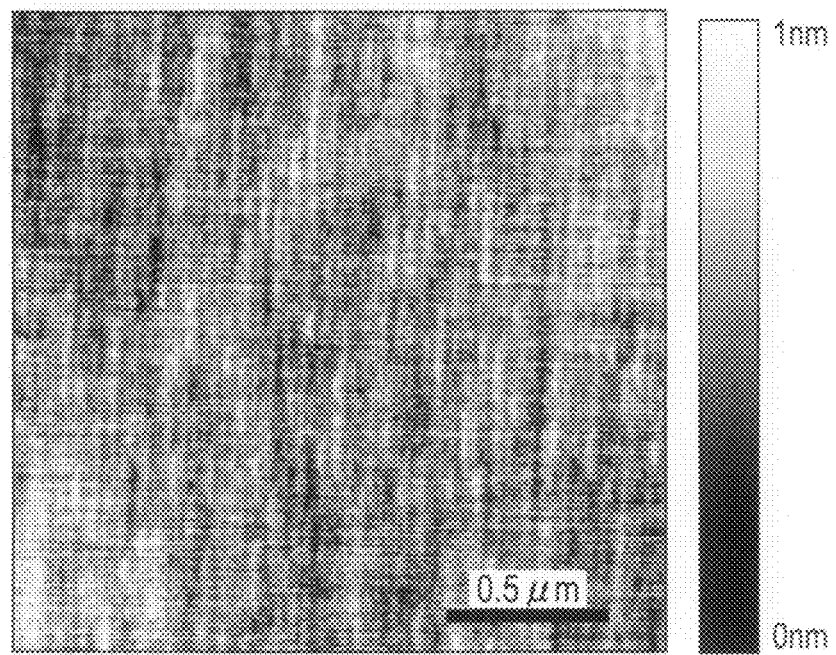
FIG. 41A shows the homo epitaxial crystal structure formed by the homo epitaxial growth method (an example of crystal growth temperature $T_g$=1000 degrees C., VI/II ratio=20, and crystal growth period=2 hours) according to the second embodiment of the present invention, and is an AFM photograph of the surface of the ZnO based semiconductor layer surface of 2 μm square part.
Figure 41B:
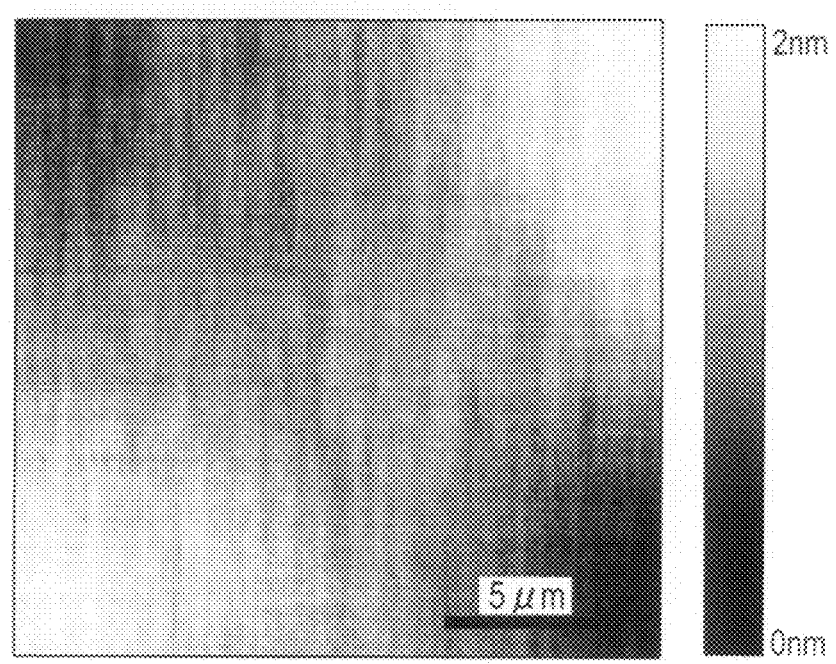
FIG. 41B shows the homo epitaxial crystal structure formed by the homo epitaxial growth method (an example of crystal growth temperature $T_g$=1000 degrees C., VI/II ratio=20, and crystal growth period=2 hours) according to the second embodiment of the present invention, and is an AFM photograph of the surface of the ZnO based semiconductor layer surface of 20 μm square part.
Figure 42A:
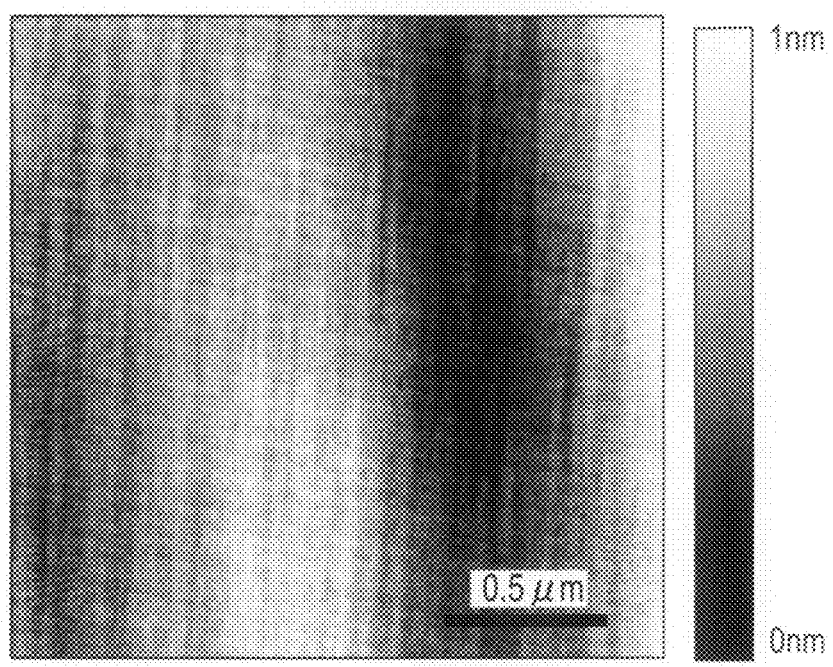
FIG. 42A shows the homo epitaxial crystal structure formed by the homo epitaxial growth method (an example of crystal growth temperature $T_g$=1000 degrees C., VI/II ratio=20, and crystal growth period=6 hours) according to the second embodiment of the present invention, and is an AFM photograph of the surface of the ZnO based semiconductor layer surface of 2 μm square part.
Figure 42B:
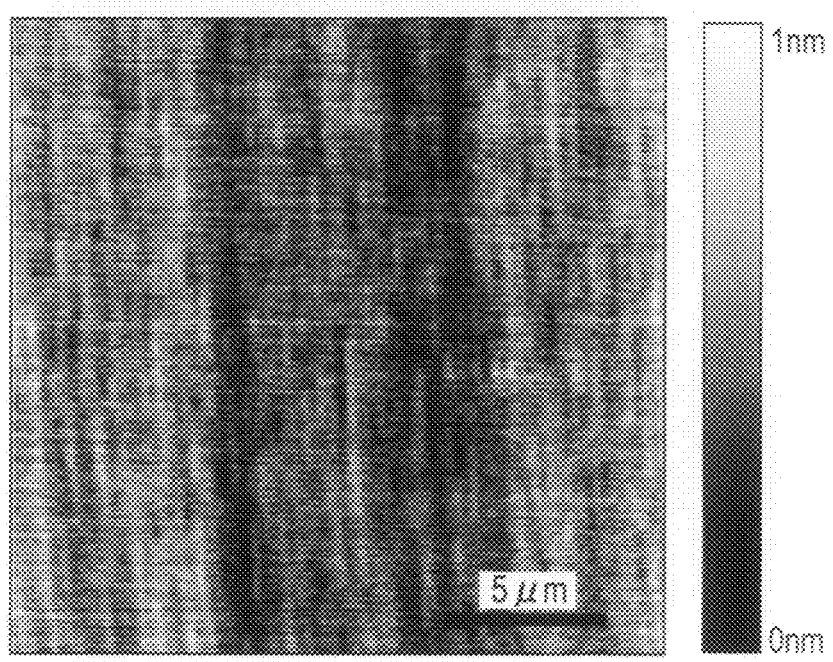
FIG. 42B shows the homo epitaxial crystal structure formed by the homo epitaxial growth method (an example of crystal growth temperature $T_g$=1000 degrees C., VI/II ratio=20, and crystal growth period=6 hours) according to the second embodiment of the present invention, and is an AFM photograph of the surface of the ZnO based semiconductor layer surface of 20 μm square part.

In a homo epitaxial crystal structure (example of crystal growth temperature $T_g$=1000 degrees C., VI/II ratio=20, crystal growth period=1 hour) formed by the homo epitaxial growth method according to the second embodiment, an AFM photograph of the surface of the ZnO based semiconductor layer of a part of 2 μm×2 μm is expressed as shown in FIG. 40A, and an AFM photograph of the ZnO based semiconductor layer of a wide range part of 20 μm×20 μm is expressed as shown in FIG. 40B. Similarly, an example of the crystal growth temperature $T_g$=1000 degrees C., the VI/II ratio=20 and the crystal growth period=2 hours is expressed as shown in FIG. 41A and FIG. 41B, and an example of the crystal growth temperature $T_g$=1000 degrees C., the VI/II ratio=20 and the crystal growth period=6 hours is expressed as shown in FIG. 42A and FIG. 42B.

As the crystal growth conditions, the partial pressure $P_{ZnCl2}$ of $ZnCl_2$ is set to $2.2 \times 10^{-5}$ atm, the VI/II ratio is set to 20, the crystal growth temperature $T_g$ is 1000 degrees C., and the crystal growth period is changed to 1 hour to 6 hours.

The film growth thickness of the ZnO based semiconductor layer 46 is about 0.42 μm, for example in 1 hour of crystal growth periods, is about 0.73 μm, for example in 2 hours of crystal growth periods, and is about 2.27 μm, for example in 6 hours of crystal growth periods.

Although the vapor phase epitaxial crystal growth using the halogenide is known as a method in which the high-speed growth which is several tens to several hundred μm per hour is possible, the growth becomes possible with the growth rate of not more than about 1 μm per hour by reducing the material partial pressure to the usual MOCVD method level, and it prevents forming excessive nucleus formation and excessive polycrystalline film by reducing the material partial pressure.

The value of the not more than about 1 μm per hour is a growth rate permissible as a thin-film formation rate of compound semiconductor, and is fully usable for a method as the formation method of the ZnO based semiconductor layer.

(1 ML Step)

Figure 43:
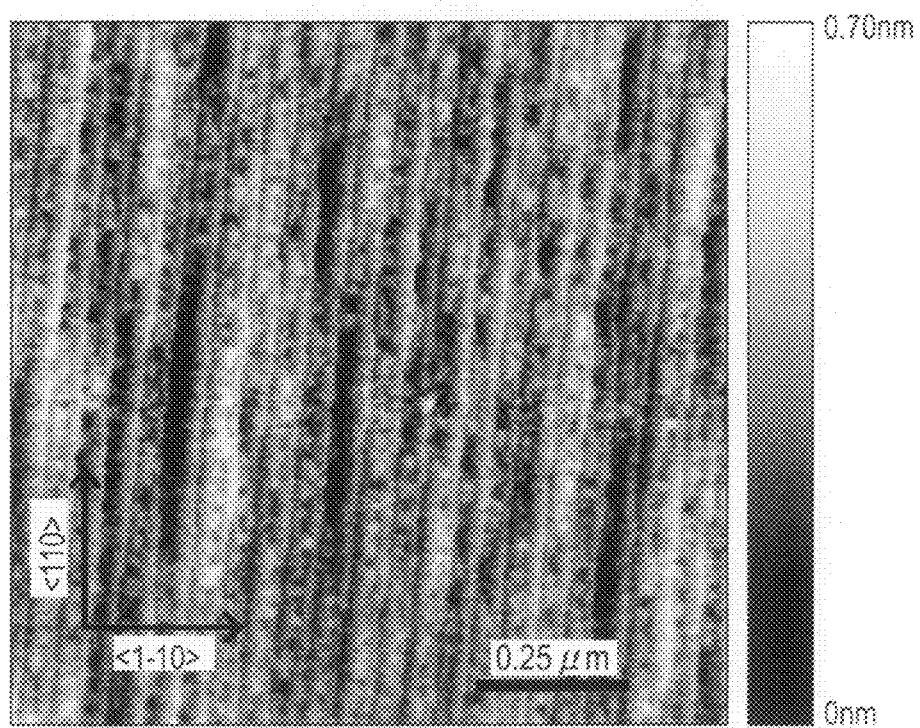
FIG. 43 shows an AFM photograph showing the surface morphology of 1 ML step of +c-plane ZnO based semiconductor layer surface in alignment with m-axial direction <1-10> and a-axial direction <110>, in the homo epitaxial crystal structure formed by the homo epitaxial growth method according to the second embodiment of the present invention.

In the homo epitaxial crystal structure formed by the homo epitaxial growth method according to the second embodiment, an AFM photograph showing the surface morphology having a step of 1 ML (Mono Layer) height of the surface of the ZnO based semiconductor layer 46 having +c-plane in alignment with a m-axial direction <1-10> and an a-axial direction <110> is expressed as shown in FIG. 43.

Furthermore, in the homo epitaxial crystal structure formed by the homo epitaxial growth method according to the second embodiment, an enlarged drawing of an AFM photograph showing the surface morphology having a step of 1 ML height of the surface of the ZnO based semiconductor layer 46 having +c-plane in alignment with the m-axial direction <1-10> and the a-axial direction <110> is expressed as shown in FIG. 44A. Moreover, a schematic planar structure of the step shape of 1 ML step corresponding to FIG. 44A is expressed as shown in FIG. 44B. Moreover, a schematic cross-section structure of the step shape between point A and point B corresponding to FIG. 44B can be schematically expressed as shown in FIG. 44C. The surface of the ZnO based semiconductor layer inclines about 0.5 degree to the m-axial direction <1-10>. Furthermore, a drawing showing the m-axial direction <1-10> and a-axial direction <110> which assumed the hexagonal shape on the ZnO based semiconductor layer surface corresponding to FIG. 44A is expressed as shown in FIG. 44D.

As a result of the surface observation of FIG. 44A, the stripes in line with the <110> directions are observed, and about 13 pieces exist on the screen of FIG. 44A. Furthermore, a wavelike curve is observed between such the stripes. Such the shape expresses a result in which every 1 ML of steps have appeared as well as the (2×1) structure observed in the fine inclined plane (direction of incline is [110], angle of gradient is 0.5) in the (001) plane of silicon. That is, as shown in FIG. 44B, seven stripes exist between the point A and the point B, and the height difference of each stripe is equivalent to 2 ML. The interval of the stripe and the wavelike curve is equivalent to 1 ML.

The terrace width w in the case of 2 ML step is expressed as the following formula:

$$w = h/\tan\theta \qquad (4)$$

where h is the lattice constant of the c-axial direction of the ZnO crystal, and θ expresses the angle to which the c-axis of the substrate inclined from the normal line of the substrate to the m-axial direction. In an example of FIG. 44, θ=0.5 degree. As a result of FIG. 44, it proves that the terrace width w is 0.0597 μm and h=0.5207 (nm) is obtained.

The surface performing a step flow in a wide area is obtained by setting the growth temperature to not less than 1000 degrees C., setting the supplied partial pressure of the zinc halogenide to not more than $1 \times 10^{-4}$ atm and setting the VI/II ratio to not more than 100, and the surface of 1 ML step (half of the lattice constant of the c-axis of ZnO) is obtained when further grown up at 1000 degrees C.

It is first time to have observed 1 ML step surface by the vapor phase epitaxy film of ZnO. The pit is not observed by the AFM observation of wide range of 20 μm×20 μm, and the pit density is not more than $1 \times 10$ cm$^{-2}$ same as the dislocation density of the substrate also as a result of the microscopic observation. It proves that the pit-free ZnO based semiconductor layer is formed covering a wide area compared with other processes such as the MOCVD method.

(Crystallinity of ZnO Crystal)
—X-Ray Rocking Curve—

Figure 45:
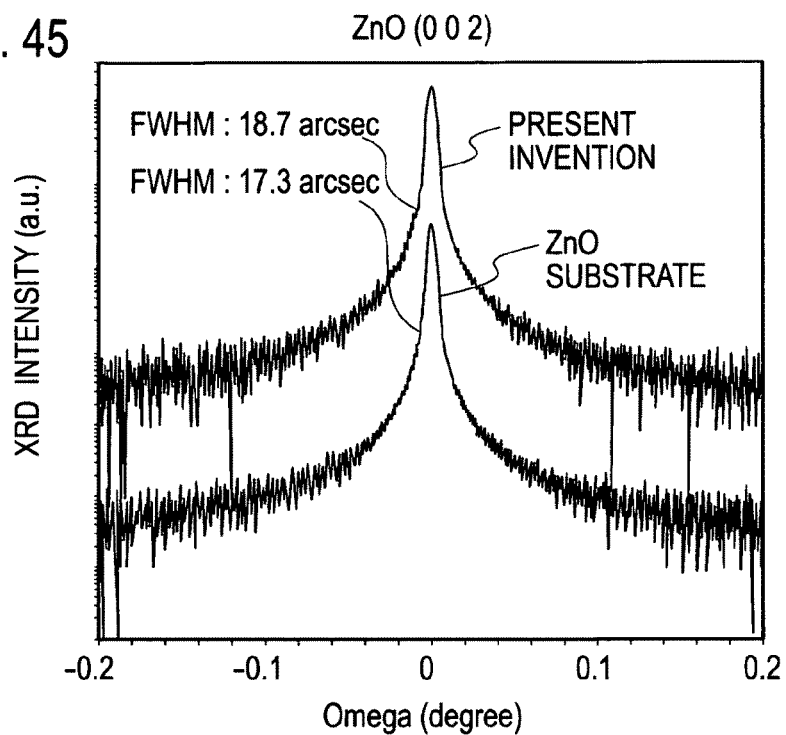
FIG. 45 shows the X-ray rocking curve of the ZnO crystal of the homo epitaxial crystal structure formed by the homo epitaxial growth method according to the second embodiment of the present invention (example of ZnO (002) plane).

In the homo epitaxial crystal structure formed by the homo epitaxial growth method according to the second embodiment, a X-ray rocking curve of the ZnO crystal having the (002) plane is expressed as shown in FIG. 45. In FIG. 45, each curve expresses the ZnO substrate 40 and the ZnO based semiconductor layer 46 as a parameter. In the ZnO crystal, the (002) plane is a plane perpendicular to the c-axis, and the X-ray rocking curve shown in FIG. 45 expresses the tilt profile which is fluctuation of the c-axial direction. In the homo epitaxial crystal structure formed by the homo epitaxial growth method according to the second embodiment, it proves that a result with the full width at half maximum FWHM (arcsec) of the X-ray rocking curve of the ZnO crystal having the (002) plane substantially equivalent to the full width at half maximum FWHM of the ZnO substrate is obtained. That is, it proves that the full width at half maximum FWHM of the ZnO based semiconductor layer 46 having the (002) plane is 18.7 (arcsec) in contrast to the full width at half maximum FWHM=17.3 (arcsec) of the ZnO substrate having the (002) plane, and the crystallinity of the ZnO crystal having the (002) plane is satisfactory.

Figure 46:
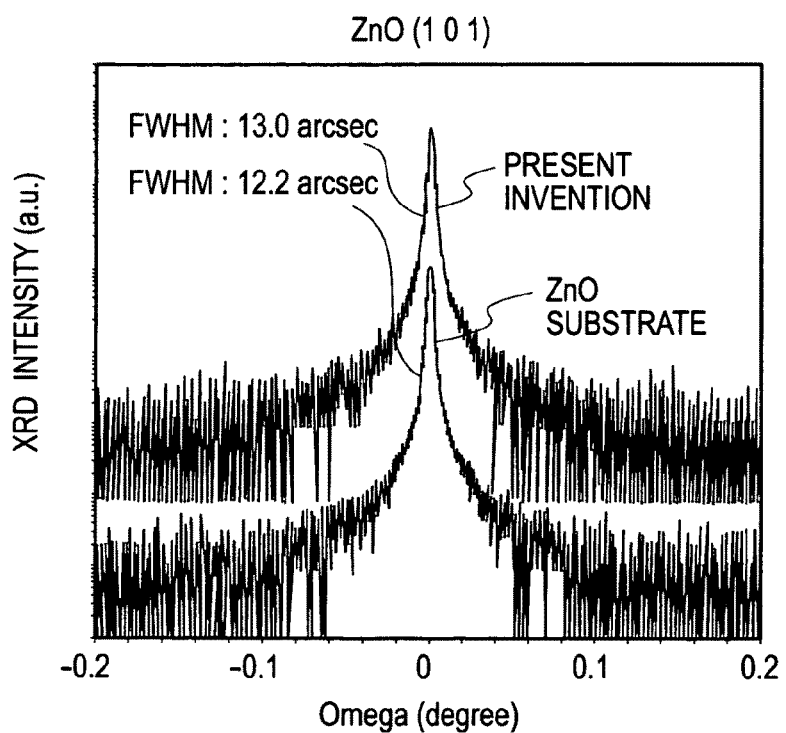
FIG. 46 shows the X-ray rocking curve of the ZnO crystal of the homo epitaxial crystal structure formed by the homo epitaxial growth method according to the second embodiment of the present invention (example of ZnO (101) plane).

In the homo epitaxial crystal structure formed by the homo epitaxial growth method according to the second embodiment, the X-ray rocking curve of the ZnO crystal having the (101) plane is expressed as shown in FIG. 46. Each curve expresses the ZnO substrate 40 and the ZnO based semiconductor layer 46 as a parameter as well as FIG. 45. In the ZnO crystal, the (101) plane is a semi-polar plane and the X-ray rocking curve shown in FIG. 46 expresses the twist profile and tilt profile which is fluctuation of a direction vertical to the semi-polar plane. In the homo epitaxial crystal structure formed by the homo epitaxial growth method according to the second embodiment, it proves that a result with the full width at half maximum FWHM of the X-ray rocking curve of the ZnO crystal having the (101) plane substantially equivalent to the full width at half maximum FWHM of the ZnO substrate is obtained. That is, it proves that the full width at half maximum FWHM of the ZnO based semiconductor layer 46 having the (101) plane is 13.0 (arcsec) in contrast to the full width at half maximum FWHM=12.2 (arcsec) of the ZnO substrate 40 having the (101) plane, and the crystallinity of the ZnO crystal having the (101) plane is satisfactory.

—SIMS Analysis Result—

Figure 47:
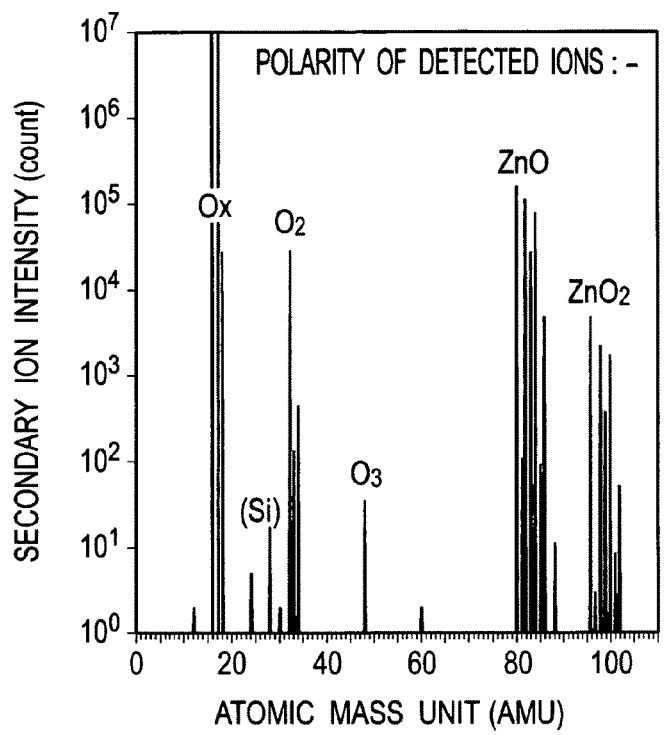
FIG. 47 shows a SIMS analysis result of the ZnO crystal of the homo epitaxial crystal structure formed by the homo epitaxial growth method according to the second embodiment of the present invention (polarity of detected ion: −).
Figure 48:
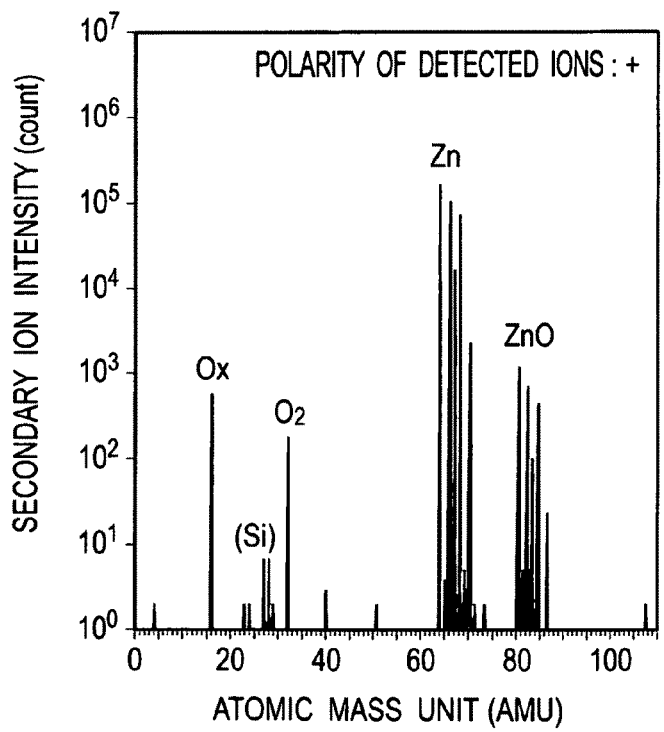
FIG. 48 shows a SIMS analysis result of the ZnO crystal of the homo epitaxial crystal structure formed by the homo epitaxial growth method according to the second embodiment of the present invention (polarity of detected ion: +).

A SIMS (Secondary Ion-microprobe Mass Spectrometry) result (polarity of detected ion: −) of the ZnO crystal of the homo epitaxial crystal structure formed by the homo epitaxial growth method according to the second embodiment is expressed as shown in FIG. 47. Similarly, a SIMS analysis result (polarity of detected ion: +) of the ZnO crystal is expressed as shown in FIG. 48. In FIG. 47 and FIG. 48, a vertical axis shows secondary ion strength (count), and a horizontal axis shows mass (AMU). The detected ion of FIG. 47 is an example for irradiating $O_2^-$ ion as irradiated ion, and the detected ion of FIG. 48 is an example for detecting $Cs^+$ ion as irradiated ion.

As clearly from the result of FIG. 47 and FIG. 48, it proves that chlorine of the halogen based, etc. is not detected and chlorine does not contain in the ZnO crystal of the homo epitaxial crystal structure formed by the homo epitaxial growth method according to the second embodiment.

Figure 49:
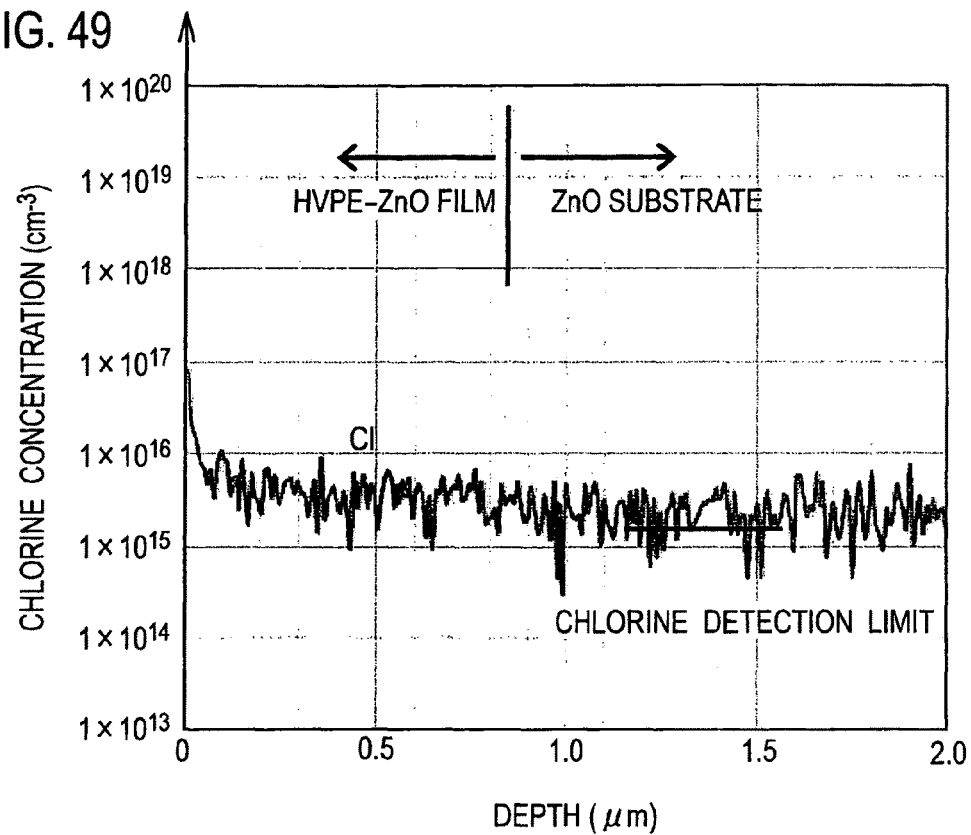
FIG. 49 shows a SIMS analysis result showing the depth direction dependence of the chlorine concentration of the ZnO crystal of the homo epitaxial crystal structure formed by the homo epitaxial growth method according to the second embodiment of the present invention.

A SIMS analysis result showing the depth direction dependence of the chlorine concentration of the ZnO crystal of the homo epitaxial crystal structure formed by the homo epitaxial growth method according to the second embodiment is expressed as shown in FIG. 49. In FIG. 49, a vertical axis expresses the chlorine concentration ($cm^{-3}$) and a horizontal axis expresses the depth (μm). Near the interface of the ZnO substrate 40 and the ZnO based semiconductor layer 46, the chloride concentration is on the detection limit level of chlorine substantially.

As clearly from the result of FIG. 49 showing the depth direction dependence, it proves substantially that the chlorine does not contain at the homo epitaxial crystal structure formed by the homo epitaxial growth method according to the second embodiment.

Every element except the component element of the ZnO based semiconductor layer 46/ZnO substrate 40 from the impurity measurement by the SIMS analysis result is a detection limit, and therefore it proves that the homo epitaxial growth method according to the second embodiment is suitable for fabrication of the ZnO semiconductor film enough by not having detected the halogenide in particular.

—Electrical Characteristics—

Figure 50:
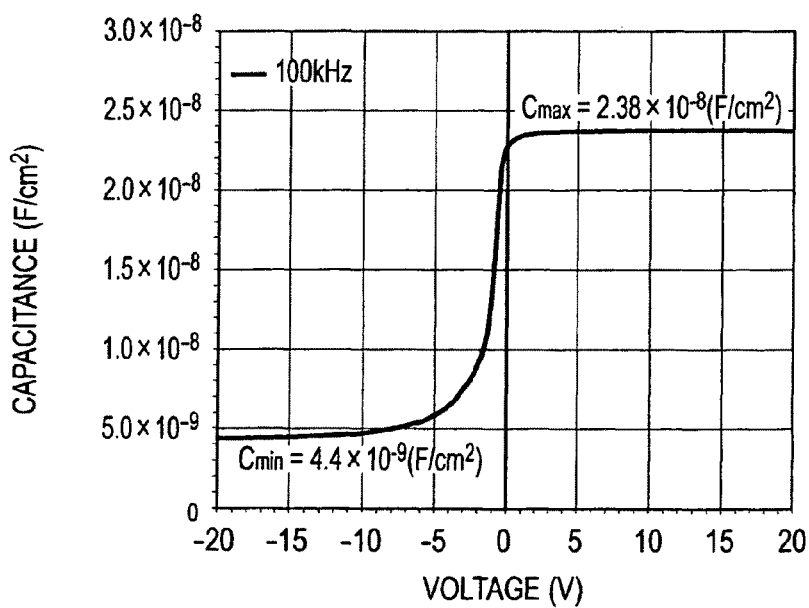
FIG. 50 shows a result of a measurement of the electrical characteristics of the ZnO film of the homo epitaxial crystal structure formed by the homo epitaxial growth method according to the second embodiment of the present invention, and is C-V characteristics of the MOS structure.
Figure 51:
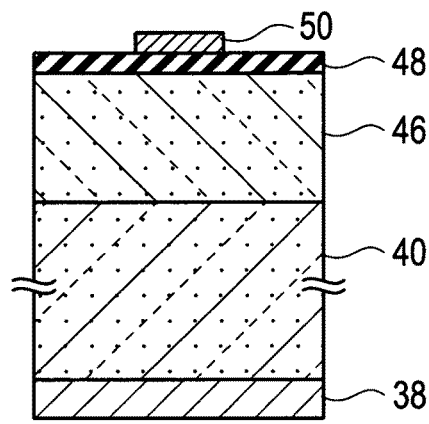
FIG. 51 is a schematic cross-sectional configuration diagram of the sample applying to C-V measurement of FIG. 50.

In a result of a measurement of electrical characteristics of the ZnO film of the homo epitaxial crystal structure formed by the homo epitaxial growth method according to the second embodiment, an example of C-V characteristics of the MOS structure is expressed as shown in FIG. 50. Moreover, as shown in FIG. 51, a schematic cross-section structure of a sample applying to C-V measurement of FIG. 50 includes: a ZnO substrate 40; a ZnO based semiconductor layer 46 disposed on the ZnO substrate 40; an insulating film 48 disposed on the ZnO based semiconductor layer 46; a MOS electrode 50 disposed on the insulating film 48; and a substrate electrode 38 electrically connected with the ZnO substrate 40. The thickness of the ZnO based semiconductor layer 46 is 2.3 μm, and the thickness of the insulating film 48 is 0.2 μm. The material of the MOS electrode 50 is composed of layered structure of Ti/Au, and the diameter is 100 μm.

In FIG. 50, the vertical axis expresses the capacitance value of MOS capacitors ($F/cm^2$), and the horizontal axis expresses the voltage (V) for applying to a forward direction and an opposite direction. The small signal frequency at the time of the measurement is 100 kHz. As clearly from FIG. 50, as for the CV curve, since the depletion region and the inversion region have appeared in the minus voltage application side bordering on 0 V neighborhoods, and the accumulation region has appeared in the plus voltage application side, it proves that the grown-up ZnO film is a n-type semiconductor.

As shown in FIG. 50, since $2.38 \times 10^{-8}$ ($F/cm^2$) is obtained as for the maximum capacitance $C_{max}$, $4.4 \times 10^{-9}$ ($F/cm^2$) is obtained as for the minimum capacitance $C_{min}$, and the residual carrier concentration is about $1 \times 10^{15}$ $cm^{-3}$, it proves that the ZnO based semiconductor layer 46 of high resistivity is formed.

Here, the residual carrier concentration can be obtained as follows.

As shown in FIG. 51, in the MOS capacitance structure composed of MOS electrode 50/insulating film 48/ZnO based semiconductor layer 46/ZnO substrate 40/substrate electrode 38, the maximum depletion layer width $W_{max}$ (μm) is expressed such as the following formula as a one-dimensional model.

$$W_{max} = \{4\varepsilon_s kT \ln(N_D/n_i)/(q^2 N_D)\}^{1/2} \qquad (5)$$

Figure 52:
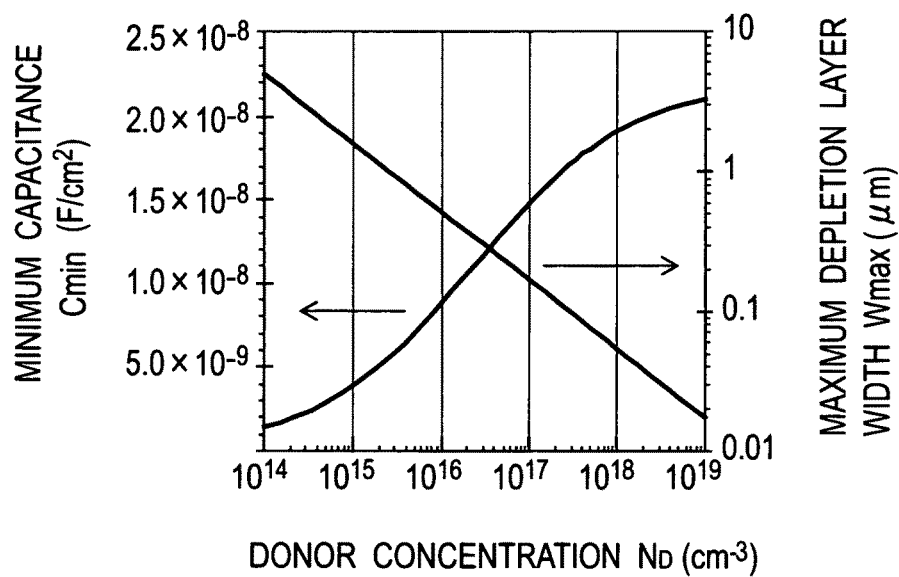
FIG. 52 is a relationship diagram of the minimum capacitance $C_{min}$ (F/cm$^2$) and the maximum depletion layer width $W_{max}$ (μm) toward donor concentration $N_D$ (cm$^{-3}$).

The minimum capacitance $C_{min}$ (F/cm$^2$) is expressed such as the following formula:

$$C_{min} = \varepsilon_i / [d + (\varepsilon_i / \varepsilon_s) W_{max}] \quad (6)$$

$$= \varepsilon_i / [d + \{4\varepsilon_i^2 kT \ln(N_D/n_i)/(\varepsilon_s q^2 N_D)\}^{1/2}]$$

where, k expresses the Boltzmann's constant, and T expresses the absolute temperature. As the relative dielectric constant of ZnO $\varepsilon_s$=8.5, the relative dielectric constant of the insulating film 48 $\varepsilon_i$=5.0, the film thickness of the insulating film 48 d=0.2 (μm), and the intrinsic carrier concentration of ZnO $n_i$=1×10$^{-8}$, the relation between the minimum capacitance $C_{min}$ (F/cm$^2$) and the maximum depletion layer width $W_{max}$ (μm) for the carrier concentration $N_D$ (cm$^{-3}$) calculated from the formula (5) and the formula (6) is expressed as shown in FIG. 52.

As clearly from FIG. 50, it proves that 4.4×10$^{-9}$ (F/cm$^2$) is obtained as for the value of the minimum capacitance $C_{min}$, the carrier concentration $N_D$ is about 1×10$^{15}$ cm$^{-3}$ corresponding to the minimum capacitance $C_{min}$=4.4×10$^{-9}$ (F/cm$^2$), and the maximum depletion layer width $W_{max}$ is about 2 μm.

According to the electrical property evaluation, it proves that the residual donor concentration is about 1×10$^{15}$ cm$^{-3}$, is low enough as the residual donor concentration of the compound semiconductor, and the carrier concentration not less than 1×10$^{15}$ cm$^{-3}$ can be controlled by doping the impurity doping gas. Since the halogenide is used for main materials, it is possible to control the doping quantity stable when the halogenide, in particular halogenide of gallium or halogenide of aluminum when doping the n type impurity, is supplied also to the doping gas.

(Crystal Growth Apparatus)

A schematic configuration of an epitaxial crystal growth apparatus 20 applying to the homo epitaxial growth method according to the second embodiment is similarly expressed as FIG. 13, and includes a gaseous chlorine supplying unit 2, a carrier gas supplying unit 3, a source zone 4, an heating unit 5, a water supplying unit 6, a carrier gas supplying unit 7, a growth zone 8, an heating unit 9, and a substrate holding unit 10.

A configuration for applying to the homo epitaxial growth method of the MgZnO semiconductor (ZnO based semiconductor) is also disposed at the epitaxial crystal growth apparatus 20 applying to the homo epitaxial growth method. That is, as shown in FIG. 13, the epitaxial crystal growth apparatus 20 includes a gaseous chlorine supplying unit 12, a carrier gas supplying unit 13, and a source zone 14 by which the group II metallic material 25 including the single metal substance of magnesium is held.

In the homo epitaxial growth method of the ZnO based semiconductor (ZnO, MgZnO), an equipment configuration for impurity-doping the n type impurity or the p type impurity is also disposed at the epitaxial crystal growth apparatus 20. That is, as shown in FIG. 13, the epitaxial crystal growth apparatus 20 includes a first doping gas supplying unit 22 for supplying the n type doping gas for impurity-doping the n type impurity, and a second doping gas supplying unit 24 for supplying the p type doping gas for impurity-doping the p type impurity.

The source zone 4 is for holding a group II metallic material 15 consisting of a zinc metal single substance. Moreover, the source zone 4 is a zone for generating zinc chloride gas by reacting the gaseous chlorine which are supplied from the gaseous chlorine supplying unit 2 and zinc.

The growth zone 8 is a zone for growing up the ZnO semiconductor on a growth substrate 16 held on a substrate holding unit 10 by reacting the zinc chloride gas supplied from the source zone 4 connected by the supplying pipe, and the water (vapor) supplied from the water supplying unit 6 as an oxygen material. In addition, hydrogen for adjusting the driving force of crystal growth is supplied to the growth zone 8 from a hydrogen supplying unit (not shown). Since the hydrogen supplied from the hydrogen supplying unit reacts to gaseous chlorine easily, the hydrogen is supplied to the growth zone 8 in a supplying path different from the supplying path of gaseous chlorine.

In addition, each supplying pipe for connecting the source zone 4, the growth zone 8, and each gas supplying unit and the growth zone 8 is composed by quartz glass.

The heating unit 5 is for heating the source zones 4 and 14 and the supplying path of water. The heating unit 9 is for heating the growth zone 8. The homo epitaxial crystal growth apparatus 20 achieves a hot wall method by the heating units 5 and 9.

In addition, the heating units 5 may be individually provided to the source zones 4 and 14. Moreover, the heating units 5 may be individually disposed by heater wires etc. also to each gas supplying path.

The nitrogen gas supplied from the carrier gas supplying units 3, 7, and 13 is for carrying the zinc chloride gas generated by the source zone 4, the water supplied from the water supplying unit 6, and the magnesium chloride gas generated by the source zone 14 to the growth zone 8.

The growth zone 8 may be formed with a hot wall type reactor.

The second group II metallic material includes magnesium, for example.

As the n type doping gas, it is effective to supply the halogenide of gallium or aluminum.

Next, a fabrication method of the ZnO semiconductor by the epitaxial crystal growth apparatus 20 mentioned above will be explained.

First of all, the gaseous chlorine and the nitrogen gas are carried to the source zone 4, respectively from the gaseous chlorine supplying unit 2 and the carrier gas supplying unit 3. Then, in the source zone 4, the reaction by the following reaction formula (7) occurs by the group II metallic material 15 consisting of the single metal substance of the zinc currently held, and the supplied gaseous chlorine, and the zinc chloride gas is generated.

$$Zn(s,l) + Cl_2(g) <=> ZnCl_2(g) \quad (7)$$

In this case, as for the single metal substance of the zinc held at the source zone 4, it is preferred that it is a single metal substance with high purity, for example, not less than 99.99999% of its single metal substance is effective. In addition, (s), (l), and (g) in the reaction formula show a solid, a liquid, and gas, respectively.

The source zone 4 becomes the structure enlarging the surface area of the group II metallic material 15 composed of zinc single metal substance, and a suitable temperature, so that most reactions in the reaction formula (7) may be proceeded to the right-hand side and the flow rate of zinc chloride gas can be controlled by the amount of supply of gaseous chlorine. In addition, as such the suitable temperature, about 300 degrees C. to about 450 degrees C. are preferable. Moreover, the temperature of the source zone 4 is set as not more than about 500 degrees C., in order to suppress that the zinc gas with extremely high vapor pressure also in metal is carried to the growth zone 8. Then, the zinc chloride gas generated by the above-mentioned reaction formula (7) is carried to the growth zone 8 by the nitrogen gas supplied from the carrier gas supplying unit 3.

Moreover, the water (vapor) supplied from the water supplying unit 6 is carried to the growth zone 8 as an oxygen material through other paths by the nitrogen gas supplied from the carrier gas supplying unit 7.

Then, in the growth zone 8, the thin film of the ZnO semiconductor grows on the growth substrate 16 with the zinc chloride gas and water which are carried when the reaction of the following reaction formula (8) proceeds to the right-hand side.

$$ZnCl_2(g)+H_2O(g)<=>ZnO(s)+2HCl(g) \qquad (8)$$

Here, the temperature of the growth zone 8 is set as high temperature rather than the temperature of the source zone 4, so that the zinc chloride gas may not deposit in a halfway of the path to the growth zone 8. More specifically, the temperature of the growth zone 8 is set as about 500 degrees C. to about 1100 degrees C.

In the fabrication method of the MgZnO semiconductor according to the homo epitaxial crystal growth apparatus 20, the gaseous chlorine is carried to the source zone 14 with carrier gas, and the magnesium chloride gas is generated in the source zone 14. Then, the MgZnO semiconductor can be grown up on the growth substrate 16 by the nitrogen gas supplied from the carrier gas supplying unit 13 carrying magnesium chloride gas to the growth zone 8, and reacting the zinc chloride gas, the magnesium chloride gas and the water in the growth zone 8.

In the homo epitaxial growth method of the ZnO based semiconductor (ZnO, MgZnO), it can perform impurity doping of a desired n type impurity or p type impurity toward the growth layer by using the n type doping gas supplying unit 22 and the p type doping gas supplying unit 24.

In addition, the present inventor has verified in thermodynamic analyzing that it is possible to proceed the reaction of the reaction formula (8) to the right-hand side also at high temperature (for example, not less than about 1000 degrees C.).

As mentioned above, in the homo epitaxial crystal growth apparatus 20 according to the second embodiment, since the single metal substance of the zinc with high purity instead of zinc chloride is adopted as the group II metallic material 15, the ZnO based semiconductor of high quality can be fabricated easily.

Moreover, it can suppress depositing by the time the zinc chloride gas generated in the source zone 4 is carried to the growth zone 8 by setting the temperature of the source zone 4 lower than the growth temperature of the growth zone 8.

Moreover, since not the gaseous chlorine but the hydrochloric acid gas is generated in the growth zone 8 by adopting not the single oxygen substance but the water as an oxygen material, the reaction formula (8) can be proceeded to the right-hand side in the state where it is more stabilized thermodynamically.

For example, the single metal substance of cadmium may be adopted instead of the single metal substance of magnesium, as the group II metallic material.

Moreover, oxygen gas may be adopted instead of the water as the oxygen material.

Moreover, bromine gas may be adopted instead of the gaseous chlorine as the halogen gas.

Moreover, the kind of group II metallic material may not be limited to two kinds, and it may use more than three kinds of group II metallic materials.

(Semiconductor Device)

Figure 53:
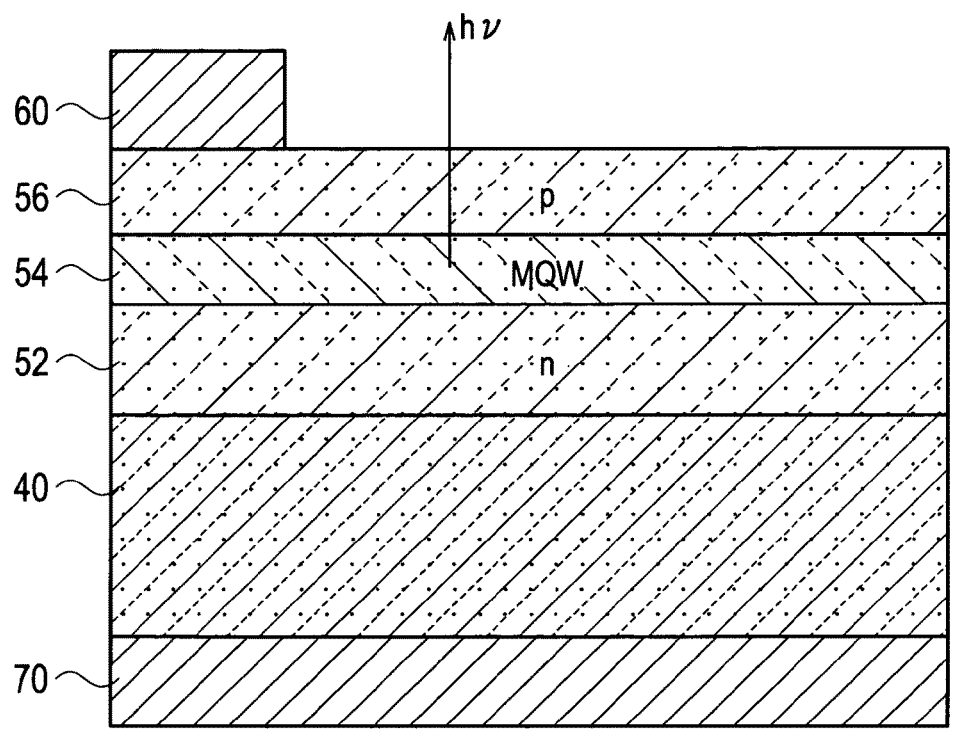
FIG. 53 is a schematic cross-sectional configuration diagram of a semiconductor device having the homo epitaxial crystal structure formed by the homo epitaxial growth method according to the second embodiment of the present invention.

As shown in FIG. 53, an example of a schematic cross-section structure of a semiconductor device having the homo epitaxial crystal structure formed by the homo epitaxial growth method according to the second embodiment includes: a ZnO substrate 40; a n type ZnO based semiconductor layer 52 disposed on the ZnO substrate 40 and impurity-doped with the n type impurity; a ZnO based semiconductor active layer 54 disposed on the n type ZnO based semiconductor layer 52; and a p type ZnO based semiconductor layer 56 disposed on the ZnO based semiconductor active layer 54 and impurity-doped with the p type impurity.

Each of the n type ZnO based semiconductor layer 52, the ZnO based semiconductor active layer 54, and the p type ZnO based semiconductor layer 56 are formed by the above-mentioned homo epitaxial crystal growth apparatus 20, and the homo epitaxial growth method used for the above-mentioned halogenation group II metal and oxygen material.

A p side electrode 60 is disposed on the p type ZnO based semiconductor layer 56, and a n side electrode 70 is disposed at the back side of the conductive ZnO substrate 40. As a material of the p side electrode 60, the layered structure of a Ni layer and a Au layer is adoptable, for example. Moreover, as a material of the n side electrode 70, the layered structure of a Ti layer and a Au layer is adoptable, for example.

As a n type impurity, any one of B, Ga, Al, In, or $T^1$ is applicable, for example.

Moreover, as a p type impurity, any one of N, P, As, Sb, Bi, Li, or Cu is applicable, for example.

The ZnO based semiconductor active layer 54 includes a MQW structure by which a barrier layer composed of $Mg_xZn_{1-x}O$ (where $0<x<1$), and a well layer composed of ZnO are deposited, for example.

Alternatively, the ZnO based semiconductor active layer 54 may include a MQW structure by which a well layer composed of $Cd_yZn_{1-y}O$ (where $0<y<1$), and a barrier layer composed of ZnO are deposited.

The number of pairs of the quantum well is decided from the transit distance of electrons and holes. That is, it determines by the number of pairs of MQW corresponding to the predetermined thickness of the ZnO based semiconductor active layer 54 from which the recombination radiation efficiency of electrons and holes becomes the most satisfactory.

Here, since the bandgap energy of MgO is 7.8 eV in contrast to the bandgap energy of ZnO is 3.37 eV, the MQW structure by which the barrier layer composed of $Mg_xZn_{1-x}O$, and the well layer composed of ZnO are deposited can be formed, by adjusting the composition ratio x of $Mg_xZn_{1-x}O$.

On the other hand, since the bandgap energy of CdO is 0.8 eV in contrast to the bandgap energy of ZnO is 3.37 eV, the MQW structure by which the well layer composed of $Cd_yZn_{1-y}O$, and the barrier layer composed of ZnO are deposited can also be formed, by adjusting the composition ratio y of $Cd_yZn_{1-y}O$.

In addition, the light-emitting (hv) from the above-mentioned semiconductor device can be extracted from the direction of a top surface, as shown in FIG. 53. As a final device structure, it is effective also as a configuration by which the light-emitting (hv) is mainly extracted from the back side of the ZnO substrate 40, for example by making it as a flip-chip mounting structure.

According to the homo epitaxial growth method according to the present invention, the ZnO based semiconductor crystal can be formed on the ZnO substrate at the temperature higher than 1000 degrees C.

According to the present invention, the homo epitaxial crystal structure and the semiconductor device which are formed by using the above-mentioned homo epitaxial growth method can be provided.

According to the homo epitaxial crystal growth apparatus according to the present invention, the ZnO based semiconductor crystal can be grown up on the ZnO substrate at the temperature higher than 1000 degrees C.

Third Embodiment

Fabrication Method of ZnO Based Semiconductor

A fabrication method of a ZnO based semiconductor according to a third embodiment of the present invention will explained with reference to FIG. 32 since it is expressed same as FIG. 32.

First of all, as shown in FIG. 32A, a ZnO substrate in which the surface having +c-plane (001) is prepared as a substrate 40, for example. A crystal plane is provided with the plane where the c-axis fine-inclined about 0.5 degree in the m-axial direction <1-10>, for example.

Next, as shown in FIG. 32B, the ZnO substrate 40 is heated to high temperature at about 700 degrees C. to about 1000 degrees C., and a ZnO based semiconductor layer 46 by which the p type impurity (acceptor element) is doped is formed on the ZnO substrate 40 by the HVPE method.

More specifically, on the ZnO substrate 40, the reactant gas mixing the halide gas which zinc contained, and the oxygen containing gas is introduced, and the hydride gas of the group V (nitrogen group) acting as p type impurity material gas is also introduced. Thus, the crystal growth of the p type ZnO based semiconductor layer 46 is performed on the ZnO substrate 40.

For example, ammonia ($NH_3$) is used for the p type impurity material gas when applying the p type impurity as nitrogen. Moreover, halogenide vapor phase epitaxy is performed by using zinc chloride ($ZnCl_2$) and water ($H_2O$) for the reactant gas.

In addition, $AsH_3$ or $PH_3$ etc. acting as the hydride gas, such as As, P, etc. which are group V elements can be used for group V hydride gas.

As the crystal growth conditions, the partial pressure $P_{ZnCl2}$ of $ZnCl_2$ is set to not more than about $1\times10^{-4}$ atm, for example, the VI/II ratio which is a supply ratio (partial pressure ratio) between the gas containing oxygen which is group VI element, and the halide gas containing Zn which is group II element is set to not more than about 100, for example, the crystal growth temperature $T_g$ is set to about 1000 degrees C., for example, and the crystal growth period is set to about 1 to 6 hours, for example. Here, in the case of the partial pressure $P_{ZnCl2}$ of $ZnCl_2=1\times10^{-4}$ atm, for example, it is set to the partial pressure $P_{H2O}$ of $H_2O=10^{-2}$ atm if the supply ratio VI/II is set to 100.

As the value of the VI/II ratio which is the supply ratio between oxygen which is group VI element and Zn which is group II element, it is preferable that it is more than 1 and not more than about 100, for example.

On the other hand, when $NH_3$ is used for the group V hydride gas acting as p type impurity material gas, it is known that the $NH_3$ gas becomes a more effective nitrogen source even if the $NH_3$ gas is not plasmaized as used for the nitride growth with the MBE method or the CVD.

The present inventors found out that enough nitrogen could be doped by making the p type impurity material gas into a hydride gas of group V material and reacting to halide gas including Zn, even if the growth temperature is set to high.

Furthermore, it has verified that the crystallinity improved when the ZnO of the p type impurity doping is grown up by the above-mentioned HVPE method, even if it is a growth temperature region to which the crystallinity reduces by undoped ZnO etc. conventionally.

Figure 54:
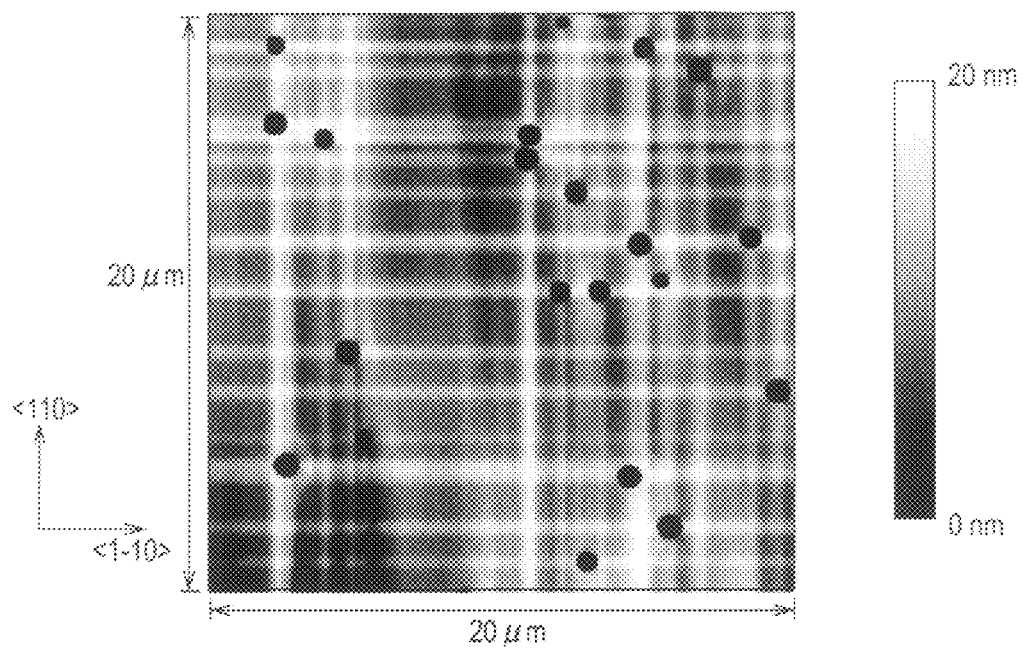
FIG. 54 is a drawing showing an AFM image of 20 μm square of an undoped ZnO based semiconductor layer surface formed by the HVPE method.

An AFM image of the surface in the case of performing the crystal growth of the undoped ZnO layer by the HVPE method on the ZnO substrate in the range whose growth temperature is 800 degrees C. to 900 degrees C. is shown in FIG. 54. As shown in FIG. 54, hexagonal pyramid-shaped pits occur.

Figure 55:
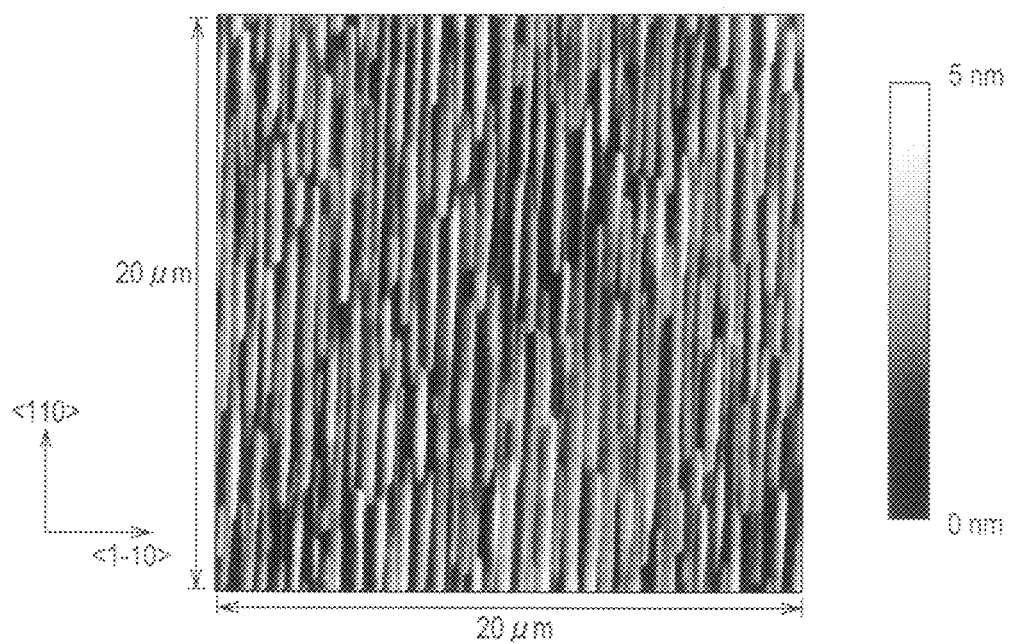
FIG. 55 is a drawing showing an AFM image of 20 μm square of a nitrogen doped ZnO based semiconductor layer surface formed by a fabrication method for a ZnO based semiconductor according to a third embodiment of the present invention.

On the other hand, a typical surface AFM image of a nitrogen doped ZnO layer sample is shown in FIG. 55 as the ZnO based semiconductor formed by using the fabrication method of the ZnO based semiconductor according to the third embodiment. More specifically, on the ZnO substrate 40, $ZnCl_2$ is introduced as halide gas, $H_2O$ is introduced as oxygen containing gas, $NH_3$ is introduced as hydride gas of the group V acting as the p type impurity material gas, and then the nitrogen doped ZnO based semiconductor is formed. That is, the crystal growth of the p type ZnO based semiconductor layer 46 is performed on the ZnO substrate 40. The growth temperature of halogenide vapor phase epitaxy is set to 800 degrees C., the partial pressure $P_{ZnCl2}$ of $ZnCl_2$ is set to $2.2\times10^{-5}$ atm, the partial pressure $P_{H2O}$ of $H_2O$ is set to $4.4\times10^{-4}$ atm, and the partial pressure $P_{NH3}$ of $NH_3$ is set to $4.4\times10^{-4}$ atm.

As proved in FIG. 55, step bunching occurred by introducing $NH_3$ and then the pits have disappeared. That is, even if it is the growth temperature which the pit occurs on the undoped ZnO layer grown up on the ZnO substrate, it proves that the crystallinity improves if the nitrogen doped ZnO layer is applied, and it becomes usable.

Next, the $NH_3$ gas is effective as the nitrogen source of the plasma less in the vapor phase epitaxy, and in order to increase the nitrogen doped quantity, it is considered that what is necessary is just to usually increase the flow rate of $NH_3$ gas, i.e., to increase the partial pressure $PNH_3$ of $NH_3$. However, the following inconvenience occurs in other side. Since $NH_3$ gas includes hydrogen, the hydrogen occurred by decomposition of a part of $NH_3$ such as the following reaction formula (9) reduces the growth driving force of ZnO. This is because the hydrogen reduces ZnO.

$$NH_3 \rightarrow (N_2/2) + (3H_2/2) \qquad (9)$$

Figure 56A:
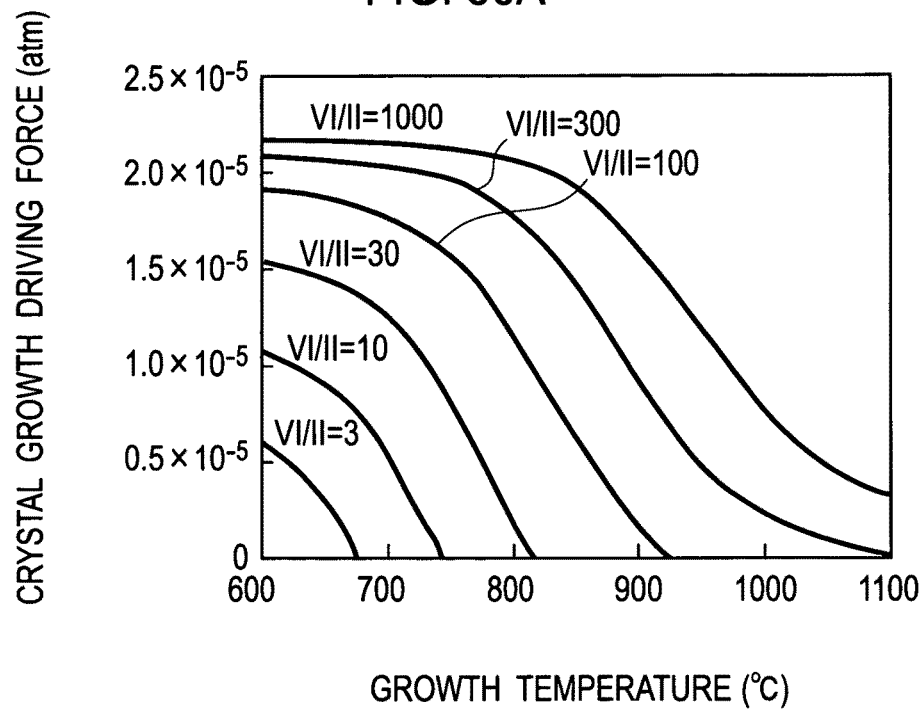
FIG. 56A is a drawing showing the relation of crystal growth driving force and growth temperature by the thermodynamic analysis in the case of changing the VI/II ratio.

FIG. 56A shows the relation between the crystal growth driving force and the growth temperature in the case of changing the VI/II ratio which is a partial pressure ratio (supply ratio) between the $H_2O$ containing oxygen of the group VI, and the halide gas $ZnCl_2$ of Zn of group II based on a thermodynamic analysis result. A vertical axis shows the crystal growth driving force (atm), and a horizontal axis shows the growth temperature (degrees C.).

The partial pressure $P_{ZnCl2}$ of $ZnCl_2$ is set to $2.2\times10^{-5}$ atm. Moreover, the V/II ratio which is the partial pressure ratio between the $NH_3$ which is hydride gas of group V and the halide gas $ZnCl_2$ of Zn of group II is set to 20. The decomposition rate of $NH_3$ on the substrate is set to 3%. As proved in FIG. 56A, the more the value of the VI/II ratio becomes small (i.e., the more the amount of supply of $H_2O$ decreases), the more growth driving force is reduced. Moreover, it proves that the more the growth temperature becomes high, the more the growth driving force decreases.

Figure 56B:
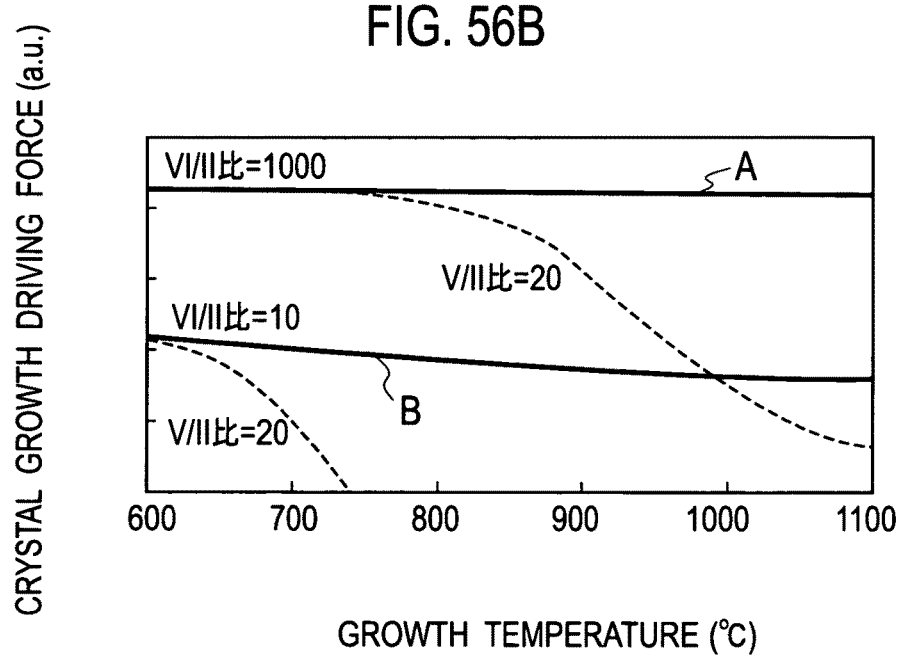
FIG. 56B is a drawing showing the comparison with the case where there is no supply of ammonia gas, in the relation of the crystal growth driving force and the growth temperature by the thermodynamic analysis in the case of changing the VI/II ratio.

On the other hand, FIG. 56B is a drawing for extracting two greatly different curves whose VI/II ratios are 1000 and 10 among FIG. 56A, and is enlarged and displayed with the dashed lines. Although each the V/II ratio of two above-mentioned curves extracted from FIG. 56A are 20, full lines shows the curve as the curve A and the curve B in the case of setting the flow rate of NH₃ to 0 and setting the V/II ratio to 0. As proved in the curve A and the curve B, when there is no NH₃ flow, the crystal growth driving force is not reduced even if raising the growth temperature. However, when there is NH₃ flow, the reduction in driving force is immediately seen for the side where the VI/II ratio is lower even if the growth temperature is remarkably low. As proved in FIG. 56B, the region where driving force is reduced appears with any values in the VI/II ratio if the growth temperature rises by introducing NH₃.

As mentioned above, if the decomposition rate of NH₃ is assumed, it is possible to determine the possibility of the growth in a certain growth temperature and material partial pressure based on the thermodynamic analysis, and it is possible to predict beforehand the conditions into which the nitrogen doped ZnO layer 46 is grown up according to FIG. 56A and FIG. 56B.

On the other hand, as shown hereinafter, it proved that the growth driving force is reduced and the etching occurs conversely if the growth temperature is set to high under the fixed partial pressure of NH₃ also from a result of the experiment.

Figures 57, 58:
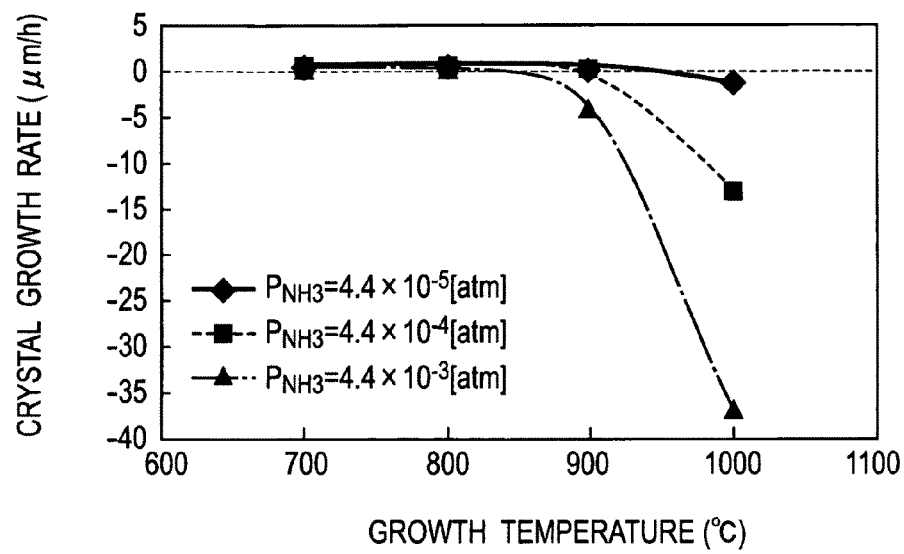
FIG. 57 is a drawing showing the relation between the growth rate and the growth temperature of a nitrogen doped ZnO layer for every ammonia gas partial pressure.
FIG. 58 is a drawing which classifies whether the nitrogen doped ZnO layer is growing or etching, based on the data of FIG. 57.

FIG. 57 shows how the crystal growth driving force actually changes according to the partial pressure $P_{NH3}$ of NH₃ gas which is hydride gas of group V. The partial pressure $P_{ZnCl2}$ of halide gas ZnCl₂ of Zn of group II is set to $2.2 \times 10^{-5}$ atm, and the partial pressure $P_{H2O}$ of H₂O containing oxygen of group VI is set to $4.4 \times 10^{-4}$ atm, in the halogenide vapor phase epitaxy. Moreover, Partial pressure $P_{NH3}$ of NH₃ is changed to $4.4 \times 10^{-3}$ atm, $4.4 \times 10^{-4}$ atm, and $4.4 \times 10^{-5}$ atm. The growth temperature is changed to 700 degrees C., 800 degrees C., 900 degrees C., and 1000 degrees C. In FIG. 57, the vertical axis shows the growth rate of the ZnO crystal (μm/h), and the horizontal axis shows the growth temperature (degrees C.).

The range in which growth rate is larger than 0 (positive range) shows plus growth, and the range whose growth rate is smaller than 0 (negative range) shows minus growth, i.e., it is etched. It proves that the more partial pressure $P_{NH3}$ of NH₃ becomes large, the more the etching has started immediately from a part with low growth temperature.

A drawing in which the data of FIG. 57 is summarized intelligibly is FIG. 58. FIG. 58 is a drawing showing whether the plus growth is performed or it is etched (minus growth), about each point of measurement of the growth temperature is 700 degrees C., 800 degrees C., 900 degrees C., and 1000 degrees C., regarding to the curve of three kinds of partial pressure of NH3 of FIG. 57. It is made intelligible by describing "○" to the plus growth and describing "×" to the minus growth (etching).

As shown in FIG. 57 and FIG. 58, the growth temperature by which the etching is started is reduced in accordance that the partial pressure of NH3 becomes large.

Figure 59:
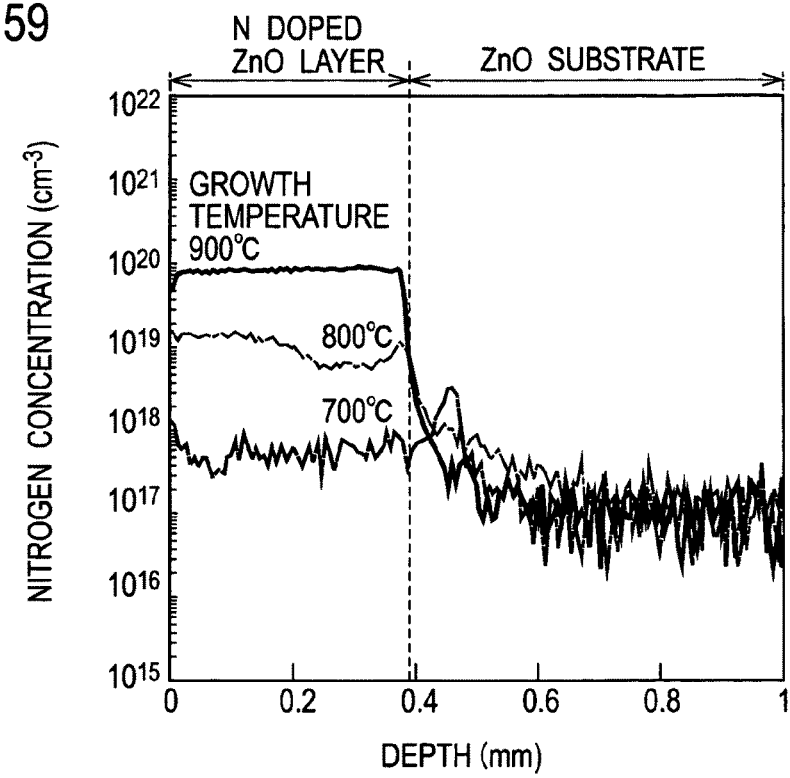
FIG. 59 is a drawing showing that the nitrogen concentration of the nitrogen doped ZnO changes in accordance with growth temperature.

FIG. 59 shows the analysis result of the depth direction of the nitrogen (N) concentration by the SIMS measurement of the nitrogen doped ZnO layer 46 which sets the partial pressure $P_{ZnCl2}$ of ZnCl₂ to $2.2 \times 10^{-5}$ atm, sets the partial pressure $P_{H2O}$ of H₂O to $4.4 \times 10^{-4}$ atm, and sets the partial pressure $P_{NH3}$ of NH₃ gas to $4.4 \times 10^{-5}$ atm, changes the growth temperature in the range of 700 degrees C. to 900 degrees C., and performs the crystal growth on the ZnO substrate 40, by the HVPE method. The horizontal axis shows the depth (μm) from the surface of the nitrogen doped ZnO layer 46, and the vertical axis shows N (nitrogen) concentration (cm⁻³).

As proved in FIG. 59, when the partial pressure $P_{NH3}$ of NH₃ is set to $4.4 \times 10^{-5}$ atm, the plus growth is performed in the growth temperature of 700 degrees C. to 900 degrees C. In the state where the plus growth is performed, the N concentration becomes the highest in the nitrogen doped ZnO layer 46 at highest 900 degrees C. of the growth temperature, and the N concentration also decreases sequentially in accordance that the growth temperature decrease to 800 degrees C. and to 700 degrees C.

Thus, when the nitrogen doped ZnO based semiconductor is fabricated by the fabrication method of the ZnO based semiconductor according to the third embodiment, it proves that there is positive temperature correlation that the nitrogen concentration increases in accordance with the growth temperature rise.

In the fabrication method of the ZnO based semiconductor according to the third embodiment, since the nitrogen doping concentration becomes high and the activation of nitrogen becomes easy to be performed in the case of high temperature growth in the condition that the partial pressure $P_{NH3}$ of NH₃ is fixed, it is extremely preferable for applying the p type.

Moreover, as seen in FIG. 55, although there is an effect of the crystalline improvement by the nitrogen dope, the crystalline improvement is further expectable by performing the high temperature growth.

Moreover, since the reduction effect for the ZnO in the side where the partial pressure $PNH_3$ of NH₃ is higher becomes strong, the reduction effect for the ZnO appears in the more low temperature side if the partial pressure $P_{NH3}$ of NH₃ becomes high. However, since it can grow up by the more high temperature side and the reduction effect for the ZnO can be reduced in addition to improvement in the nitrogen doping concentration, crystalline improvement, improvement in the nitrogen activation, etc. if the partial pressure $P_{NH3}$ of NH₃ is decreased, it is extremely preferable.

Figure 60:
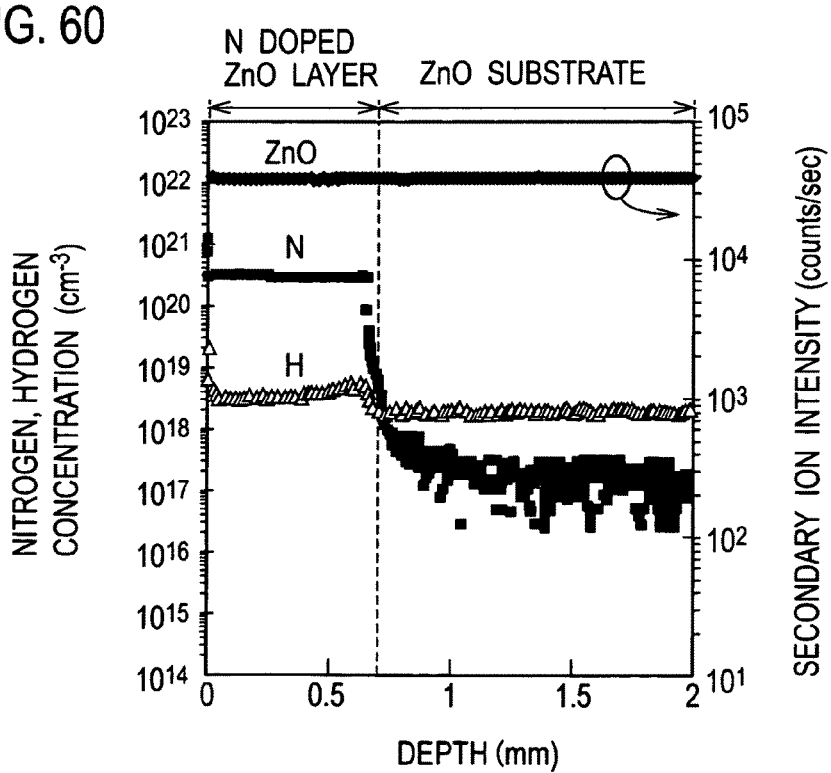
FIG. 60 is a drawing showing a secondary ion mass analytical measurement result in the representative case of the nitrogen doped ZnO layer fabricated by the fabrication method of the ZnO based semiconductor of the present invention.

Next, FIG. 60 shows the concentration of the depth direction of N (nitrogen) and H (hydrogen) by the SIMS measurement of the nitrogen doped ZnO layer 46 grown up on the ZnO substrate 40. The nitrogen doped ZnO layer 46 was formed by setting the growth temperature to 800 degrees C., setting the partial pressure $P_{ZnCl2}$ of ZnCl₂ to $2.2 \times 10^{-5}$ atm, setting the partial pressure $P_{H2O}$ of H₂O to $4.4 \times 10^{-4}$ atm, and setting the partial pressure $P_{NH3}$ of NH₃ gas to $4.4 \times 10^{-4}$ atm, by the HVPE method. The horizontal axis shows the depth (μm) from the surface of the nitrogen doped ZnO layer 46, and the vertical axis shows the concentration (cm⁻³) of N (nitrogen) or H (hydrogen). Although N of the background level is contained in the ZnO substrate 40, it proves that N of the concentration exceeding $1 \times 10^{20}$ cm⁻³ is contained in the nitrogen doped ZnO layer 46 grown up under the partial pressure $P_{NH3}$ of NH₃ gas.

Referring to FIG. 58, the limiting temperature at the side of the high temperature of plus growth of partial pressure $P_{NH3}$ of NH₃ gas of $4.4 \times 10^{-4}$ atm is 800 degrees C. Thus, high nitrogen concentration can be obtained in the nitrogen doped ZnO based semiconductor by applying the limiting temperature at the side of the high temperature of the plus growth under the predetermined partial pressure $P_{NH3}$ of NH₃ gas.

Consideration of FIG. 57 to FIG. 60 will draw the following tendencies. The nitrogen doped ZnO based semiconductor formed by the fabrication method of the ZnO based semiconductor according to the third embodiment is fabricated in the temperature range TW where the plus crystal growth is performed.

There is a relation with reverse between the V/II ratio and the limiting temperature Th at the side of the high temperature of the temperature range TW where the plus crystal growth is performed. That is, the limiting temperature Th becomes lower in accordance that the V/II ratio becomes larger.

On the other hand, the limiting temperature Th becomes high in accordance that the V/II ratio becomes small. Moreover, the nitrogen doping concentration becomes larger in accordance that the growth temperature becomes high in the temperature span TW where the plus crystal growth is performed, under the fixed V/II ratio.

Moreover, what is necessary is just to perform as follows to control to differ the nitrogen concentration in each film as layered structure composed of multilayer films in the ZnO based semiconductor with which the p type impurity is doped. In the condition that the V/II ratio is fixed, the growth temperature of a first nitrogen doped ZnO based thin film in the temperature range TW of plus growth is set to T1.

Next, the growth temperature of a second nitrogen doped ZnO film fabricated in the temperature range TW of plus growth is set to T2 (T1≠T2).

Thus, if the growth temperature is changed one after another, the multilayer film in which the nitrogen concentration differs can be formed.

The multilayer film in which the p type impurity concentration (nitrogen) has an inclination can be composed by whether each growth temperature from the growth temperature T1 of the first nitrogen doped ZnO based thin film to the growth temperature TN of the $N^{th}$ nitrogen doped ZnO based thin film is raised sequentially, or each growth temperature is reduced sequentially.

(Fabricating Apparatus)

Figure 61:
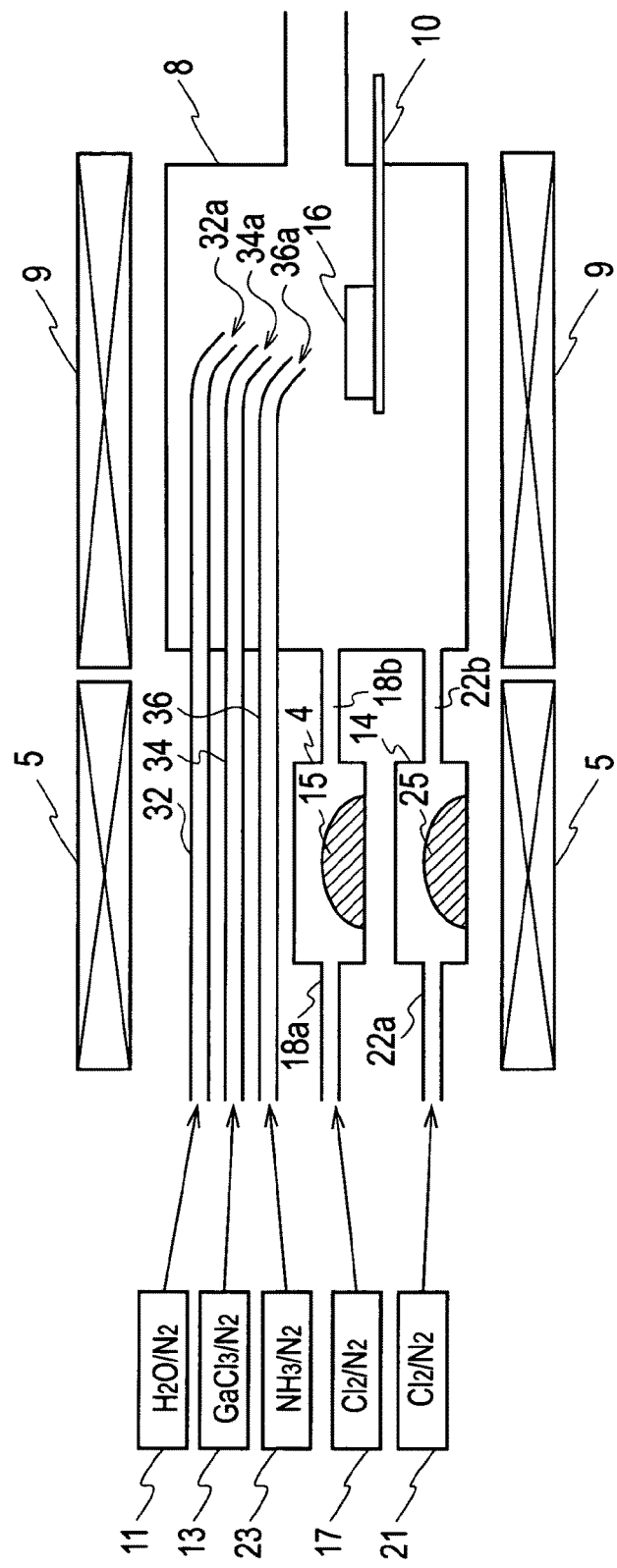
FIG. 61 is a drawing showing a schematic configuration example of a fabricating apparatus applying the fabrication method of the ZnO based semiconductor according to the third embodiment of the present invention.

FIG. 61 shows a schematic configuration of a fabricating apparatus used for the fabrication method of the ZnO based semiconductor according to the third embodiment of the present invention. Although the configuration of FIG. 61 is substantially equivalent as the epitaxial crystal growth apparatus according to the first embodiment of the present invention, detailed structure is disclosed in FIG. 61. As shown in FIG. 61, in order to form the ZnO semiconductor of the p type impurity doping, the fabricating apparatus includes a gaseous chlorine supplying unit 17, a steam gas supplying unit 11, an ammonia gas supplying unit 23, a source zone 4, gas supply lines 32, 34, 36, 18a, and 18b, an heating unit 5, a growth zone 8, an heating unit 9, and a substrate holding unit 10, etc. $N_2$ (nitrogen gas) as carrier gas is mixed in the steam gas supplying unit 11, the gaseous chlorine supplying unit 17, and the ammonia gas supplying unit 23, as shown in FIG. 61. A group II metallic material 15 composed of single metal substance of the zinc of group II is held in the source zone 4.

It is also possible to add other source zones to the configuration, to the fabricating apparatus of the ZnO based semiconductor. For example, when performing the crystal growth of MgZnO semiconductor, as shown in FIG. 61, it adds the configuration of a gaseous chlorine supplying unit 21, a source zone 14, and gas supply lines 22a and 22b, etc. A group II metallic material 25 including the single metal substance of magnesium is held in the source zone 14.

Moreover, as shown in FIG. 61, it is also possible to add a n type impurity material gas supply unit 13 in order to fabricate the n type ZnO based semiconductor layer. The halogenide of Ga or Al can be used for the n type impurity material gas supply unit 13, for example, as shown in FIG. 61, it can be applied to $GaCl_3$. The $N_2$ gas is mixed as carrier gas also in the n type impurity material gas supply unit 13.

The source zone 4 is a zone for generating zinc chloride gas by reacting the zinc disposed inside and the gaseous chlorine supplied through the gas supply line 18a from the gaseous chlorine supplying unit 17, and for supplying the zinc chloride gas to the growth zone 8 through the gas supply line 18b.

The growth zone 8 is a zone for growing up the ZnO based semiconductor on a growth substrate 16 held on the substrate holding unit 10 by reacting the zinc chloride gas supplied from the source zone 4 connected to the gas supply line 18b and the water (vapor) supplied through the gas supply line 32 from the steam gas supplying unit 11 as an oxygen material. In addition, being held on the substrate holding unit 10 also has the case of a semiconductor instead of the growth substrate. For example, the layered structure by which the n type ZnO based semiconductor layer is formed on the substrate may be held.

In addition, all the gas supply lines 32, 34, 36, 18a, 18b, 22a, and 22b connecting each the gas supplying unit, the growth zone 8, and the source zones 4 and 14 mutually are composed by quartz glass. Thus, since the nonmetallic quartz glass is used for the gas supply lines and the halogenide including Zn in the metallic material of the ZnO based semiconductor is used, the metal for functioning as a catalyst of the $NH_3$ decomposition which is a hydride of group V does not exist around the growth substrate 16 or the semiconductor on the substrate holding unit 10.

The heating unit 5 is for heating the source zones 4 and 14, the gas supply lines 32, 34, 36, 18a, 18b, 22a, and 22b, etc. The heating unit 9 is for heating the growth zone 8. The fabricating apparatus of the ZnO based semiconductor achieves the hot wall method by the heating units 5 and 9. In addition, the heating unit 5 may be individually disposed toward the source zones 4 and 14 and each gas supply path.

Next, the fabrication method of the ZnO based semiconductor by the fabricating apparatus of the ZnO based semiconductor mentioned above will be explained in detail.

First of all, gaseous chlorine and nitrogen gas are supplied to the source zone 4 through the gas supply line 18a from the gaseous chlorine supplying unit 17. Then, in the source zone 4, the reaction by the following reaction formulas occurs by the group II metallic material 15 composed of single metal substance of the zinc currently held, and the supplied gaseous chlorine, and zinc chloride gas is generated.

$$Zn(s,l)+Cl_2(g)<=>ZnCl_2(g) \qquad (10)$$

In this case, as for the single metal substance of the zinc held at the source zone 15, it is preferred that it is a single metal substance with high purity, for example, not less than 99.99999% of its single metal substance is effective. In addition, (s), (l), and (g) in the reaction formula show a solid, a liquid, and gas, respectively.

The source zone 4 becomes the structure enlarging the surface area of the group II metallic material 15 composed of zinc single metal substance, and a suitable temperature, so that most reactions in the reaction formula (10) may be proceeded to the right-hand side and the flow rate of zinc chloride gas can be controlled by the amount of supply of gaseous chlorine.

In addition, as such the suitable temperature, about 300 degrees C. to about 450 degrees C. are preferable. Moreover, the temperature of the source zone 4 is set as not more than about 500 degrees C., in order to suppress that the zinc gas with extremely high vapor pressure also in metal is carried to the growth zone 8. Then, the zinc chloride gas generated by the above-mentioned reaction formula (10) is carried to the growth zone 8 through the supplying pipe 18b.

On the other hand, the water (vapor) supplied from the steam gas supplying unit 11 is carried to the growth zone 8 as the oxygen material through the gas supply line 32. Moreover, the ammonia gas supplied through the gas supply line 36 from the ammonia gas supplying unit 23 is carried to the growth zone 8 as the nitrogen material acting as a p type impurity.

Then, in the growth zone 8, when the reaction by the following reaction formula proceeds to the right-hand side with the carried zinc chloride gas and water, the thin film of the ZnO semiconductor grows on the substrate 40.

$$ZnCl_2(g)+H_2O(g)\Leftrightarrow ZnO(s)+2HCl(g) \quad (11)$$

At this time, when it reacts to $NH_3$ simultaneously carried on the growth substrate 16 or the semiconductor currently held on the substrate holding unit 10, and a part of oxygen atoms of ZnO replace nitrogen, the nitrogen doped ZnO semiconductor layer is formed.

In this case, as shown in FIG. 61, the gas supply lines 32, 34, and 36 are formed to the inner side of the growth zone 8, and each gas supplying outlet port 32a, 34a, and 36a is composed as disposed just above the growth substrate 16 or the semiconductor.

By the way, as for the ammonia gas which is a kind of the hydride gas of group V, although decomposition to nitrogen and hydrogen may occur from thermodynamic analysis at least about 400 degrees C., if the decomposition occurs and then the ammonia gas is became to $N_2$ and $H_2$, it will not function as a nitrogen source in the case of the p type impurity doping.

However, even if it is not plasmaized as the $NH_3$ gas is used for the nitride growth by the MBE method, becoming a more effective source of N is known. This is because almost all gas can supply also at the high temperature of 1000 degrees C. in the environment where a catalyst such as metal does not exist, without resolving to the substrate face. In addition, the $H_2$ gas generated from the $NH_3$ gas degrades the ZnO by the following formula.

$$ZnO(s)+H_2(g)\Leftrightarrow Zn(g)+H_2O(g) \quad (12)$$

If the $H_2$ partial pressure of the growth zone becomes high or the growth temperature becomes high, the reaction by the formula (12) proceeds to the right-hand side, and the growth of ZnO is prevented.

In the fabricating apparatus shown in FIG. 61, the nonmetallic quartz glass is used for the material of the gas supply line 36 for carrying the ammonia gas at least, the gas supply line 36 crosses the inside of the growth zone 8, and the gas supplying outlet port 36a is provided just above the growth substrate 16. Accordingly, since the ammonia gas does not degrade because of being not contacted to the metal until the ammonia gas reaches on the growth substrate 16, and the ammonia gas can be contributed to the reaction just above the growth substrate 16, the sufficient nitrogen doping concentration can be obtained.

On the other hand, since the gas supplying outlet port 32a of the gas supply line 32 for carrying the oxygen containing gas is provided just above the growth substrate 16, and the halogenide including Zn in the metallic material for crystal growth is used and the halogenide and oxygen containing gas react just above the growth substrate 16. Accordingly, the Zn material can be supplied on the substrate very efficiently.

In this case, the temperature of the growth zone 8 is set as high temperature rather than the temperature of the source zones 4 and 14, so that the zinc chloride gas may not deposit in a halfway of the path to the growth zone 8. More specifically, the temperature of the growth zone 8 is set as about 700 degrees C. to about 1000 degrees C.

Moreover, it can suppress depositing of the zinc chloride gas and magnesium chloride gas generated in the source zones 4 and 14 is carried to the growth zone 8 by setting the temperature of the source zones 4 and 14 lower than the growth temperature of the growth zone 8.

Moreover, since not gaseous chlorine but hydrochloric acid gas is generated on the growth substrate 16 of the growth zone 8 by adopting not the oxygen simple substance but the water as the oxygen material, the ZnO thin film can be formed in the state where it is stabilized more thermodynamically.

As the hydride gas of group V, either of $AsH_3$ or $PH_3$ can be used instead of $NH_3$, for example. Moreover, bromine gas may be adopted instead of the gaseous chlorine as the halogen gas. Moreover, the kind of group II metallic material may not be limited to two kinds, and it may use more than three kinds of group II metallic materials.

In the process of crystal growth of the ZnO based semiconductor layer, the reactant gas may further include magnesium containing gas. Moreover, the partial pressure of magnesium containing gas is not more than about $1\times 10^{-4}$ atm, for example.

The halogenide of zinc and/or magnesium is not resolved into the zinc and/or magnesium and the gaseous chlorine at the temperature of about 1000 degrees C., but the direct reaction occurs with the halogenide of zinc and/or magnesium and the oxygen material on the ZnO substrate.

The raw material efficiency of the high temperature region of the halogenide of zinc and/or magnesium and the oxygen material is also higher than the MOCVD method, without particle occurring on the ZnO substrate, since the premature reaction does not occur like the main organic metals and oxygen material.

The mol supply ratio (VI/II ratio) of the oxygen materials and the halogenide of zinc and/or magnesium is an important growth parameter.

As it explained in the second embodiment, by setting the VI/II ratio to not more than 100, the migration on the substrate surface of halide materials is accelerated, and it is effective in reducing the occurrence of the abnormality part (a pit and a projection) of crystal growth, etc. Moreover, since the speed of crystal growth becomes slow when the VI/II ratio is small, the VI/II ratio is effective to apply more than 1, for example.

For example, in the case where the partial pressure $P_{ZnCl2}$ of $ZnCl_2$ is $2.2\times 10^{-5}$ atm, and VI/II is 20, the growth rate of about 0.5 μm/h is obtained. The value of the about 0.5 μm/h is a growth rate permissible as the thin-film formation speed of the compound semiconductor, and can fully be used as the formation method of the ZnO based semiconductor layer.

Next, an example of schematic cross-section structure of the semiconductor element formed by using the fabrication method and the fabricating apparatus of the above-mentioned ZnO based semiconductor is similarly expressed as FIG. 53, and includes: a ZnO substrate 40; a n type ZnO based semiconductor layer 52 disposed on the ZnO substrate 40 and doped with the n type impurity; a ZnO based semiconductor active layer 54 disposed on the n type ZnO based semiconductor layer 52; and a p type ZnO based semiconductor layer 56 disposed on the ZnO based semiconductor active layer 54, and doped with the p type impurity.

Each of the n type ZnO based semiconductor layer 52, the ZnO based semiconductor active layer 54, and the p type ZnO based semiconductor layer 56 are formed by the fabrication method using the above-mentioned fabricating apparatus, and using the above-mentioned halogenation group II metal and oxygen materials of the ZnO based semiconductor.

A p side electrode 60 is disposed on the p type ZnO based semiconductor layer 56, and a n side electrode 70 is disposed at the back side of the conductive ZnO substrate 40. As a material of the p side electrode 60, the layered structure of a Ni layer and a Au layer is adoptable, for example. Moreover, as a material of the n side electrode 70, the layered structure of a Ti layer and a Au layer is adoptable, for example.

As a n type impurity, any one of B, Ga, Al, In or Tl is applicable, for example.

Moreover, as a p type impurity, the group V element can be used, for example, N, P, or As etc. can be applied.

The ZnO based semiconductor active layer 54 includes a MQW structure by which the barrier layer composed of $Mg_xZn_{1-x}O$ (where 0<x<1), and the well layer composed of ZnO(s) are deposited, for example.

Moreover, the ZnO based semiconductor active layer 54 may include a MQW structure by which a well layer composed of $Cd_yZn_{1-y}O$ (where 0<y<1), and a barrier layer composed of ZnO are deposited.

The number of pairs of the quantum well is decided from the transit distance of electrons and holes. That is, it determines by the number of pairs of MQW corresponding to the predetermined thickness of the ZnO based semiconductor active layer 54 from which the recombination radiation efficiency of electrons and holes becomes the most satisfactory.

Here, since the bandgap energy of MgO is 7.8 eV in contrast to the bandgap energy of ZnO is 3.37 eV, the MQW structure by which the barrier layer composed of $Mg_xZn_{1-x}O$, and the well layer composed of ZnO are deposited can be formed, by adjusting the composition ratio x of $Mg_xZn_{1-x}O$.

On the other hand, since the bandgap energy of CdO is 0.8 eV in contrast to the bandgap energy of ZnO is 3.37 eV, the MQW structure by which the well layer composed of $Cd_yZn_{1-y}O$, and the barrier layer composed of ZnO are deposited can also be formed, by adjusting the composition ratio y of $Cd_yZn_{1-y}O$.

In addition, the light-emitting (hν) from the above-mentioned semiconductor device can be extracted from the direction of a top surface, as shown in FIG. 53.

Figure 62:
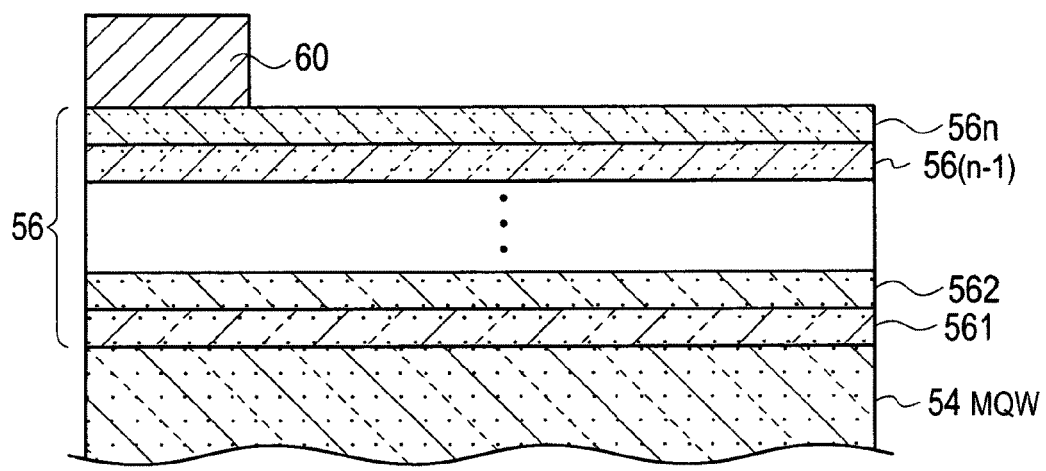
FIG. 62 is a drawing showing a configuration example applying a p type ZnO based semiconductor layer as a multilayer film in a ZnO based semiconductor element fabricated by the fabrication method of the ZnO based semiconductor according to the third embodiment of the present invention.

The p type ZnO based semiconductor layer 56 of the ZnO based semiconductor element of FIG. 53 can also be applied as a multilayer film, as shown in FIG. 62, without applying a single layer. In FIG. 62, the p type ZnO based semiconductor layer 56 is composed of a p type ZnO based semiconductor layer 561, a p type ZnO based semiconductor layer 562 . . . , a p type ZnO based semiconductor layer 56(*n*–1), and a p type ZnO based semiconductor layer 56*n*. Where, n is 1 or more integers. Although the group V element which is the p type impurity may be doped by fixed concentration, the p type ZnO based semiconductor layer 561 to the p type ZnO based semiconductor layer 56*n* can also be doped by different concentration.

As described in explanation of FIG. 58 to FIG. 61, the multilayer film in which the concentration of the group V element which is the p type impurity differs can be formed by fixing the V/II ratio which is a ratio between the partial pressure of the hydride gas of group V and the partial pressure of the halogenation group II metallic gas including zinc, and changing the growth temperature one after another for every semiconductor layer in the temperature span of the crystal growth of plus of the p type ZnO based semiconductor layer. Moreover, if the growth temperature is raised or reduced sequentially from the p type ZnO based semiconductor layer 561, the p type ZnO based semiconductor layer 56 with the inclination of p type impurity concentration can be composed.

Other Embodiments

The present invention has been described by the first to third embodiments and its modification, as a disclosure including associated description and drawings to be construed as illustrative, not restrictive. With the disclosure, artisan might easily think up alternative embodiments, embodiment examples, or application techniques.

Thus, the present invention includes various embodiments etc. which have not been described in the specification.

INDUSTRIAL APPLICABILITY

The epitaxial growth method, the epitaxial crystal structure and the semiconductor device, the ZnO based semiconductor, and the fabrication method and fabricating apparatus of the ZnO based semiconductor according to the present invention are applicable to wide fields, such as: light-emitting devices, such as LEDs or LDs (Laser Diodes) from a blue light wavelength region to an ultraviolet light wavelength region; a light-detecting element; a piezoelectric element; HEMT (High Electron Mobility Transistor); HBT (Hetero-junction Bipolar Transistor); and a transparent electrode.

REFERENCE SIGNS LIST

2, 12: Gaseous chlorine supplying unit;
3, 13: Carrier gas supplying unit;
4, 14: Source zone;
5, 9: Heating unit;
6: Water supplying unit;
7: Carrier gas supplying unit;
8: Growth zone;
10: Substrate holding unit;
11: Steam gas supplying unit;
13: n type impurity material gas supply unit;
15, 25: Group II metallic material;
16: Growth substrate;
17, 21: Gaseous chlorine supplying unit;
18*a*, 18*b*: Gas supply line;
20: Epitaxial crystal growth apparatus;
22: First doping gas supplying unit;
22*a*, 22*b*: Gas supply line;
23: p type impurity material gas supply unit;
24: Second doping gas supplying unit;
40, 41: Substrate (sapphire, ZnO);
40*a*: Surface of substrate;
40*b*: Back side of substrate;
42, 43: Buffer layer;
44: ZnO facet;
46, 47: ZnO layer (ZnO based semiconductor layer);
52: n type ZnO based semiconductor layer;
54: ZnO based semiconductor active layer;
56: p type ZnO based semiconductor layer;
60: p side electrode; and
70: n side electrode.

The invention claimed is:

1. A hetero epitaxial growth method comprising:
   forming a buffer layer in contact with a heterogeneous substrate, the heretogeneous substrate composed of a substrate selected from the group consisting of an a-plane sapphire substrate, a silicon substrate, a SiC substrate, a GaAs substrate, a GaP substrate, and a GaN-based substrate; and
   performing crystal growth of a zinc oxide based semiconductor layer on the buffer layer using a halogenated group II metal and an oxygen material, wherein
   the step of forming the buffer layer includes the step of performing crystal growth of another zinc oxide based semiconductor layer on the heterogeneous substrate using a group II metal and an oxygen material, and zinc which is an elemental metal without any bonding to another element is used as the group II metal, wherein
   a reactant gas is zinc and water in the step of forming the buffer layer, and a reactant gas is zinc chloride and water in the step of performing the crystal growth of the zinc oxide based semiconductor layer, and wherein in the step of performing the crystal growth of the zinc oxide based semiconductor layer, a crystal growth temperature is not less than 800 degrees C., and a supplying ratio VI/II of a group VI element and a group II element is more than 1 and not more than 100.

2. The hetero epitaxial growth method according to claim 1, wherein in the step of performing the crystal growth of the zinc oxide based semiconductor layer, the crystal growth temperature is approximately 1000 degrees C.

3. The hetero epitaxial growth method according to claim 1, wherein in the step of performing the crystal growth of the zinc oxide based semiconductor layer, the supplying ratio VI/II of a group VI element and a group II element is approximately 20.

* * * * *